(12) United States Patent
Kim et al.

(10) Patent No.: US 10,128,179 B2
(45) Date of Patent: Nov. 13, 2018

(54) FAN-OUT SEMICONDUCTOR PACKAGE AND ELECTRONIC DEVICE INCLUDING THE SAME

(71) Applicant: SAMSUNG ELECTRO-MECHANICS CO., LTD., Suwon-si, Gyeonggi-do (KR)

(72) Inventors: Sun Ho Kim, Suwon-si (KR); Ji Hoon Kim, Suwon-si (KR); Ha Young Ahn, Suwon-si (KR); Shang Hoon Seo, Suwon-si (KR); Seung Yeop Kook, Suwon-si (KR); Sung Won Jeong, Suwon-si (KR)

(73) Assignee: SAMSUNG ELECTRO-MECHANICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 15/336,288

(22) Filed: Oct. 27, 2016

(65) Prior Publication Data
US 2017/0133309 A1 May 11, 2017

(30) Foreign Application Priority Data
Nov. 10, 2015 (KR) .......................... 10-2015-0157563

(51) Int. Cl.
*H01L 23/498* (2006.01)
*H01L 23/31* (2006.01)
*H01L 23/00* (2006.01)

(52) U.S. Cl.
CPC .... *H01L 23/49838* (2013.01); *H01L 23/3128* (2013.01); *H01L 23/49816* (2013.01);
(Continued)

(58) Field of Classification Search
CPC ......... H01L 23/49838; H01L 23/49827; H01L 23/49816; H01L 23/3128; H01L 24/05
See application file for complete search history.

(56) References Cited

U.S. PATENT DOCUMENTS 6,534,872 B1 * 3/2003 Freda ..................... H05K 1/113
257/774
6,680,530 B1 * 1/2004 Pillai ................. H01L 23/49827
257/621
(Continued)

FOREIGN PATENT DOCUMENTS

JP 11-274734 * 10/1999 ............... H05K 3/46
JP 2006-108699 A 4/2006
(Continued)

OTHER PUBLICATIONS

Japanese Office Action issued in corresponding Japanese Patent Application No. 2016-210831, dated Apr. 24, 2018, with English Translation.
(Continued)

Primary Examiner — William Coleman
(74) Attorney, Agent, or Firm — McDermott Will & Emery LLP

(57) ABSTRACT

A fan-out semiconductor package includes: an interconnection member including a first insulating layer, first and second pads respectively disposed on opposite sides of the first insulating layer and a first via connecting the first and second pads to each other; a semiconductor chip disposed on the interconnection member; and an encapsulant encapsulating at least portions of the semiconductor chip. A center line of the first via is out of alignment with at least one of a center line of the first pad and a center line of the second pad.

33 Claims, 46 Drawing Sheets

(52) U.S. Cl.
CPC ........ *H01L 23/49827* (2013.01); *H01L 24/05* (2013.01); *H01L 24/19* (2013.01); *H01L 24/20* (2013.01); *H01L 2224/02331* (2013.01); *H01L 2224/02373* (2013.01); *H01L 2224/02379* (2013.01); *H01L 2224/0401* (2013.01); *H01L 2224/04105* (2013.01); *H01L 2224/12105* (2013.01); *H01L 2924/18162* (2013.01); *H01L 2924/3512* (2013.01)

(56) References Cited

U.S. PATENT DOCUMENTS

| | | | |
|---|---|---|---|
| 6,911,738 B2* | 6/2005 | Leinbach | H01L 23/49838 257/780 |
| 7,365,435 B2* | 4/2008 | Brown | H01L 23/49816 257/774 |
| 7,640,655 B2* | 1/2010 | Sunohara | H01L 23/5385 174/258 |
| 7,838,334 B2* | 11/2010 | Yu | H01L 23/49833 257/E21.499 |
| 7,919,858 B2* | 4/2011 | Danno | H01L 21/6835 257/690 |
| 8,772,943 B2* | 7/2014 | Zhang | H01L 24/05 257/685 |
| 9,040,316 B1* | 5/2015 | Scanlan | H01L 21/76879 438/15 |
| 2006/0284310 A1* | 12/2006 | Hall | H01L 23/49827 257/734 |
| 2008/0211089 A1* | 9/2008 | Khan | H01L 23/16 257/723 |
| 2011/0316147 A1 | 12/2011 | Shih et al. | |
| 2013/0026632 A1 | 1/2013 | Kikuchi et al. | |
| 2013/0098670 A1* | 4/2013 | Inoue | H05K 3/4007 174/264 |
| 2015/0001708 A1 | 1/2015 | Lin | |
| 2015/0130049 A1 | 5/2015 | Chen et al. | |
| 2015/0194405 A1 | 7/2015 | Liang et al. | |

FOREIGN PATENT DOCUMENTS

| | | |
|---|---|---|
| JP | 2008-091737 A | 4/2008 |
| JP | 2008-141036 A | 6/2008 |
| JP | 2008-193121 A | 8/2008 |
| JP | 2009-302506 A | 12/2009 |
| JP | 2014-167987 A | 9/2014 |
| TW | 201201351 A | 1/2012 |
| TW | 201501223 A | 1/2015 |
| TW | 201519391 A | 5/2015 |
| TW | 201533872 A | 9/2015 |
| WO | 2011/125380 A1 | 10/2011 |

OTHER PUBLICATIONS

Taiwanese Office Action issued in corresponding Taiwanese Patent Application No. 105133792, dated Mar. 13, 2018, with English Translation.

Office Action issued in related Taiwanese Patent Application No. 107117568, dated Aug. 6, 2018.

* cited by examiner

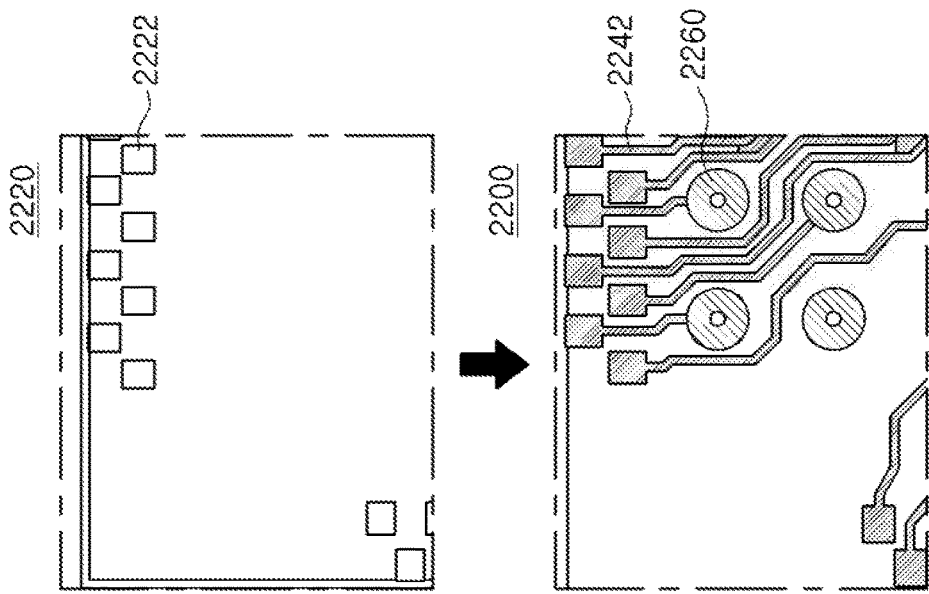
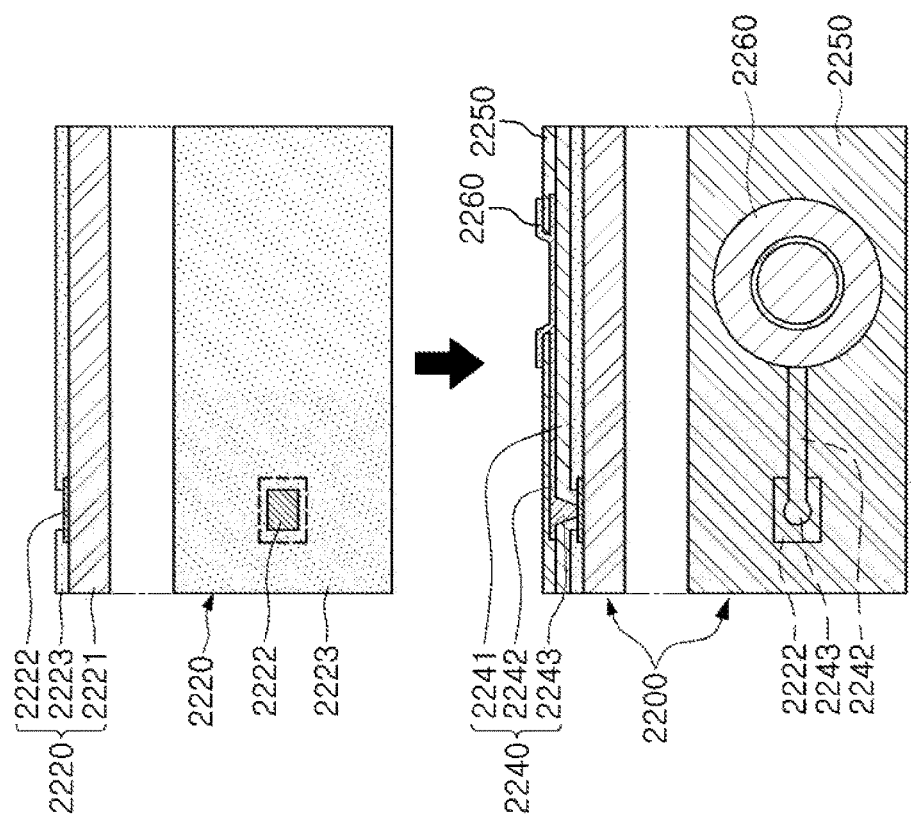
FIG. 3B
FIG. 3A

FAN-OUT SEMICONDUCTOR PACKAGE AND ELECTRONIC DEVICE INCLUDING THE SAME

CROSS-REFERENCE TO RELATED APPLICATION

This application claims the priority and benefit of Korean Patent Application No. 10-2015-0157563 filed on Nov. 10, 2015, with the Korean Intellectual Property Office, the disclosure of which is incorporated herein by reference.

TECHNICAL FIELD

The present disclosure relates to a semiconductor package and an electronic device including the same.

BACKGROUND

A semiconductor package is a type of package technology for electrically connecting an electronic component to a printed circuit board (PCB), for example, a main board of an electronic device, or the like, and protecting the electronic component from external impacts, and is distinguishable from a technology of embedding an electronic component in a printed circuit board, for example, an interposer substrate. Meanwhile, one of the main recent trends in the development of technology related to electronic components is reducing electronic components in size. Therefore, in the field of packages, in accordance with a rapid increase in demand for small electronic components, or the like, the provision of a semiconductor package having a small size and including a plurality of pins has been demanded.

One type of package technology, suggested in order to satisfy the technical demand as described above, features a wafer level package (WLP) in which wiring of an electrode pad of an electronic component formed on a wafer is redistributed. An example of a wafer level package includes a fan-in wafer level package and a fan-out wafer level package. Particularly, the fan-out wafer level package has a small size and is advantageous in implementing a plurality of pins. Therefore, recently, the fan-out wafer level package has been actively developed.

Meanwhile, generally, in a case in which the semiconductor package is mounted on the main board of the electronic device, or the like, since a difference between coefficients of thermal expansion (CTE) of the electronic component and the main board is significantly high, a difference between effective coefficients of thermal expansion of the semiconductor package and the main board may be intensified. As a result, in a case in which the semiconductor package mounted on the main board is exposed to a harsh environment, a crack may be generated in a connection terminal, for example, a solder ball, connecting the semiconductor package and the main board to each other.

SUMMARY

An aspect of the present disclosure may provide a novel fan-out semiconductor package in which board level reliability is improved, and an electronic device including the same.

According to an aspect of the present disclosure, a via and a pad in an interconnection member may be disposed so that centers thereof are staggered in order to easily absorb stress causing cracking of a connection terminal connecting a semiconductor package and a main board to each other.

BRIEF DESCRIPTION OF DRAWINGS

The above and other aspects, features and other advantages of the present disclosure will be more clearly understood from the following detailed description taken in conjunction with the accompanying drawings, in which:

FIGS. 3A and 3B are schematic cross-sectional views illustrating states of a fan-in semiconductor package before and after being packaged;

DETAILED DESCRIPTION

Figure 1:
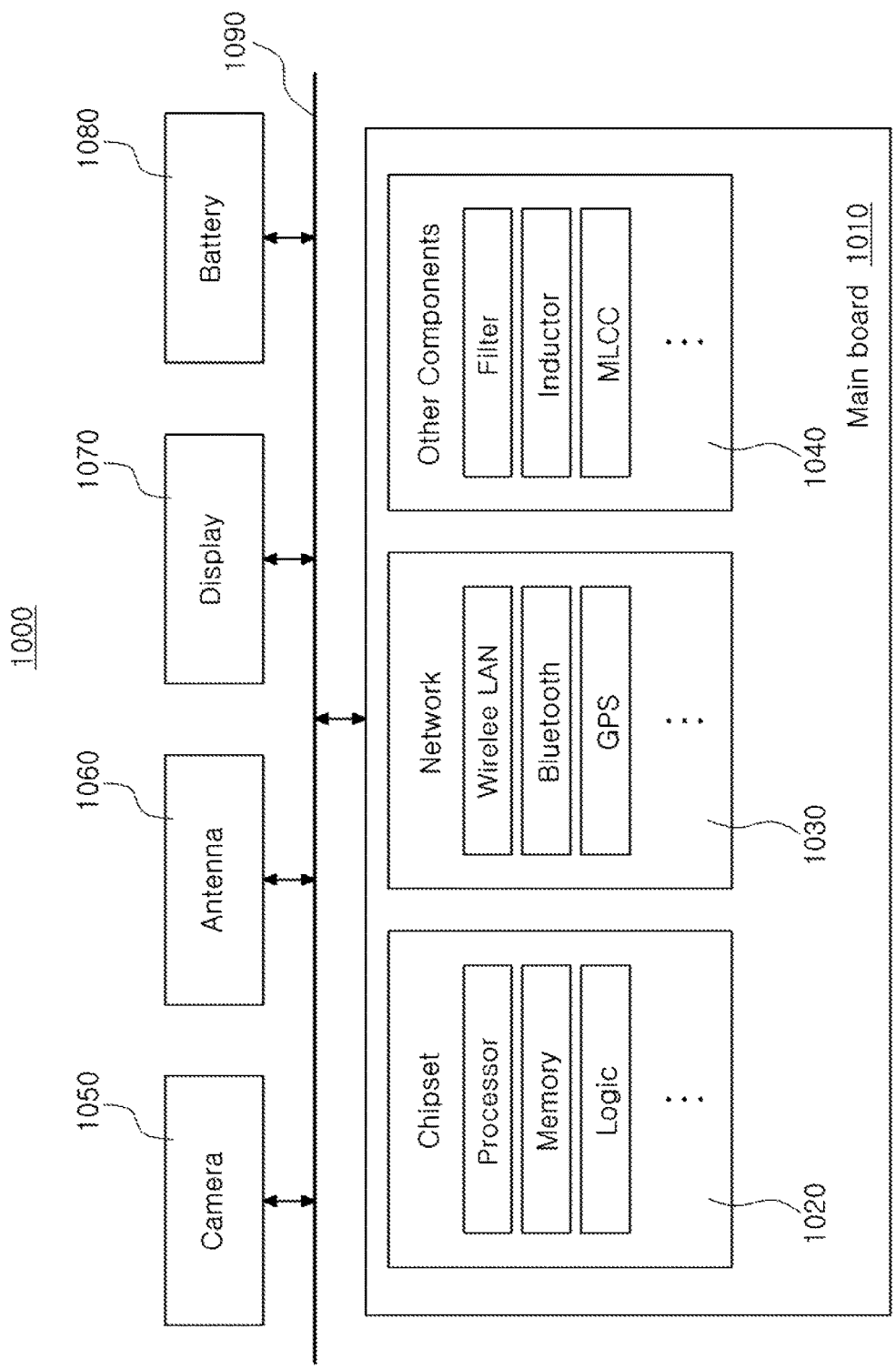
FIG. 1 is a schematic block diagram illustrating an example of an electronic device system.

Hereinafter, embodiments of the present inventive concept will be described as follows with reference to the attached drawings.

The present inventive concept may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present inventive concept will be described with reference to schematic views illustrating embodiments of the present inventive concept. In the drawings, for example, due to manufacturing techniques and/or tolerances, modifications of the shape shown may be estimated. Thus, embodiments of the present inventive concept should not be construed as being limited to the particular shapes of regions shown herein, for example, to include a change in shape results in manufacturing. The following embodiments may also be constituted by one or a combination thereof.

The contents of the present inventive concept described below may have a variety of configurations and propose only a required configuration herein, but are not limited thereto.

Electronic Device

FIG. 1 is a schematic block diagram illustrating an example of an electronic device system;

Referring to FIG. 1, an electronic device 1000 may accommodate a main board 1010 therein. Chip related components 1020, network related components 1030, other components 1040, and the like, may be physically and/or electrically connected to the main board 1010. These components may be connected to other components to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphic processor (for example, a graphic processing unit (GPU)), a digital signal processor, a cryptographic processor, a micro processor, a micro controller, or the like; a logic chip such as an analog-to-digital converter, an application-specific integrated circuit (ASIC), or the like, and the like. However, the chip related components 1020 are not limited thereto, but may also include other types of chip related components. In addition, these components 1020 may be combined with each other.

The network related components 1030 may include protocols such as wireless fidelity (Wi-Fi) (Institute of Electrical and Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, 5G protocols and any other wireless and wired protocols designated after the above-mentioned protocols. However, the network related components 1030 are not limited thereto, but may also include any of a plurality of other wireless or wired standards or protocols. In addition, these components 1030 may be combined with each other together with the chip related components 1020 described above.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), and the like. However, other components 1040 are not limited thereto, but may also include passive components used for various other purposes, and the like. In addition, these components 1040 may be combined with each other together with the chip related components 1020 and/or the network related components 1030 described above.

The electronic device 1000 may include other components that may be or may not be physically and/or electrically connected to the main board 1010 depending on a type thereof. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a kind of electronic device 1000.

The electronic device 1000 may be a smartphone, a personal digital assistant (PDA), a digital video camera, a digital still camera, a network system, a computer, a monitor, a tablet PC, a laptop, a netbook, a television, a video game machine, a smartwatch, or the like. However, the electronic device 1000 is not limited thereto, and may also be any other electronic device processing data.

Figure 2:
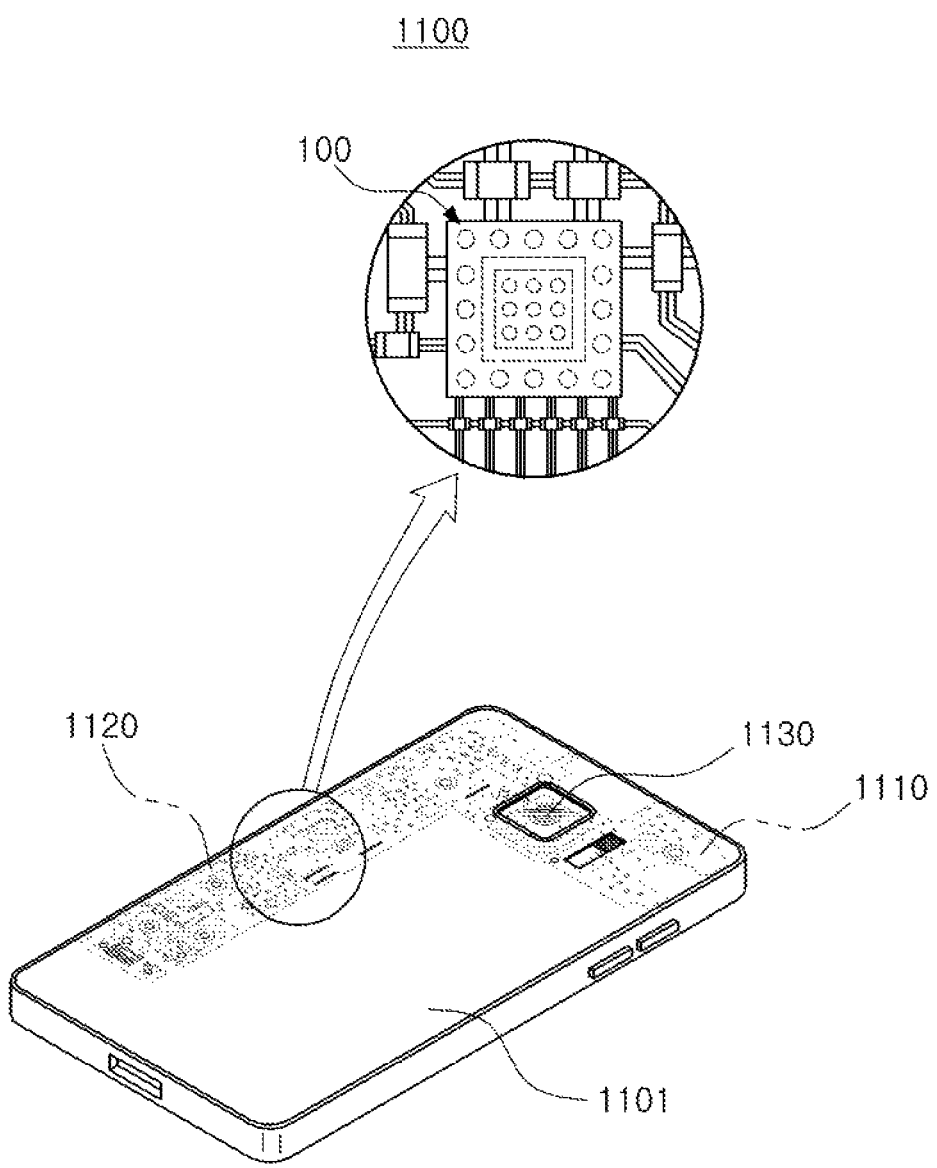
FIG. 2 is a schematic perspective view illustrating an example of an electronic device.

FIG. 2 is a schematic perspective view illustrating an example of an electronic device;

The electronic component package may be used for various purposes in the various electronic devices 1000 as described above. For example, a main board 1110 may be accommodated in a body 1101 of a smartphone 1100, and various electronic components 1120 may be physically and/or electrically connected to the main board 1110. In addition, another component that may be or may not be physically and/or electrically connected to the main board 1110, such as a camera 1130, may be accommodated in the body 1101. Here, some of the electronic components 1120 may be the chip related components as described above, and the semiconductor package 100 may be, for example, an application processor among the chip related components, but are not limited thereto.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a main board of the electronic device in terms of electrical connections. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in a circuit width between the semiconductor chip and the main board is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

FIGS. 3A and 3B are schematic cross-sectional views illustrating states of a fan-in semiconductor package before and after being packaged.

Figure 4:
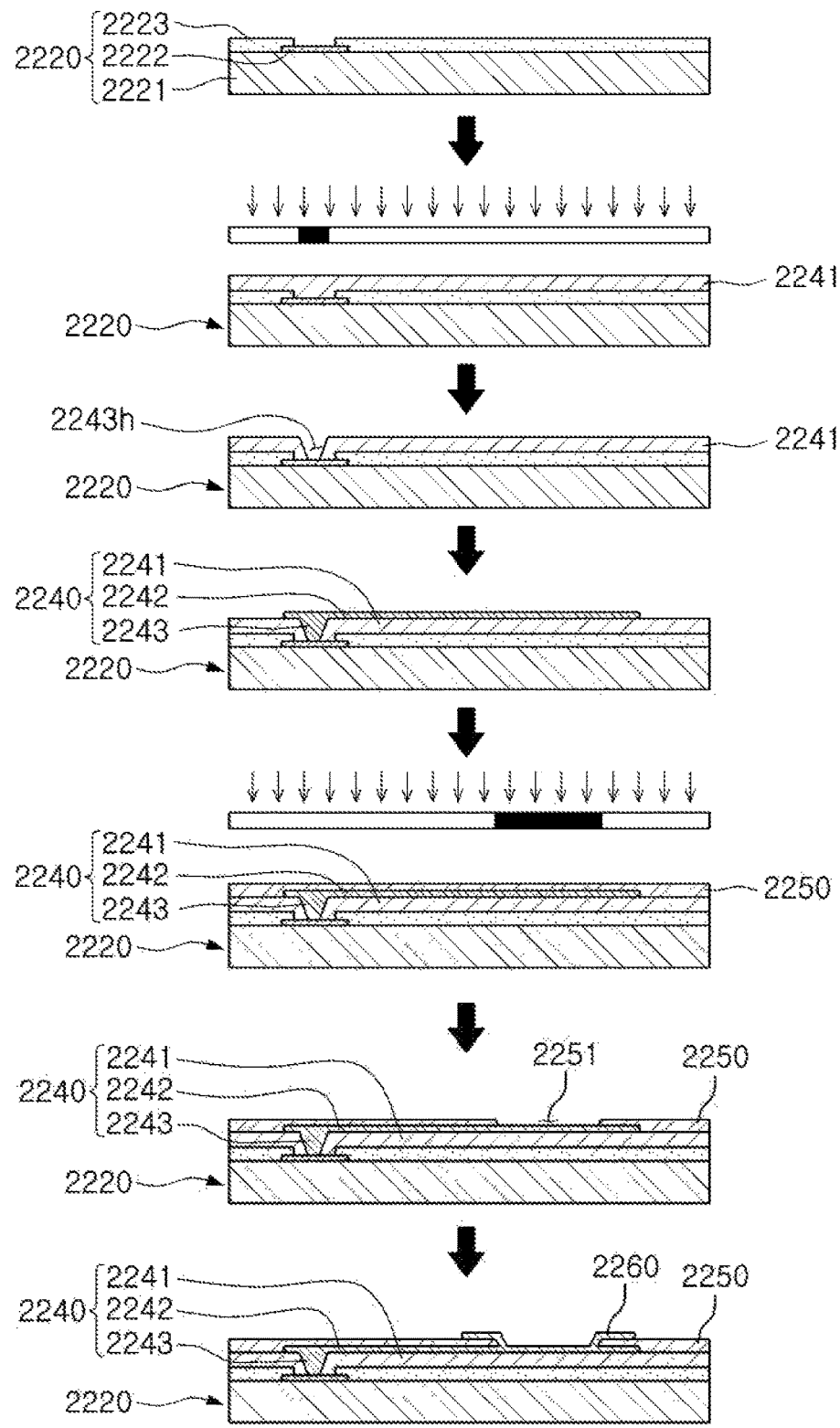
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming redistribution layers 2242 and vias 2243. Then, a passivation layer 2250 protecting the connection member 2240 may be formed, an opening 2251 may be formed, and an under-bump metal layer 2260, or the like, may be formed. That is, a fan-in semiconductor package 2200 including, for example, the semiconductor chip 2220, the connection member 2240, the passivation layer 2250, and the under-bump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. The reason is that even in the case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
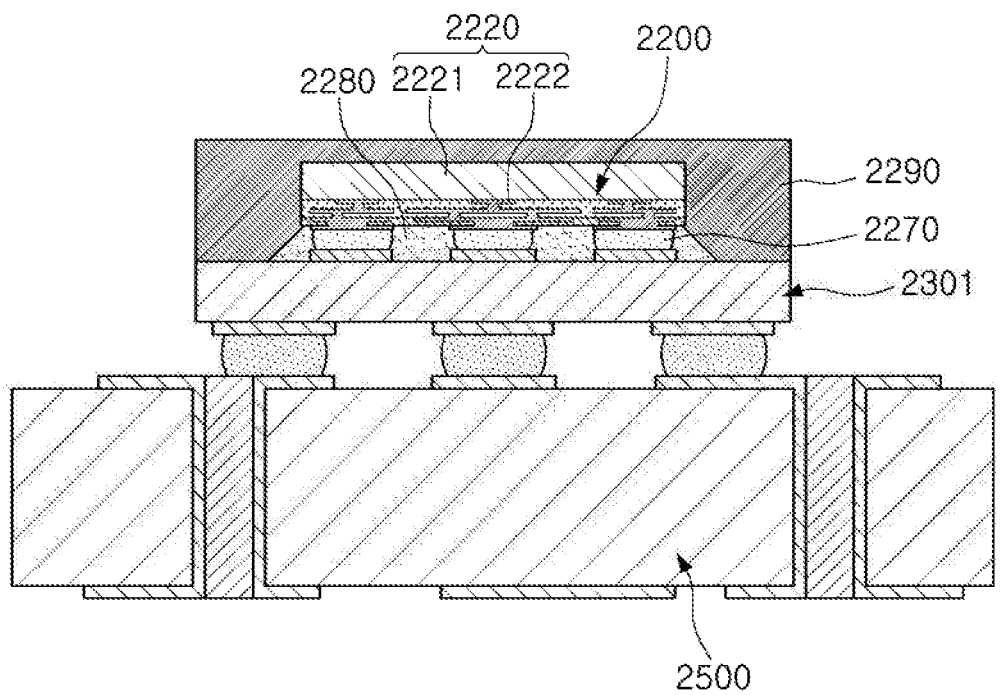
FIG. 5 is a schematic cross-sectional view illustrating a case in which a fan-in semiconductor package is mounted on an interposer substrate and is finally mounted on a main board of an electronic device.

FIG. 5 is a schematic cross-sectional view illustrating a case in which a fan-in semiconductor package is mounted on an interposer substrate and is finally mounted on a main board of an electronic device.

Figure 6:
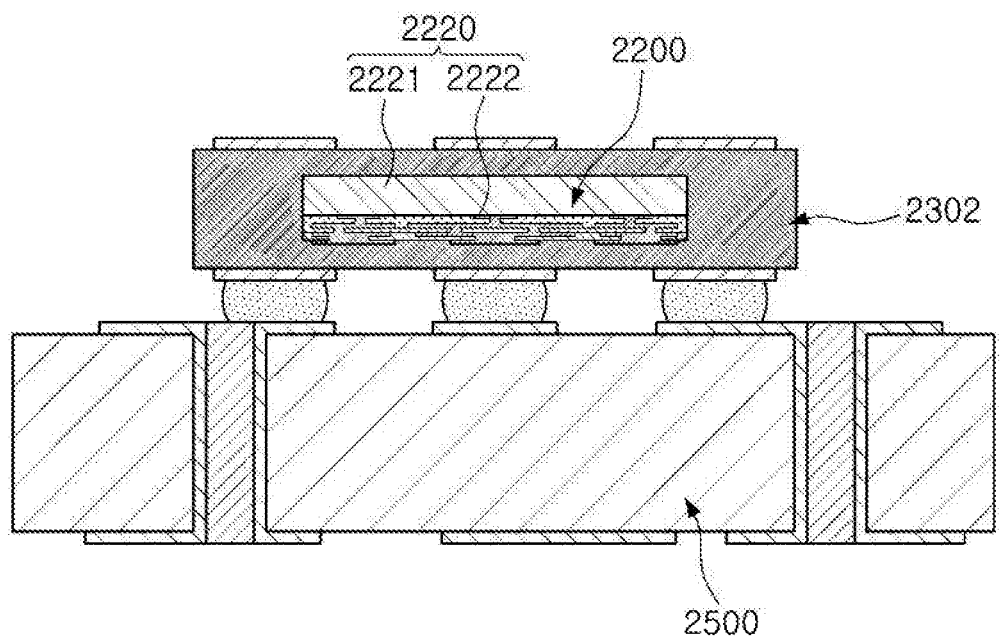
FIG. 6 is a schematic cross-sectional view illustrating a case in which a fan-in semiconductor package is embedded in an interposer substrate and is finally mounted on a main board of an electronic device.

FIG. 6 is a schematic cross-sectional view illustrating a case in which a fan-in semiconductor package is embedded in an interposer substrate and is finally mounted on a main board of an electronic device.

Referring to the drawings, in a fan-in semiconductor package 2200, connection pads 2222, that is, I/O terminals, of a semiconductor chip 2220 may be redistributed through an interposer substrate 2301, and the fan-in semiconductor package 2200 may be finally mounted on a main board 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be finally mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-Out Semiconductor Package

Figure 7:
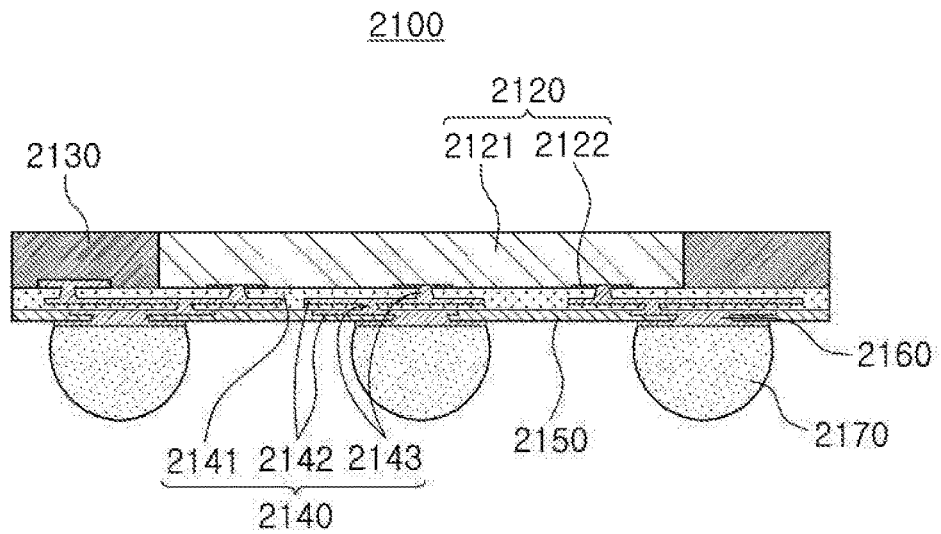
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may be further formed on the connection member 2140, and an under-bump metal layer 2160 may be further formed in openings of the passivation layer 2150. Solder balls 2170 may be further formed on the under-bump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in the case that a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
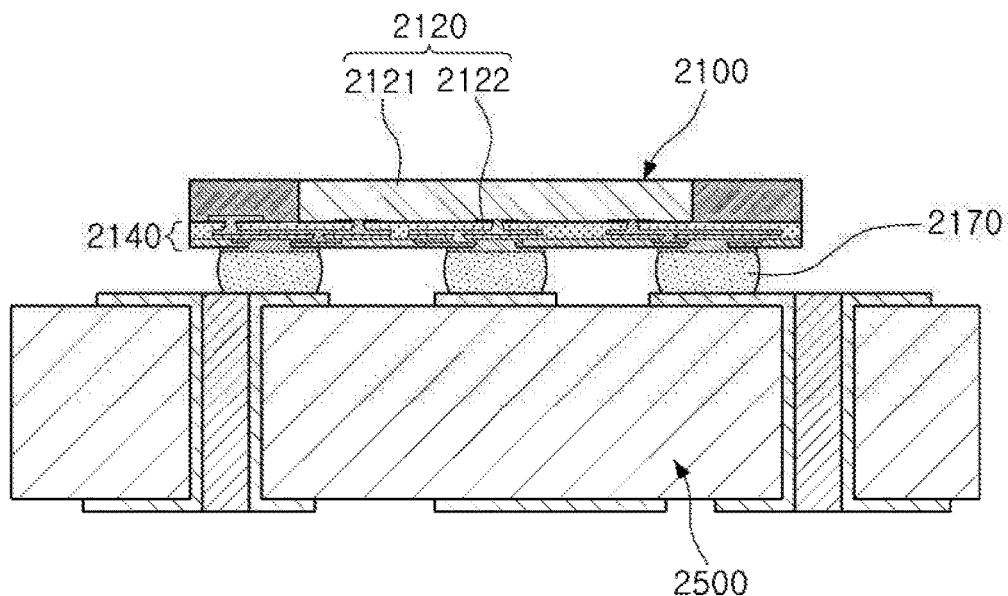
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Figure 9:
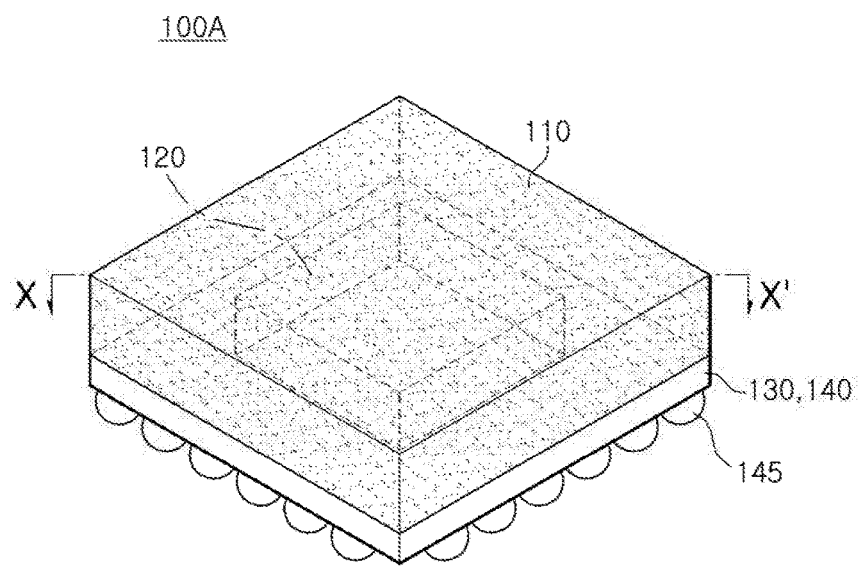
FIG. 9 is a perspective view schematically illustrating an example of a semiconductor package.

FIG. 9 is a perspective view schematically illustrating an example of a semiconductor package.

Figure 10:
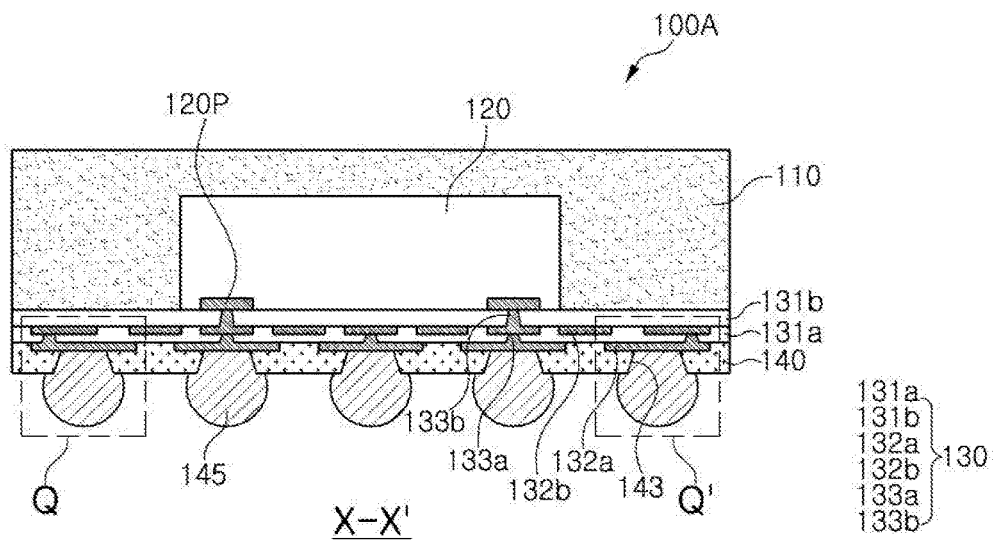
FIG. 10 is a schematic cross-sectional view of the semiconductor package taken along line X-X' of FIG. 9.

FIG. 10 is a schematic cross-sectional view of the semiconductor package taken along line X-X' of FIG. 9.

Figure 11A:
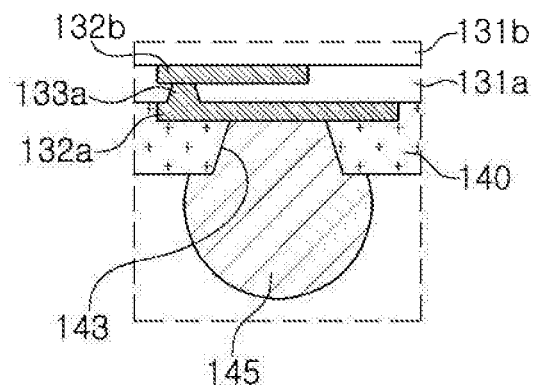
FIGS. 11A and 11B are enlarged views schematically illustrating an example of a region Q or Q' of FIG. 10.
Figure 11B:
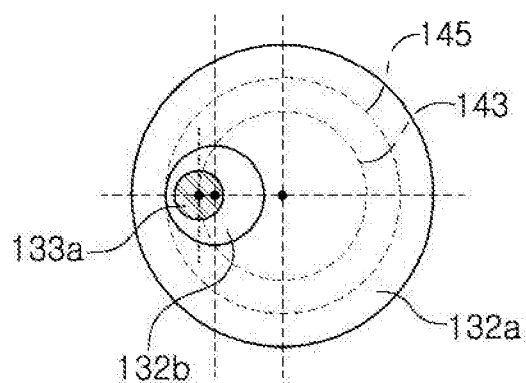

FIGS. 11A and 11B are enlarged views schematically illustrating an example of a region Q or Q' of FIG. 10.

Figure 12A:
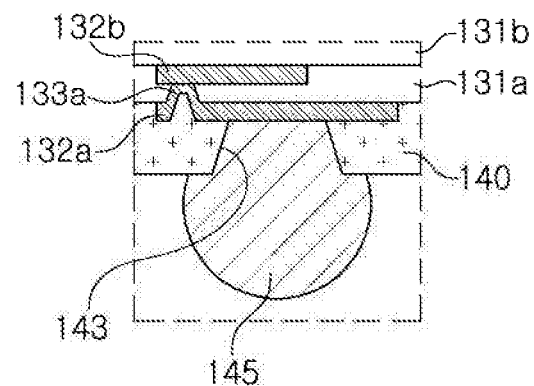
FIGS. 12A and 12B are enlarged views schematically illustrating another example of a region Q or Q' of FIG. 10.
Figure 12B:
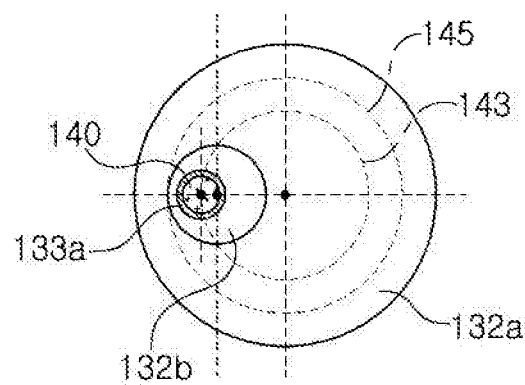

FIGS. 12A and 12B are enlarged views schematically illustrating another example of a region Q or Q' of FIG. 10.

Referring to FIGS. 9 through 12B, a semiconductor package 100A according to an example may include an interconnection member 130, an electronic component 120 disposed on the interconnection member 130, and an encapsulant 110 encapsulating the electronic component 120. Here, first vias 133a of at least regions Q and/or Q' of the interconnection member 130 may be disposed so that the center lines thereof are off the center lines of first and second pads 132a and 132b respectively disposed on opposite sides of a first insulating layer 131a by a predetermined distance in any direction. That is, the center lines of the first vias 133a may not coincide with those of the first and second pads 132a and 132b.

Generally, in a case in which the semiconductor package is mounted on the main board of the electronic device, or the like, since a difference between coefficients of thermal expansion (CTE) of the electronic component and the main board is significantly high, a crack may be generated in a connection terminal, for example, a solder ball, connecting the semiconductor package and the main board to each other when the semiconductor package mounted on the main board is exposed to a harsh environment. In more detail, warpage may be generated in the semiconductor package and the main board due to the difference between the CTE of the electronic component and the main board. Here, the warpage generated in the semiconductor package and the warpage generated in the main board act in opposite directions, such that stress may be concentrated on the connection terminal, for example, the solder ball, connecting the semiconductor package and the main board to each other. As a result, the crack may be generated. This crack may be problematic particularly in an edge portion of the semiconductor package. In this regard, the stress as described above is concentrated in the edge portion of the semiconductor package.

On the other hand, in a case in which the first vias 133a of at least regions Q and/or Q' of the interconnection member 130 in which a large amount of stress is concentrated are disposed so that the center lines thereof are off the center lines of the first and second pads 132a and 132b respectively disposed on opposite sides of the first insulating layer 131a by the predetermined distance in any direction as in the semiconductor package 100A according to an example, the first vias 133a and the first and second pads 132a and 132b may serve as a type of spring. Therefore, the stress concentrated on the connection terminal, for example, the solder ball may be alleviated. Therefore, board level reliability of the semiconductor package may be improved. The disposition as described above is not limited to being applied to only regions Q and/or Q', but may also be applied to regions of the interconnection member 130 other than regions Q and/or Q'.

Hereinafter, respective components included in the semiconductor package 100A according to an example will be described in more detail.

The encapsulant 110 may be provided to protect the electronic component 120. A form in which the encapsulant 110 encapsulates the electronic component 120 is not particularly limited, but may be, for example, a form in which the encapsulant 110 encloses at least a portion of the electronic component. A detailed material of the encapsulant 110 is not particularly limited. For example, an insulating material may be used as a material of the encapsulant 110. Here, the insulating material may be a thermosetting resin such as an epoxy resin, a thermoplastic resin such as a polyimide resin, a resin having a reinforcing material such as a glass fiber or an inorganic filler impregnated in the thermosetting resin and the thermoplastic resin, for example, prepreg, an Ajinomoto Build up Film (ABF), FR-4, Bismaleimide Triazine (BT), a photo imagable dielectric (PID) resin, or the like. In addition, a known molding material such as an epoxy molding compound (EMC), or the like, may also be used. The encapsulant 110 may contain conductive particles in order to block electromagnetic waves, if necessary. For example, the conductive particle may be any material that may block electromagnetic waves, for example, copper (Cu), aluminum (Al), silver (Ag), tin (Sn), gold (Au), nickel (Ni), lead (Pb), solder, or the like, but is not limited thereto.

The encapsulant 110 may be formed by a known method. For example, the encapsulant 110 may be formed by a method of laminating a precursor of the encapsulant 110 so as to encapsulate the electronic component 120 and then hardening the precursor. Alternatively, the encapsulant 110 may be formed by a method of applying a pre-encapsulant to an adhesive film, or the like, so as to encapsulate the electronic component 120 and then hardening the pre-encapsulant. As the method of laminating the precursor, for example, a method of performing a hot press process of pressing the precursor for a predetermined time at a high temperature, decompressing the precursor, and then cooling the precursor to room temperature, cooling the precursor in a cold press process, and then separating a work tool, or the like, may be used. As the method of applying the pre-encapsulant, for example, a screen printing method of applying ink by squeegee, a spray printing method of applying ink in mist form, or the like, may be used.

The electronic component 120 may be various active components (for example, a diode, a vacuum tube, a transistor, and the like) or passive components (for example, an inductor, a condenser, a resistor, and the like). Alternatively, the electronic component 120 may be an integrated circuit (IC) indicating a chip in which hundreds to millions or more of elements are integrated. The electronic component 120 may be an electronic component in which an integrated circuit is packaged in a flip-chip form, if necessary. The integrated circuit may be an application processor chip such as a central processor (for example, a CPU), a graphic processor (for example, a GPU), a digital signal processor, a cryptographic processor, a micro processor, a micro controller, or the like, but is not limited thereto. A thickness of the electronic component 120 in a cross section thereof is not particularly limited, but may be changed depending on a type of electronic component 120. For example, in a case in which the electronic component is the integrated circuit, a thickness of the electronic component may be about 100 μm to 480 μm, but is not limited thereto.

The electronic component 120 may have electrode pads 120P electrically connected to the interconnection member 130. The electrode pad 120P may be to electrically connect the electronic component 120 to the outside, and a material of the electrode pad 120P is not particularly limited as long as it is a conductive material. The conductive material may be copper (Cu), aluminum (Al), silver (Ag), tin (Sn), gold (Au), nickel (Ni), lead (Pb), or alloys thereof, or the like, but is not limited thereto. The electrode pad 120P may be redistributed by the interconnection member 130. The electrode pad 120P may have an embedded form or a protruding form.

In the case in which the electronic component 120 is the integrated circuit, the electronic component may have a body (not denoted by a reference number), a passivation layer (not denoted by a reference number), and the electrode pads 120P. The body may be formed on the basis of, for example, an active wafer. In this case, silicon (Si), germanium (Ge), gallium arsenide (GaAs), or the like, may be used as a basic material of the body. The passivation layer may serve to protect the body from the outside, and may be formed of, for example, an oxide layer, a nitride layer, or the like, or be formed of a double layer of an oxide layer and a nitride layer. A conductive material such as copper (Cu), aluminum (Al), silver (Ag), tin (Sn), gold (Au), nickel (Ni), lead (Pb), or alloys thereof, or the like, may be used as a material of the electrode pad 120P. A layer on which the electrode pads 120P are formed may become an active layer.

Figure 56:
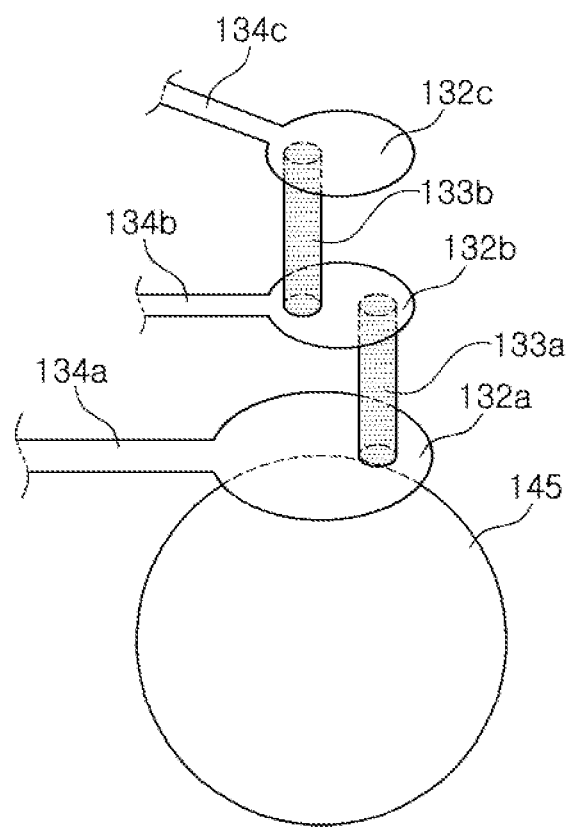
FIG. 56 is a cross-sectional view schematically illustrating an example of an interconnection member in order to describe a pad and a wiring.

The interconnection member 130 may redistribute the electrode pads 120P of the electronic component 120. Tens to hundreds of electrode pads 120P having various functions may be redistributed through the interconnection member 130, and may be physically and/or electrically connected to the outside through first connection terminals 145 depending on functions thereof. The interconnection member layer 130 may include first and second insulating layers 131a and 131b, first and second wirings 134a and 134b disposed beneath the first and second insulating layers 131a and 131b, first and second pads 132a and 132b disposed beneath the first insulating and second insulating layers 131a and 131b and connected to the first and second wirings 134a and 134b, and first vias 133a connecting the first and second pads 132a and 132b to each other. In addition, the interconnection member 130 may include the first vias 133a connected to the electrode pads 120P of the electronic component 120. Here, the first and second wirings 134a and 134b and the first and second pads 132a and 132b may be terms distinguished from each other. For example, FIG. 56 schematically illustrates an example of a pattern design of an interconnection member. Here, parts used as a type of stopper for connecting first and second vias 133a and 133b, and the like, formed in different layers to each other will be called "pads 132a, 132b, and 132c", and parts connected to the "pads 132a, 132b, and 132c" to have predetermined paths will be called "wirings 134a, 134b, and 134c". When referring to only a cross section, it is not easy to distinguish the pads and the wirings from each other. However, the pads and the wirings are components clearly distinguished from each other.

The first and second insulating layers 131a and 131b may protect the first and second wirings 134a and 134b, the first and second pads 132a and 132b, the first and second vias 133a and 133b, and the like, and may serve to insulate the first and second wirings 134a and 134b, the first and second pads 132a and 132b, the first and second vias 133a and 133b, and the like, from each other, if necessary. An insulating material may be used as materials of the first and second insulating layers 131a and 131b. The insulating material may be a thermosetting resin such as an epoxy resin, a thermoplastic resin such as a polyimide resin, a resin having a reinforcing material such as a glass fiber or an inorganic filler impregnated in the thermosetting resin and the thermoplastic resin, for example, prepreg, ABF, FR-4, BT, or the like. In a case in which a photosensitive insulating material such as a photo imagable dielectric (PID) resin is used as materials of the first and second insulating layers 131a and 131b, the first and second insulating layers 131a and 131b may be formed at a reduced thickness. Therefore, the first and second vias 133a and 133b having a fine pitch may be more easily implemented. The first and second insulating layers 131a and 131b may be two layers as illustrated, but are not limited thereto. That is, the first and second insulating layers 131a and 131b may be a single layer or be a plurality of layers more than two layers, if necessary. Materials of the first and second insulating layers 131a and 131b may be the same as each other or may be different from each other, if necessary. Thicknesses of the first and second insulating layers 131a and 131b are not particularly limited. For example, thicknesses of the first and second insulating layers 131a and 131b except for the first and second wirings 134a and 134b or the first pads 132a may be about 5 μm to 20 μm, and thicknesses of the first and second insulating layers 131a and 131b when considering thicknesses of the first and second wirings 134a and 134b or the first pads 132a may be about 15 µm to 70 µm.

The first and second insulating layers 131a and 131b may be formed by a known method, for example, a method of laminating precursors of the first and second insulating layers 131a and 131b and then hardening the precursors, a method of applying materials for forming the first and second insulating layers 131a and 131b and then hardening the materials, or the like, but are not limited thereto. As the method of laminating the precursor, for example, a method of performing a hot press process of pressing the precursor for a predetermined time at a high temperature, decompressing the precursor, and then cooling the precursor to room temperature, cooling the precursor in a cold press process, and then separating a work tool, or the like, may be used. As the method of applying the material, for example, a screen printing method of applying ink by squeegee, a spray printing method of applying ink in mist form, or the like, may be used. The hardening process, which is a post-process, may be a process of drying the material so as not to be completely hardened in order to use a photolithography method, or the like.

The first and second wirings 134a and 134b may also serve as a redistribution wiring, and a conductive material such as copper (Cu), aluminum (Al), silver (Ag), tin (Sn), gold (Au), nickel (Ni), lead (Pb), or alloys thereof, or the like, may be used as materials of the first and second wirings 134a and 134b. The first and second wirings 134a and 134b may perform various functions depending on designs of the corresponding layers. For example, the first and second wirings 134a and 134b may serve as a ground (GND) pattern, a power (PWR) pattern, a signal (S) pattern, and the like. Here, the signal (S) pattern may include various signals except for the ground (GND) pattern, the power (PWR) pattern, and the like, for example, data signals, and the like. The first and second wirings 134a and 134b may be connected to the first and second pads 132a and 132b disposed on the same layer, and the first and second pads 132a and 132b may be connected to each other by the vias 133a and 133b, and the like. Therefore, the first and second pads 132a and 132b may be electrically connected to the first and second wirings 134a and 134b disposed on different layers, the electrode pads 120P of the electronic component 120, or the like. Thicknesses of the first and second wirings 134a and 134b are also not particularly limited, but may be, for example, about 10 µm to 50 µm.

The first pads 132a may serve as pads of the first connection terminals 145. A conductive material such as copper (Cu), aluminum (Al), silver (Ag), tin (Sn), gold (Au), nickel (Ni), lead (Pb), or alloys thereof, or the like, may be used as a material of the first pad 132a. A shape of the first pad 132a when viewed from above is not particularly limited, but may be a circular shape as illustrated in the drawings, or be an oval shape or a rectangular shape unlike the drawings. A size of the first pad 132a when viewed from above may be larger than that of the second pad 132b. A thickness of the first pad 132a is not limited to being in a special numerical range, but may be, for example, about 10 µm to 50 µm. A surface treatment layer may be further formed on the first pad 132a, if necessary. The surface treatment layer is not particularly limited as long as it is known in the related art, and may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like.

The second pads 132b may serve as pads of the first and second vias 133a and 133b. A conductive material such as copper (Cu), aluminum (Al), silver (Ag), tin (Sn), gold (Au), nickel (Ni), lead (Pb), or alloys thereof, or the like, may be used as a material of the second pad 132b. A shape of the second pad 132b when viewed from above is not particularly limited, but may be a circular shape as illustrated in the drawings, or be an oval shape or a rectangular shape unlike illustrated in the drawings. A size of the second pad 132b when viewed from above may be smaller than that of the first pad 132a. A thickness of the second pad 132b is not particularly limited, but may be, for example, about 10 µm to 50 µm.

The first and second wirings 134a and 134b and the first and second pads 132a and 132b may be formed by a known method, for example, electrolytic copper plating, electroless copper plating, or the like. In more detail, the first and second wirings 134a and 134b and the first and second pads 132a and 132b may be formed using a method such as chemical vapor deposition (CVD), physical vapor deposition (PVD), sputtering, a subtractive process, an additive process, a semi-additive process (SAP), a modified semi-additive process (MSAP), or the like, but are not limited thereto.

The first vias 133a may connect the first and second wirings 134a and 134b, the first and second pads 132a and 132b, and the like, formed on different layers to each other, thereby forming electrical paths in the semiconductor package 100A. A conductive material such as copper (Cu), aluminum (Al), silver (Ag), tin (Sn), gold (Au), nickel (Ni), lead (Pb), or alloys thereof, or the like, may be used as a material of the first via 133a. The first via 133a may be completely filled with a conductive material, as illustrated in FIG. 11A. Alternatively, a conductive material may be formed along a wall of a via hole, as illustrated in FIG. 11B. In addition, the first via 133a may have all of the shapes known in the related art, such as a tapered shape in which a diameter of the via is reduced toward a lower surface, a reverse taper shape in which a diameter of the via is increased toward a lower surface, a cylindrical shape, and the like.

The second vias 133b may connect the electrode pads 120P of the electronic component 120 and the second wirings 134b, the second pads 132, and the like, to each other, thereby forming electrical paths in the semiconductor package 100A. A conductive material such as copper (Cu), aluminum (Al), silver (Ag), tin (Sn), gold (Au), nickel (Ni), lead (Pb), or alloys thereof, or the like, may be used as a material of the second via 133b. The second via 133b may also be completely filled with a conductive material. Alternatively, a conductive material may be formed along a wall of a via hole. In addition, the second via 133b may have all shapes known in the related art, such as a tapered shape in which a diameter of the via is reduced toward a lower surface, a reverse taper shape in which a diameter of the via is increased toward a lower surface, a cylindrical shape, and the like.

The center lines of the first vias 133a may not coincide with those of the first pad 132a and/or the second pad 132b. In this case, a stress alleviating effect may be realized by a type of spring action as compared to in a case in which the center lines of the first vias 133a coincide with those of the first pad 132a and/or the second pad 132b. Therefore, board level reliability of the semiconductor package 100A may be improved. The disposition as described above is not limited to only being applied to regions Q and/or Q', but may also be applied to regions of the interconnection member 130 other than the regions Q and/or Q'. In addition, the disposition as described above may also be applied to the second vias 133b.

The first and second vias 133a and 133b may be formed by a known method, for example, mechanical drilling and/or laser drilling, or may be formed by forming via holes in the first and second insulating layers 131a and 131b by a photolithography method and then performing electrolytic copper plating, electroless copper plating, or the like, using a dry film pattern, in a case in which the first and second insulating layers 131a and 131b contain the photosensitive insulating material.

The electronic component package 100A according to an example may further include a passivation layer 140 disposed on a surface of the first insulating layer 131a on which the first pads 132a are disposed and having first openings 143 exposing at least portions of the first pads 132a. The passivation layer 140 may protect the first and second insulating layers 131a and 131b, the first and second wirings 134a and 134b, the first and second pads 132a and 132b, the first and second vias 133a and 133b, and the like, and may serve to insulate the first and second insulating layers 131a and 131b, the first and second wirings 134a and 134b, the first and second pads 132a and 132b, the first and second vias 133a and 133b from the outside, if necessary. An insulating material may be used as a material of the passivation layer 140. The known solder resist may be used as the insulating material. In addition, the same material as those of the first and second insulating layers 131a and 131b, for example, the same PID resin may also be used as a material of the passivation layer 140. The passivation layer 140 is generally a single layer, but may also be formed of multiple layers, if necessary. A thickness of the passivation layer 140 is not particularly limited. For example, a thickness of the passivation layer 140 except for the first wiring 134a or the first pad 132a may be about 5 μm to 20 μm, and a thickness of the passivation layer 140 except when considering a thickness of the first wirings 134a or the first pad 132a may be about 15 μm to 70 μm.

The center line of the first opening 143 of the passivation layer 140 may not coincide with that of the first via 133a. In this case, stress applied to the first connection terminal 145 disposed in the first opening 143 may be alleviated by spring action of the first via 133a. Therefore, board level reliability of the semiconductor package 100A may be improved. The disposition as described above is not limited to only being applied to the regions Q and/or Q', but may also be applied to regions of the interconnection member 130 other than the regions Q and/or Q'.

The electronic component package 100A according to an example may further include the first connection terminals 145 disposed in the first openings 143 of the passivation layer 140. The first connection terminals 145 may be to physically and/or electrically connect the semiconductor package 100A to the outside. For example, the semiconductor package 100A may be mounted on the main board of the electronic device through the first connection terminals 145. The first connection terminals 145 may be disposed in the first openings 143 of the passivation layer 140, and may be connected to the first pads 132a opened through the first openings 143. Therefore, the first connection terminals 145 may also be electrically connected to the electronic component 120.

The first connection terminal 145 may be formed of a conductive material, for example, copper (Cu), aluminum (Al), silver (Ag), tin (Sn), gold (Au), nickel (Ni), lead (Pb), solder, or the like, but is not limited thereto. The first connection terminal 145 may be a land, a ball, a pin, or the like. However, the first connection terminal 145 may generally be a solder ball. The first connection terminal 145 may be formed of multiple layers or a single layer. In a case in which the first connection terminal 145 is formed of the multiple layers, the first connection terminal 145 may contain a copper pillar and a solder, and in a case in which the first connection terminal 145 is formed of the single layer, the first connection terminal 145 may contain a tin-silver solder or copper. However, this is only an example, and the first connection terminal 145 is not limited thereto.

The first connection terminal 145 may be disposed in a fan-in region and/or a fan-out region. The fan-in region is a region in which the electronic component is disposed, and the fan-out region is a region except for the region in which the electronic component is disposed. That is, the semiconductor package 100A according to an example may be a fan-in package or a fan-out package. The number, an interval, a disposition, and the like, of first connection terminals 145 are not particularly limited, but may be sufficiently modified depending on design particulars by those skilled in the art. For example, the number of first connection terminals 145 may be several ten to several thousand, depending on the number of electrode pads 120P of the electronic component 120. However, the number of first connection terminals 145 is not limited thereto, but may also be several ten to several thousand or more, or several ten to several thousand or less.

The first connection terminals 145 may be fixed by reflow, and portions of the first connection terminals 145 may be embedded in the passivation layer 140 in order to enhance fixing force and the remaining portions of the first connection terminals 145 may be exposed to the outside, whereby reliability may be improved. The first openings 143 may be formed using mechanical drilling and/or laser drilling, or may be formed by a photolithography method. In some cases, only the first openings 143 may be formed, and the first connection terminals 145 may be formed by a separate process, if necessary.

The center line of the first connection terminal 145 may not coincide with that of the first via 133a. In this case, stress applied to the first connection terminal 145 may be alleviated by spring action of the first via 133a. Therefore, board level reliability of the semiconductor package 100A may be improved. The disposition as described above is not limited to being applied to only the regions Q and/or Q', but may also be applied to regions of the interconnection member 130 other than the regions Q and/or Q'.

Figure 13:
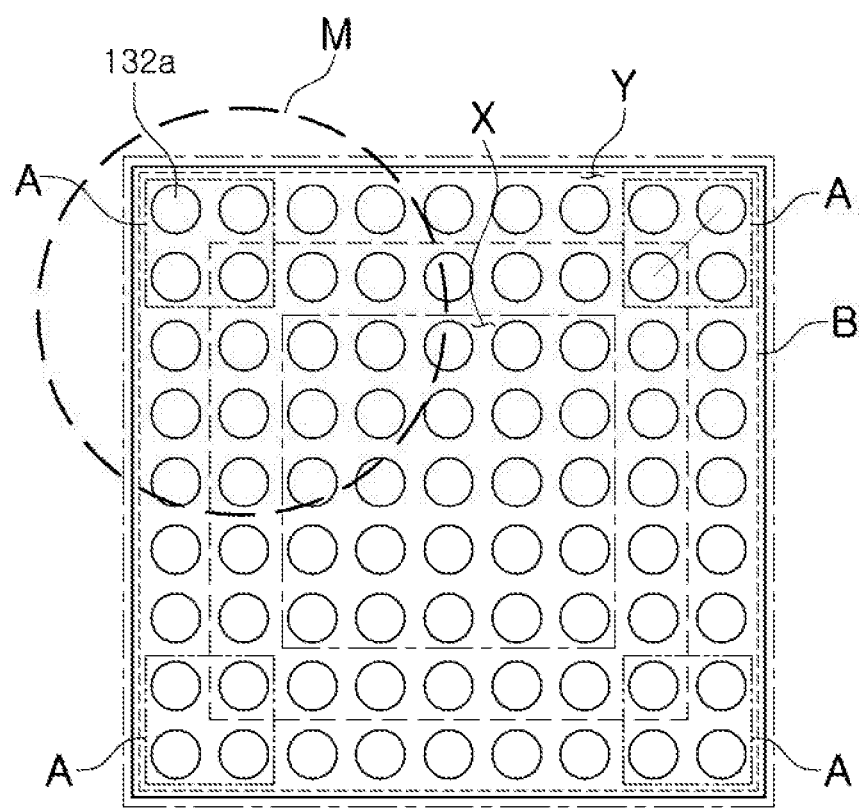
FIG. 13 is a plan view illustrating an example of an array of first pads.

FIG. 13 is a plan view illustrating an example of an array of first pads of a semiconductor package according to an example.

Referring to FIG. 13, the interconnection member 130 may include a first region X corresponding to a region in which the electronic component 120 is disposed and a second region Y enclosing the first region X, when viewed from below. Here, a corner portion A of the second region Y may be a region corresponding to regions Q and Q' described above, and may be a region in which stress is concentrated on the first connection terminal 145 in a case in which the semiconductor package 100A is mounted on the main board, as described above. Therefore, in the case in which the first vias 133a are disposed so that the centerlines thereof do not coincide with those of the first and second pads 132a and 132b, as described above, in order to alleviate the stress in at least the corner portion A of the second region Y, the board level reliability of the semiconductor package 100A may be improved. However, the stress is not limited to being concentrated in the corner portion A of the second region Y, but may also be significantly concentrated in the outermost portion B of the second region Y. Therefore, in at least the outermost portion B of the second region Y, as described above, the first vias 133a may be disposed so that the center lines thereof do not coincide with those of the first and second pads 132a and 132b. In this case, the board level reliability may be further improved.

Figure 14:
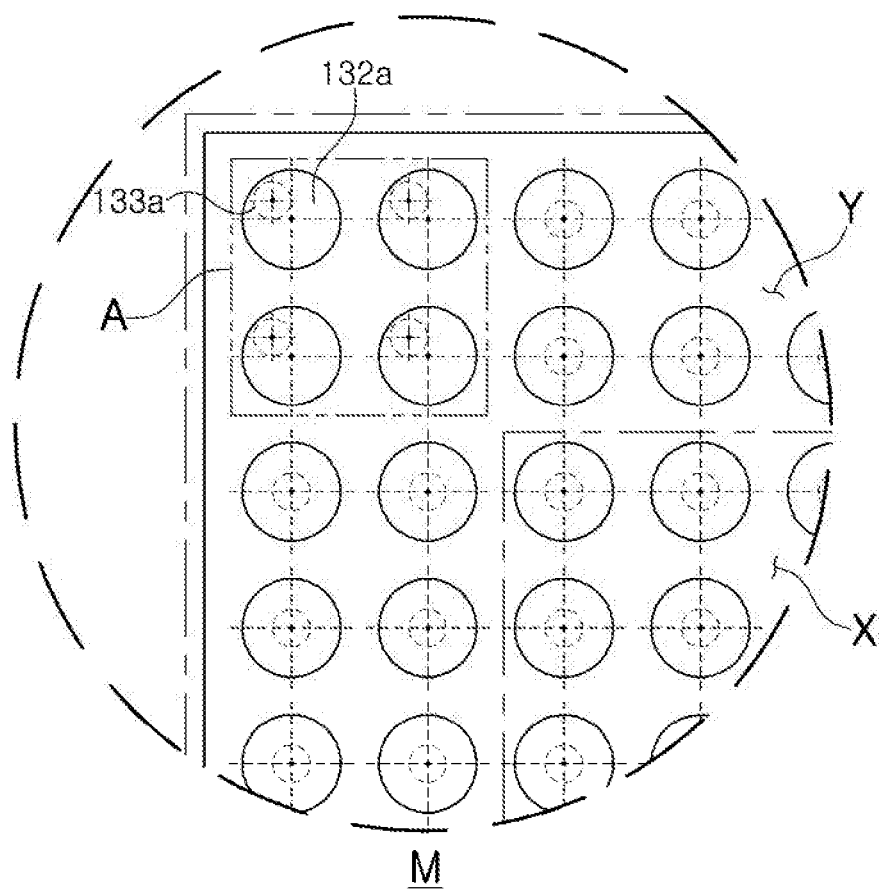
FIG. 14 is an enlarged view schematically illustrating an example of a region M of FIG. 13.

FIG. 14 is an enlarged view schematically illustrating an example of a region M of FIG. 13.

Figure 15:
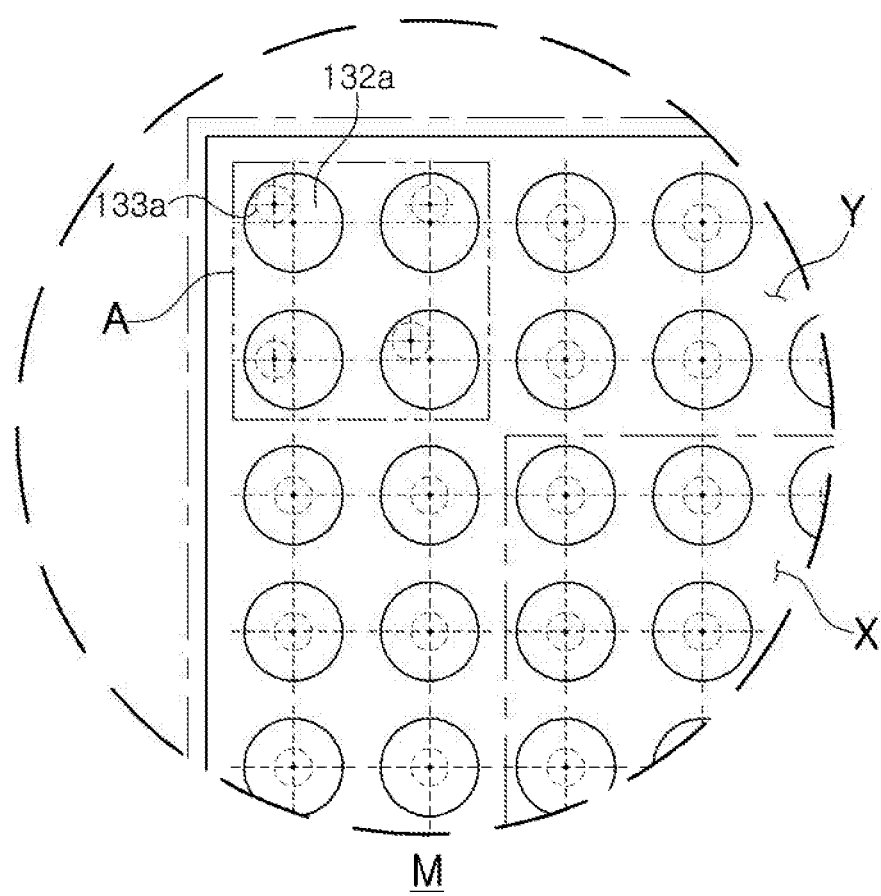
FIG. 15 is an enlarged view schematically illustrating another example of a region M of FIG. 13.

FIG. 15 is an enlarged view schematically illustrating another example of a region M of FIG. 13.

Referring to FIGS. 14 and 15, the first vias 133a disposed in at least the corner portion A of the second region Y may be off the center lines of the first pads 132a toward an outer edge of the semiconductor package 100A by a predetermined distance. In this case, since spring action may be implemented toward the outer edge of the semiconductor package 100A, a stress alleviating effect may be improved, as compared to in a case in which the first vias 133a are off the center lines of the first pads 132a inwardly by a predetermined distance. Here, the meaning of the first via 133a being disposed at the outer edge is that the first via 133a is disposed in three regions except for a region toward an inner portion of the semiconductor package among four regions divided by any two straight lines intersecting at the center line of the first pad 132a, as illustrated in FIG. 14 or FIG. 15. Meanwhile, although not illustrated in FIGS. 8 and 9, the disposition as described above may also be applied to the outermost portion B of the second region Y.

Figure 16:
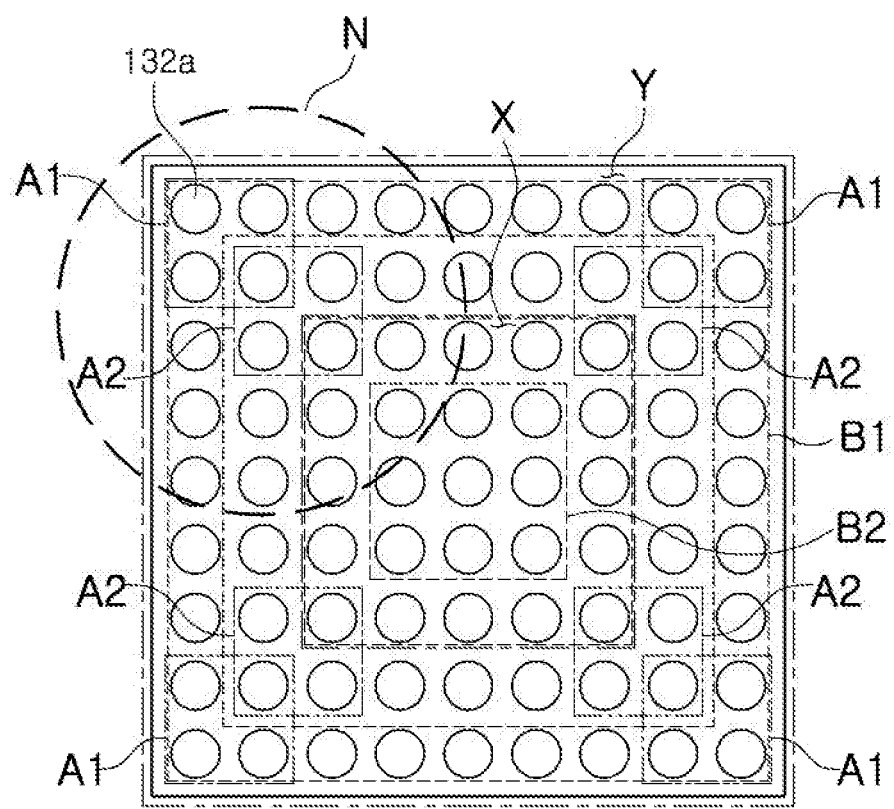
FIG. 16 is a plan view illustrating another example of an array of first pads.

FIG. 16 is a plan view illustrating another example of an array of first pads of a semiconductor package according to an example.

Referring to FIG. 16, in the case in which the semiconductor package 100A is mounted on the main board, the stress may also be concentrated on the first connection terminal 145 in a corner portion of the first region X in which heterogeneous materials such as the encapsulant 110, the electronic component 120, the first connection terminal 145, and the like, meet each other and a portion A2 of the second region Y enclosing the corner portion of the first region X, as well as the corner portion A1 of the second region Y. Therefore, in a case in which the first vias 133a are disposed to be off the center lines of the first and second pads 132a and 132b in any direction by the predetermined distance, as described above, in order to alleviate the stress in at least the corner portion of the first region X and the portion A2 of the second region Y enclosing the corner portion of the first region X, the board level reliability of the semiconductor package 100A may be further improved. However, the stress is not limited to being concentrated in the portions described above, but may also be significantly concentrated in the outermost portion B2 of the first region X as well as the outermost portion B1 of the second region Y. Therefore, in at least the outermost portion B2 of the first region X and/or the outermost portion B1 of the second region Y, as described above, the first vias 133a may be disposed so that the center lines thereof do not coincide with those of the first and second pads 132a and 132b. In this case, the board level reliability may be further improved.

Figure 17:
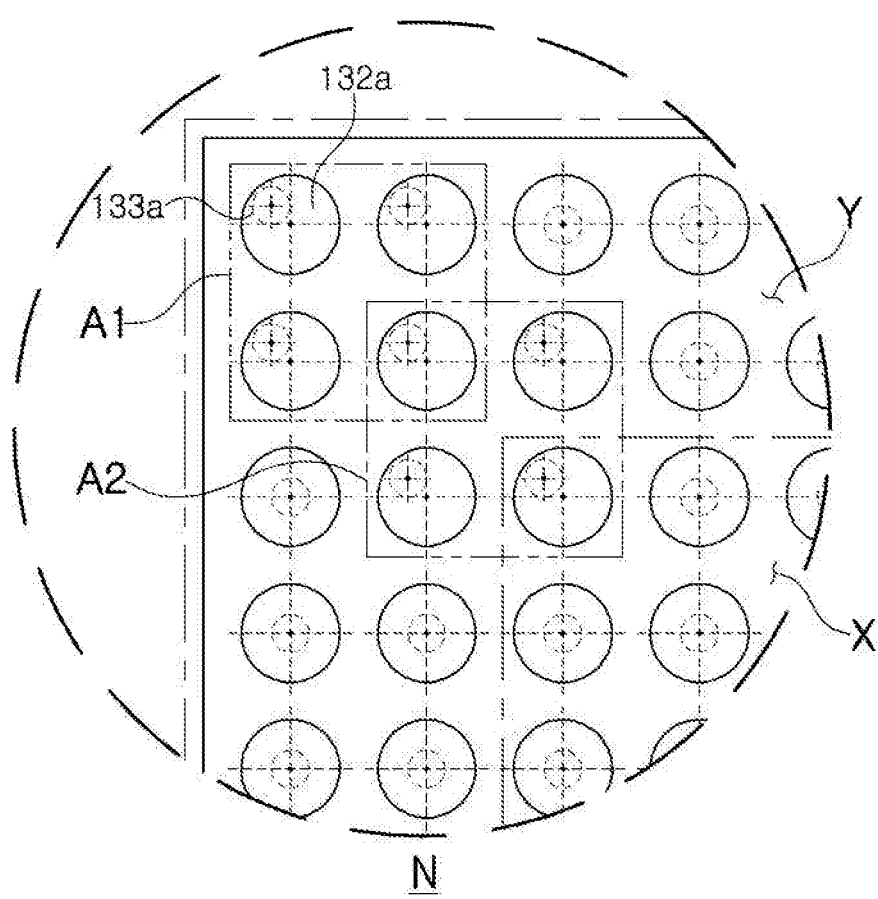
FIG. 17 is an enlarged view schematically illustrating an example of a region N of FIG. 16.

FIG. 17 is an enlarged view schematically illustrating an example of a region N of FIG. 16.

Figure 18:
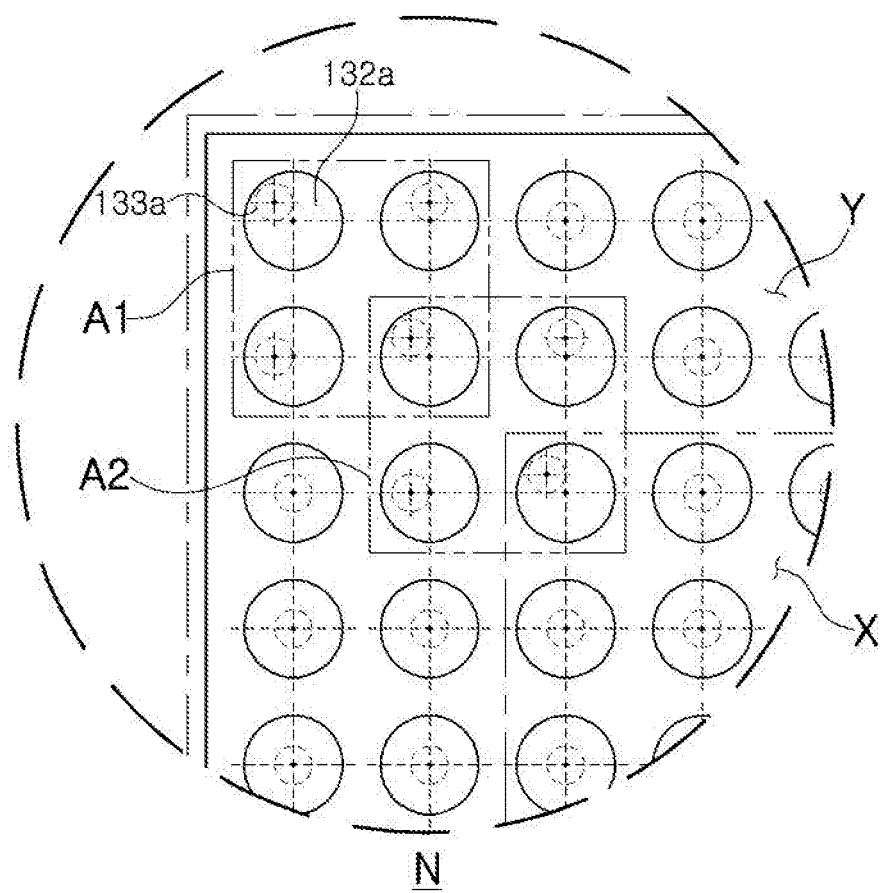
FIG. 18 is an enlarged view schematically illustrating another example of a region N of FIG. 16.

FIG. 18 is an enlarged view schematically illustrating another example of a region N of FIG. 16.

Referring to FIGS. 17 and 18, the first vias 133a disposed in the corner portion of the first region X and the portion A2 of the second region Y enclosing the corner portion of the first region X as well as at least the corner portion A1 of the second region Y may also be disposed to be off the center lines of the first pads 132a toward the outer edge of the semiconductor package 100A by a predetermined distance. Also in this case, since spring action may be implemented toward the outer edge of the semiconductor package 100A, a stress alleviating effect may be improved as compared to in the case in which the first vias 133a are offset toward the inner side by a predetermined distance. Here, the meaning of the first via 133a being disposed at the outer edge is that the first pad 133a is disposed in three regions except for a region toward an inner portion of the semiconductor package among four regions divided by any two straight lines intersecting at the center line of the first pad 132a, as illustrated in FIG. 17 or FIG. 18. Meanwhile, although not illustrated in FIGS. 11 and 12, the disposition as described above may also be applied to the outermost portion B2 of the first region X and/or the outermost portion B1 of the second region Y.

Figure 19A:
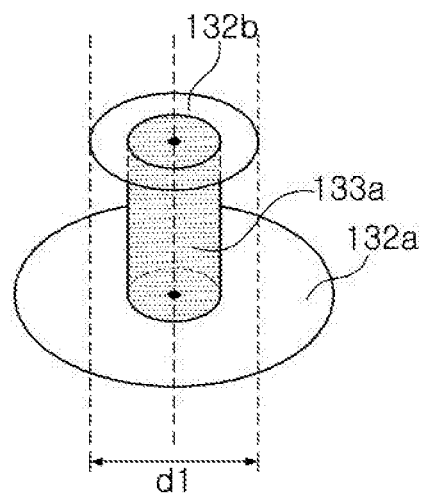
FIGS. 19A through 19C are views schematically illustrating various dispositions of a via and a pad.
Figure 19B:
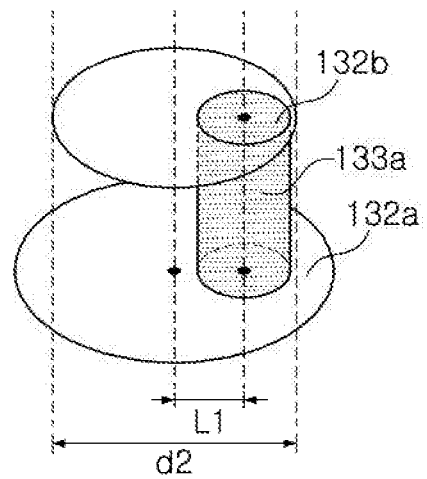
Figure 19C:
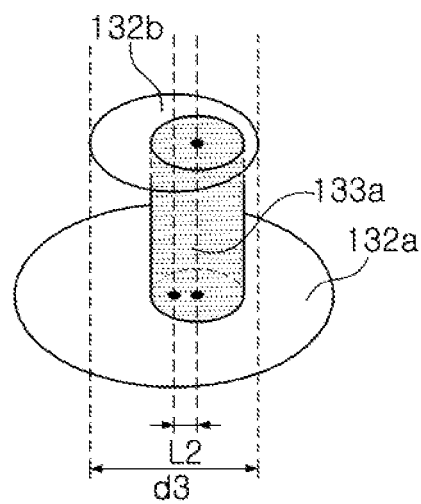

FIGS. 19A through 19C are views schematically illustrating various dispositions of a via and a pad of a semiconductor package according to an example.

FIG. 19A illustrates a case in which the center line of the first via 133a coincides with those of the first and second pads 132a and 132b. This form may be a disposition of the first via 133a and the first and second pads 132a and 132b in the region in which the stress is not relatively concentrated on the first connection terminal 145 when the semiconductor package 100A is mounted on the main board, in the interconnection member 130. In this case, since the second pad 132b may be formed to have a small size (diameter of d1) so as to secure a design area of the first and second wirings 134a and 134b, and the like, disposed on the same layer as large as possible, a degree of design freedom may be improved.

FIG. 19B illustrates a case in which the center line of the first via 133a does not coincide with those of the first and second pads 132a and 132b. In this case, the first via 133a may have a first interval L1 intended by a designer in relation to the center lines of the first and second pads 132a and 132b. This form may be a disposition of the first via 133a and the first and second pads 132a and 132b in regions A1 and/or A2 in which the stress is relatively concentrated on the first connection terminal 145 as described above when the semiconductor package 100A is mounted on the main board, in the interconnection member 130. In this case, as illustrated in FIG. 19B, the second pad 132b may be formed to have a size (diameter of d2) larger than that of second pads 132b of other regions, if necessary, in order to accomplish an excellent stress alleviating effect by further enlarging the first interval L1, but is not necessarily limited thereto.

FIG. 19C illustrates a case in which the center line of the first via 133a is designed to coincide with those of the first and second pads 132a and 132b, but does not coincide with those of the first and second pads 132a and 132b by a predetermined distance due to a limitation in a process. That is, FIG. 19C illustrates a case in which the center line of the first via 133a does not unintentionally coincide with those of the first and second pads 132a and 132b due to the limitation in the process, although the disposition of the FIG. 19A is intended. In this case, the first via 133a may have a second interval L2 unintended by the designer in relation to the center lines of the first and second pads 132a and 132b. However, the second pad 132b may be formed to have a small size (a diameter of d3) so as to secure a design area of the first and second wirings 134a and 134b disposed on the same layer which is as large as possible, and since the second interval L2 is unintended, the second interval L2 may be averagely smaller than the first interval L1 intended by the designer. That is, in the interconnection member 130, in some cases, any second interval L2 may be larger than the first interval L1 when second intervals L2 and first intervals L1 are individually compared with each other. However, an average of the second intervals L2 may be smaller than that of the first intervals L1. Therefore, a sufficient board level reliability improving effect as compared to the first interval L1 intended by the designer may not be realized.

Figure 20:
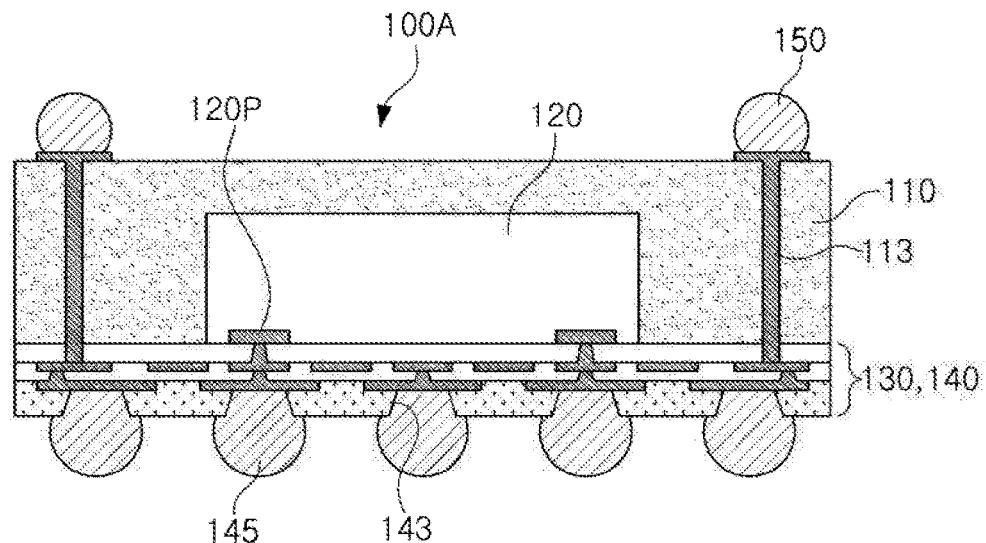
FIG. 20 is a cross-sectional view schematically illustrating a modified example of a semiconductor package.

FIG. 20 is a cross-sectional view schematically illustrating a modified example of a semiconductor package according to an example.

Referring to FIG. 20, a semiconductor package 100A according to an example may be a package-on-package (PoP) type. That is, the semiconductor package 100A according to an example may further include through-wirings 113 penetrating through the encapsulant 110. In addition, the semiconductor package 100A according to an example may further include second connection terminals 150 connected to the through-wirings 113. The other components are the same as the components as described above.

The through-wirings 113 may serve to electrically connect another package, a surface-mounting technology (SMT) component, and the like, and the electrical component 120 to each other when another package, a surface-mounting technology (SMT) component, and the like, are disposed on the semiconductor package 100A. A conductive material such as copper (Cu), aluminum (Al), silver (Ag), tin (Sn), gold (Au), nickel (Ni), lead (Pb), or alloys thereof, or the like, may be used as a material of the through-wiring 113. The number, an interval, a disposition, and the like, of through-wirings 113 are not particularly limited, but may be sufficiently modified depending on design particulars by those skilled in the art. Therefore, a detailed description for the through-wirings 113 will be omitted. The through-wiring 113 may be formed by a known method, for example, mechanical drilling and/or laser drilling, a sand blasting method using polishing particles, a dry etching method using plasma, or may be formed by forming wiring through holes in the encapsulant 110 by a photolithography method and then performing electrolytic copper plating, electroless copper plating, or the like, using a dry film pattern, in a case in which the encapsulant 110 contains the photosensitive material.

The second connection terminals 150 may serve as connection terminals connecting the semiconductor package 100A to another package, and the like, when another package, and the like, is disposed on the semiconductor package 100A. The second connection terminal 150 may be formed of a conductive material, for example, copper (Cu), aluminum (Al), silver (Ag), tin (Sn), gold (Au), nickel (Ni), lead (Pb), solder, or the like, but is not limited thereto. The second connection terminal 150 may be a land, a ball, a pin, or the like. However, the second connection terminal 150 may be generally a solder ball. The second connection terminal 150 may be formed of multiple layers or a single layer. In a case in which the second connection terminal 150 is formed of the multiple layers, the second connection terminal 150 may contain a copper pillar and a solder, and in a case in which the second connection terminal 150 is formed of the single layer, the second connection terminal 150 may contain a tin-silver solder or copper. However, this is only an example, and the second connection terminal 150 is not limited thereto. The second connection terminal 150 may be formed by a process known in the related art, and may be fixed by reflow.

Figure 21:
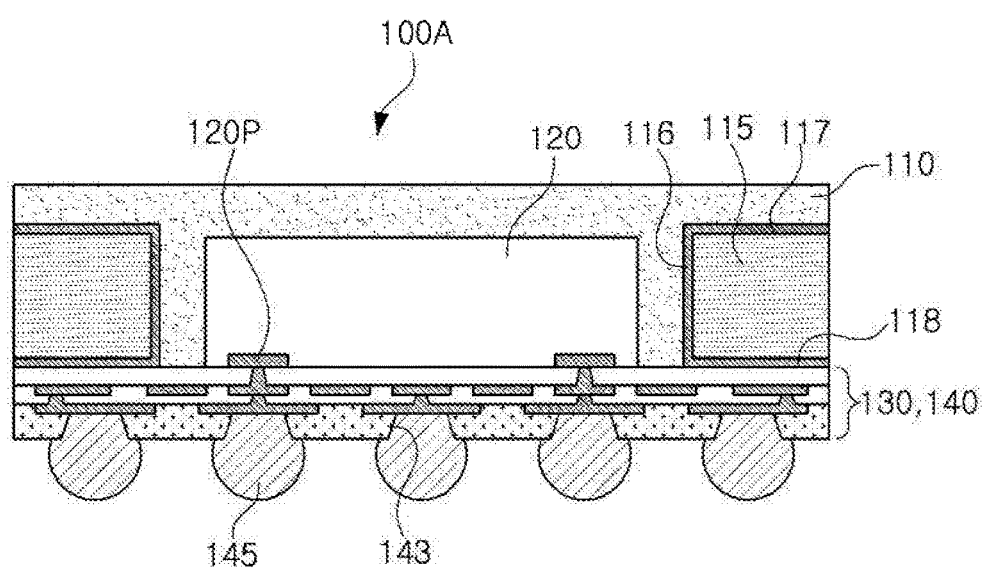
FIG. 21 is a cross-sectional view schematically illustrating another modified example of a semiconductor package.

FIG. 21 is a cross-sectional view schematically illustrating another modified example of a semiconductor package according to an example.

Referring to FIG. 21, a semiconductor package 100A according to an example may be a panel-level-package (PLP) type. That is, the semiconductor package 100A according to an example may further include a second interconnection member 115 disposed on the interconnection member 130 and having a through-hole. Here, the electronic component 120 may be disposed in the through-hole of the second interconnection member 115. Metal layers 116, 117, and 118 may be disposed on an inner surface of the through-hole of the through-hole, an upper surface of the second interconnection member 115, and/or a lower surface of the second interconnection member 115, if necessary. The other components are the same as the components as described above.

The second interconnection member 115 may be provided to support the semiconductor package 100A, and rigidity of the semiconductor package 100A may be maintained and uniformity of a thickness of the semiconductor package 100A may be secured by the second interconnection member. The second interconnection member 115 may have the upper surface and the lower surface opposing the upper surface. Here, the through-hole may penetrate between the upper surface and the lower surface. The electronic component 120 may be disposed in the through-hole so as to be spaced apart from the second interconnection member 115. As a result, the side surfaces of the electronic component 120 may be enclosed by the second interconnection member 115. A material of the second interconnection member 115 is not particularly limited as long as the second interconnection member may support the semiconductor package. For example, an insulating material may be used as a material of the second interconnection member 115. Here, the insulating material may be a thermosetting resin such as an epoxy resin, a thermoplastic resin such as a polyimide resin, a resin having a reinforcing material such as a glass fiber or an inorganic filler impregnated in the thermosetting resin and the thermoplastic resin, for example, prepreg, ABF, FR-4, BT, or the like. Alternatively, a metal having excellent rigidity and thermal conductivity may be used as a material of the second interconnection member 115. Here, the metal may be a Fe—Ni based alloy. In this case, a Cu plating layer may also be formed on a surface of the Fe—Ni based alloy in order to secure adhesion between the Fe—Ni based alloy and a molding material, an interlayer insulating material, or the like. In addition to the materials as described above, glass, ceramic, plastic, or the like, may also be used as a material of the second interconnection member 115. A thickness of the second interconnection member 115 in a cross section thereof is not particularly limited, but may be designed depending on a thickness of the electronic component 120 in a cross section thereof. For example, a thickness of the second interconnection member 115 may be about 100 μm to 500 μm depending on a type of electronic component 120. In a case in which the semiconductor package 100A has the second interconnection member, the semiconductor package 100A may be manufactured by preparing the second interconnection member 115 having the through-hole, disposing the electronic component 120 in the through-hole using an adhesive film, or the like, forming the encapsulant 110, and then forming the interconnection member 130 in a subsequent process. The second interconnection member 115 may be a large frame 115 having a plurality of through-holes for the purpose of mass production of the semiconductor package 100A. In this case, the semiconductor package 100A may also be manufactured by manufacturing a plurality of electronic component packages 100A and then separating the plurality of electronic component packages 100A into individual electronic component packages 100A in a sawing process.

The metal layers 116, 117, and 118 disposed on the inner surface of the through-hole of the second interconnection member 115, the upper surface of the second interconnection member 115, and/or lower surface of the second interconnection member 115, if necessary, may be to improve heat radiation characteristics and/or block electromagnetic waves. A material of the metal layers 116, 117, and 118 is not particularly limited as long as it is a metal having high thermal conductivity, such as copper (Cu), aluminum (Al), silver (Ag), tin (Sn), gold (Au), nickel (Ni), lead (Pb), or alloys thereof, or the like. Heat emitted from the electronic component 120 may be dispersed to an top or a bottom of the second interconnection member 110 through the metal layers 116, 117, and 118 by conduction, radiation, or convection. A method of forming the metal layers 116, 117, and 118 is not particularly limited, but may be a known method. The metal layers 116, 117, and 118 may be formed using electrolytic copper plating or electroless copper plating, more specifically, a method such as CVD, PVD, sputtering, a subtractive process, an additive process, a SAP, a MSAP, or the like, but are not limited thereto.

Figure 22:
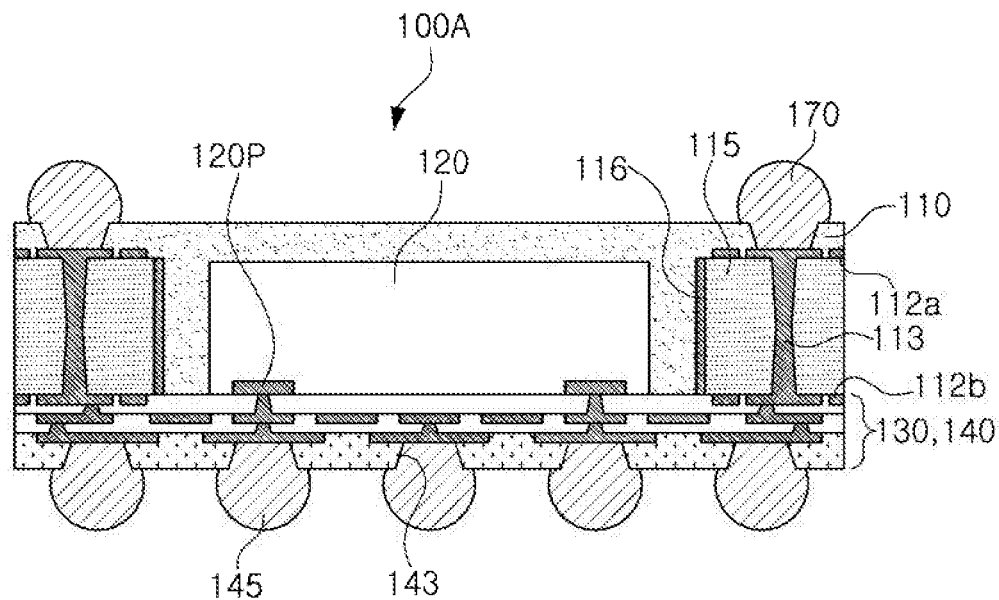
FIG. 22 is a cross-sectional view schematically illustrating another modified example of a semiconductor package.

FIG. 22 is a cross-sectional view schematically illustrating another modified example of a semiconductor package according to an example.

Referring to FIG. 22, a semiconductor package 100A according to an example may be a package-on-package (PoP) type while being a panel-level-package (PLP) type. That is, the semiconductor package 100A according to an example may further include through-wirings 113 penetrating through the second interconnection member 115. Here, various redistribution layers 112a and 112b may be disposed on an upper surface and a lower surface of the second interconnection member 115, and a metal layer 116 may be disposed on an inner surface of the through-hole, if necessary. In addition, the semiconductor package 100A may further include third connection terminals 170 connected to the through-wirings 113. The other components are the same as the components described above.

The through-wirings 113 may only penetrate through the second interconnection member 115, and the number, an interval, a disposition, and the like, of through-wirings 113 are not particularly limited, but may be sufficiently modified depending on design particulars by those skilled in the art. Also in this case, the through-wirings 113 may be formed by a known method as described above. The third connection terminals 170 may be disposed in second openings (not denoted by a reference numeral) formed in an upper surface of the encapsulant 110, and the number, an interval, a disposition, and the like, of third connection terminals 170 are not particularly limited, but may be sufficiently modified depending on design particulars by those skilled in the art. Also in this case, the second openings (not denoted by a reference numeral) and the third connection terminals 170 may be formed by a known method described above.

The various redistribution layers 112a and 112b disposed on the upper surface and the lower surface of the second interconnection member 115 may be wiring and/or pad patterns. Since the redistribution layers may also be formed on the upper surface and the lower surface of the second interconnection member 115, as described above, a wider routing region may be provided to the semiconductor package 100A. As a result, a degree of design freedom of the interconnection member 130 may be further improved. The various redistribution layers 112a and 112b may also be formed by a known method described above. The metal layer 116 disposed on the inner surface of the through-hole of the second interconnection member 115, if necessary, may be to improve heat radiation characteristics and/or block electromagnetic waves. In a case in which the metal layer 116 is only disposed on the inner surface of the through-hole as described above, a heat radiation effect and an electromagnetic wave blocking effect may be sufficiently realized. The metal layer 116 may also be formed by a known method described above.

Figure 23:
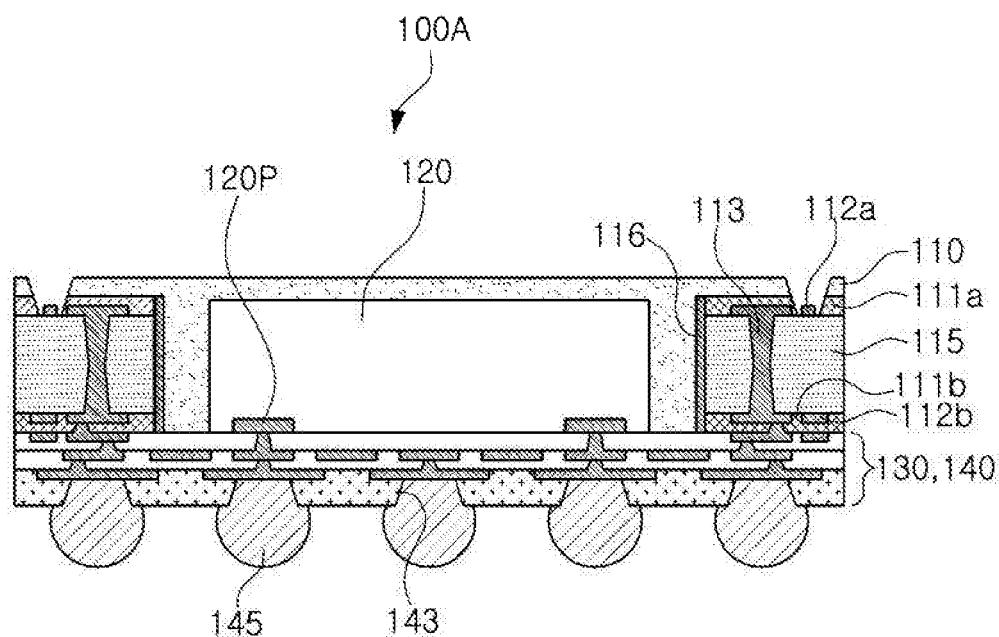
FIG. 23 is a cross-sectional view schematically illustrating another modified example of a semiconductor package.

FIG. 23 is a cross-sectional view schematically illustrating another modified example of a semiconductor package according to an example.

Referring to FIG. 23, a semiconductor package 100A according to an example may be another package-on-package (PoP) type while being a panel-level-package (PLP) type. That is, inner insulating layers 111a and 111b having through-holes integrated with a through-hole of a second interconnection member 115 may be further disposed on an upper surface and/or a lower surface of the second interconnection member 115. A first inner insulating layer 111a may have third openings (not denoted by a reference numeral) formed therein so as to penetrate up to the encapsulant 110, and portions of the redistribution layers 112a may be exposed to the outside through the third openings. The exposed redistribution layers 112a may serve as pads for wire bonding of another electronic component or another electronic component package disposed on the semiconductor package 100A. The other components are the same as the components as described above.

The first and second inner insulating layers 111a and 111b may be to form more redistribution layers before the electronic component 120 is disposed. As the numbers of first and second inner insulating layers 111a and 111b are increased, more redistribution layers may be formed on the corresponding layers, such that the number of layers in the interconnection member 130 may be decreased. As a result, the probability that the electronic component 120 will be discarded due to a defect occurring in a process of forming the interconnection member 130 after the electronic component 120 is disposed may be decreased. That is, a problem that a yield is decreased due to a process defect after the electronic component 120 is disposed may be prevented. Through-holes penetrating through the first and second inner insulating layers 111a and 111b may also be formed in the first and second inner insulating layers 111a and 111b, and may be integrated with the through-hole penetrating through the second interconnection member 115. In this case, the electronic component 120 may be disposed in the integrated through-hole. Various patterns and vias (not denoted by a reference numeral) may also be formed on the first and second inner insulating layers 111a and 111b. A method of forming the patterns and the vias is the same as the method described above.

An insulating material may be used as materials of the first and second inner insulating layers 111a and 111b. Here, the insulating material may be a thermosetting resin such as an epoxy resin, a thermoplastic resin such as a polyimide resin, a resin having a reinforcing material such as a glass fiber or an inorganic filler impregnated in the thermosetting resin and the thermoplastic resin, for example, prepreg, ABF, FR-4, BT, or the like. In a case in which a photosensitive insulating material such as a photosensitive insulating resin is used as materials of the first and second inner insulating layers 111a and 111b, the first and second inner insulating layers 111a and 111b may be formed at a reduced thickness, and a fine pitch may be easily implemented. The first and second inner insulating layers 111a and 111b may contain the same insulating material or different insulating materials. In addition, the first and second inner insulating layers 111a and 111b may have approximately the same thickness or different thicknesses. In a case in which materials of the first and second inner insulating layers 111a and 111b are the same as each other, thicknesses of the first and second inner insulating layers 111a and 111b are approximately the same as each other, and the numbers of first and second inner insulating layers 111a and 111b are the same as each other, the first and second inner insulating layers 111a and 111b may be symmetrical to each other in relation to the second interconnection member 115, which may facilitate controlling warpage.

Figure 24:
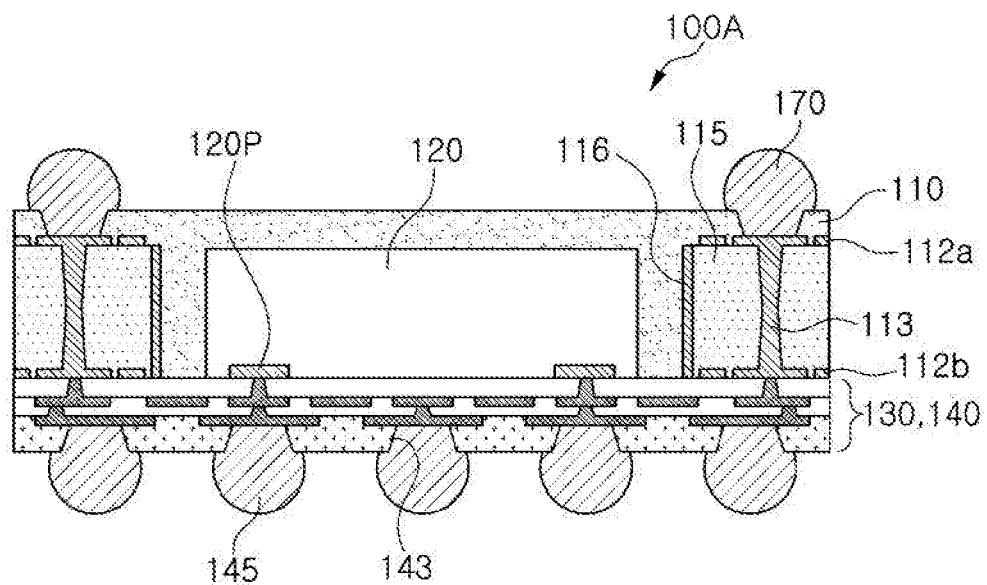
FIG. 24 is a cross-sectional view schematically illustrating another modified example of a semiconductor package.

FIG. 24 is a cross-sectional view schematically illustrating a modified example of a semiconductor package according to an example.

Referring to FIG. 24, a redistribution layer 112b formed on a lower surface of an interconnection member 115 may be embedded in the interconnection member 115 so that one surface thereof is exposed. In this case, a thickness of the redistribution layer 112b formed on the lower surface of the interconnection member 115 may be ignorable. Therefore, a fine pitch may be implemented. The other components are the same as the components as described above.

Figure 25:
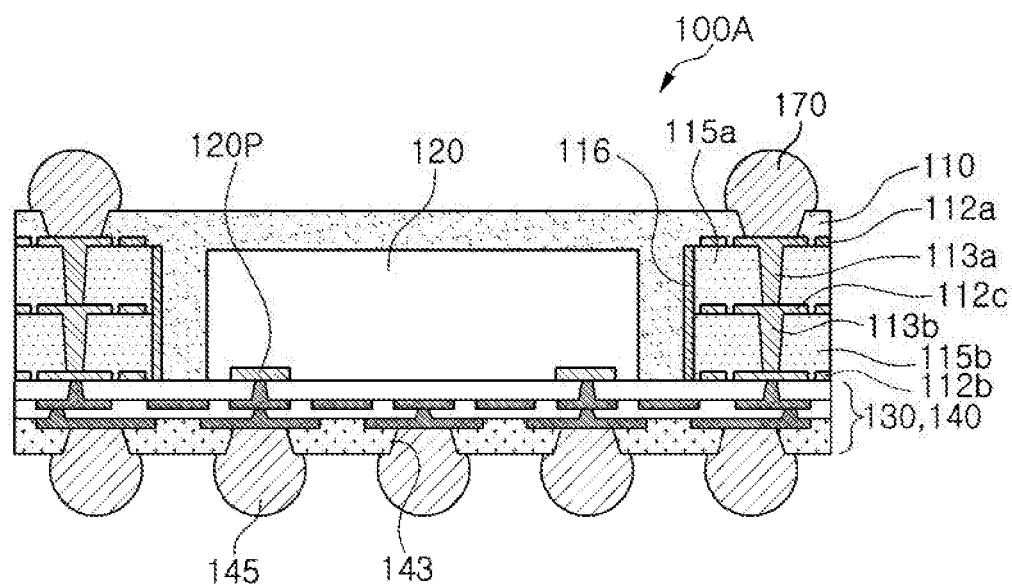
FIG. 25 is a cross-sectional view schematically illustrating another modified example of a semiconductor package.

FIG. 25 is a cross-sectional view schematically illustrating a modified example of a semiconductor package according to an example.

Referring to FIG. 25, interconnection members 115a and 115b may be formed of multiple layers. In this case, a redistribution layer 112c may also be disposed in the interconnection members 115a and 115b. The redistribution layer 112c disposed in the interconnection members 115a and 115b may be electrically connected to redistribution layers 112a and 112b disposed at both sides of the interconnection members 115a and 115b through vias 113a and 113b. In this case, the number of layers of the interconnection member 130 may be reduced. In addition, a degree of freedom of a design of the interconnection member 130 may be increased. Further, a process defect occurring at the time of manufacturing the interconnection member 130 may be reduced, and thus a yield may be improved. The other components are the same as the components as described above.

Figure 26:
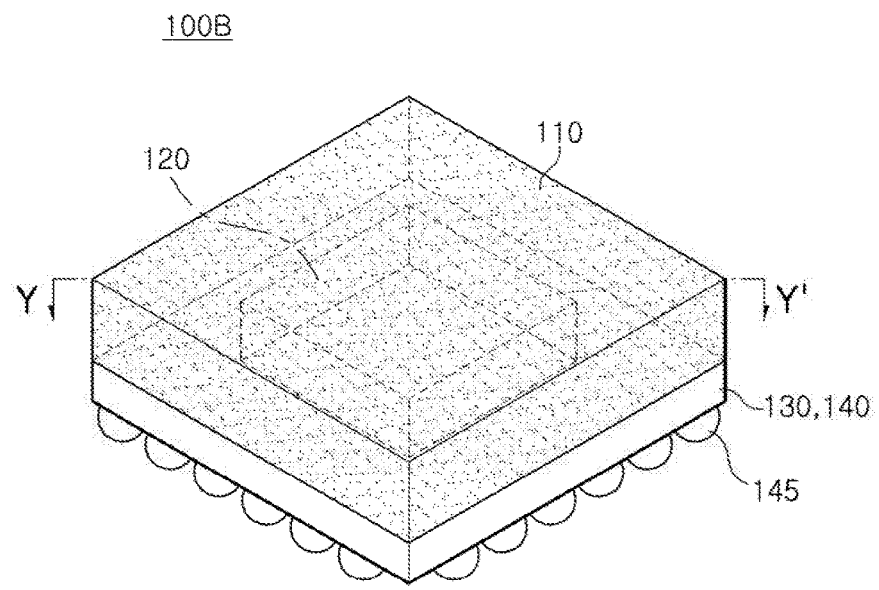
FIG. 26 is a perspective view schematically illustrating another example of a semiconductor package.

FIG. 26 is a perspective view schematically illustrating another example of a semiconductor package.

Figure 27:
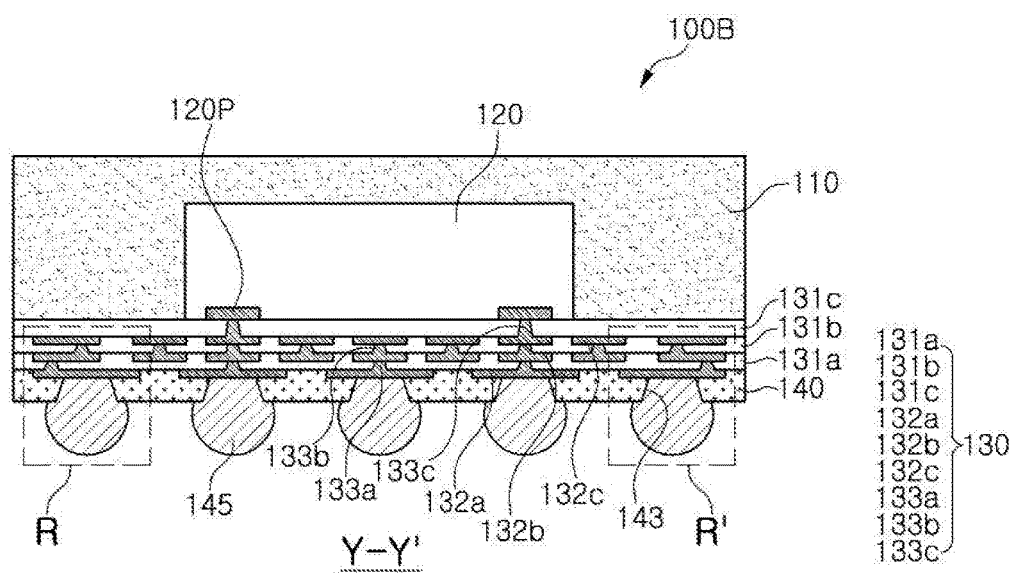
FIG. 27 is a schematic cross-sectional view of the semiconductor package taken along line Y-Y' of FIG. 26.

FIG. 27 is a schematic cross-sectional view of the semiconductor package taken along line Y-Y' of FIG. 26.

Figure 28A:
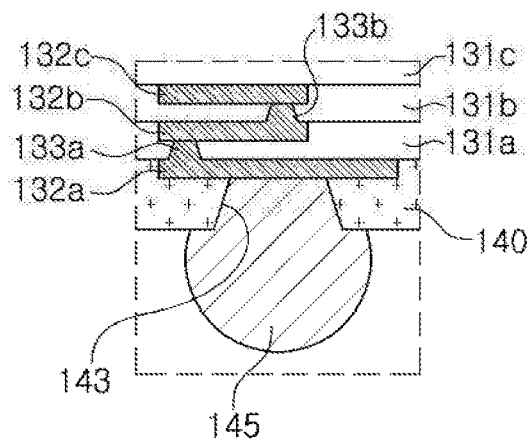
FIGS. 28A through 28C are enlarged views schematically illustrating an example of a region R or R' of FIG. 27.
Figure 28B:
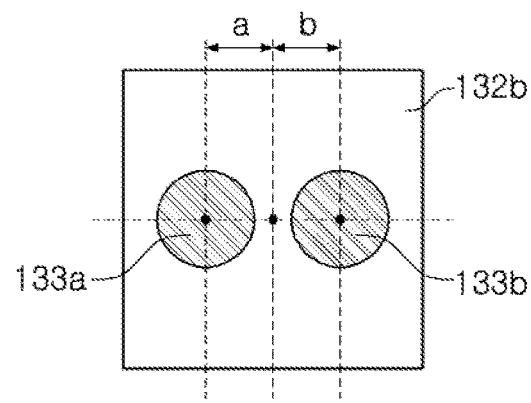
Figure 28C:
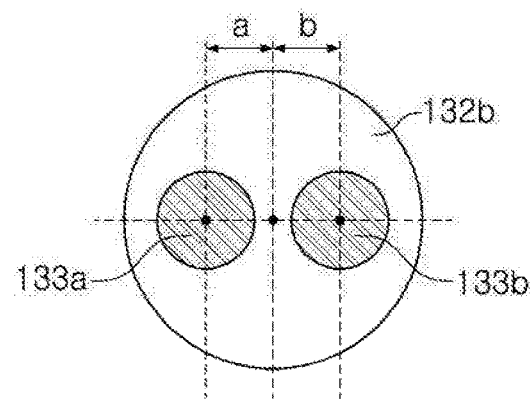

FIGS. 28A through 28C are enlarged views schematically illustrating an example of a region R or R' of FIG. 27.

Figure 29A:
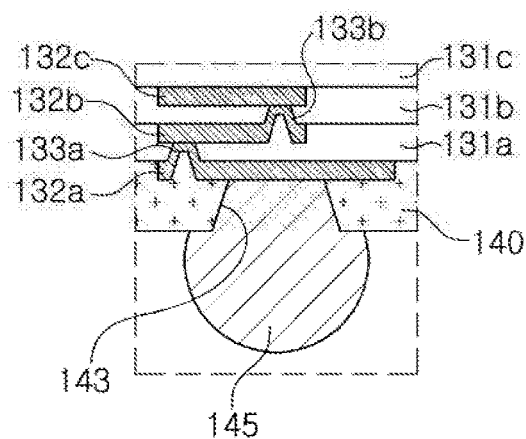
FIGS. 29A through 29C are enlarged views schematically illustrating another example of a region R or R' of FIG. 27.
Figure 29B:
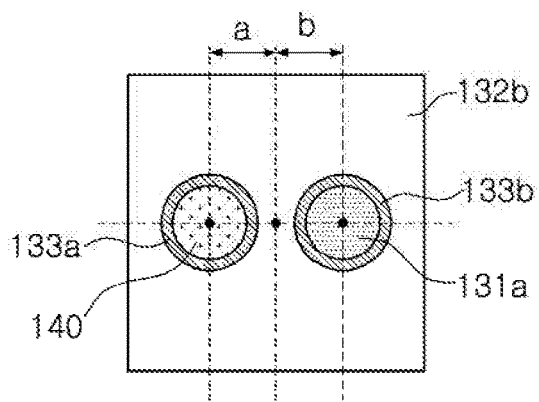
Figure 29C:
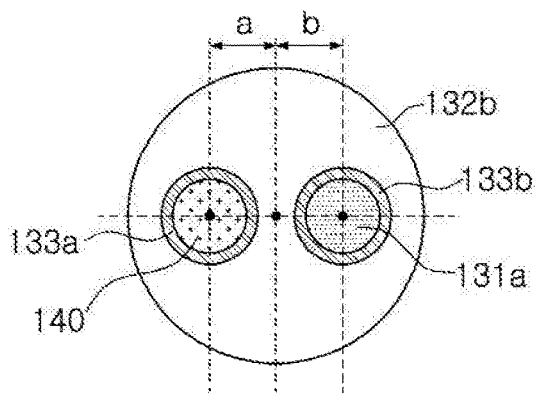

FIGS. 29A through 29C are enlarged views schematically illustrating another example of a region R or R' of FIG. 27.

Figure 30A:
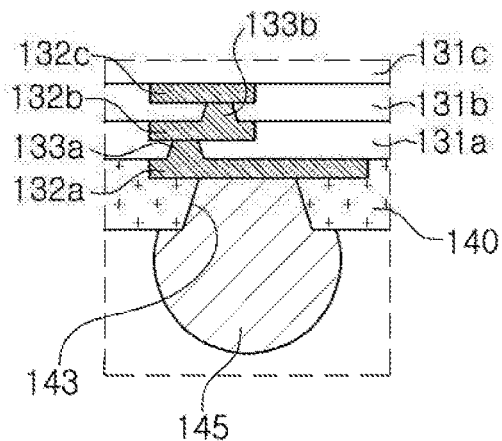
FIGS. 30A through 30C are enlarged views schematically illustrating another example of a region R or R' of FIG. 27.
Figure 30B:
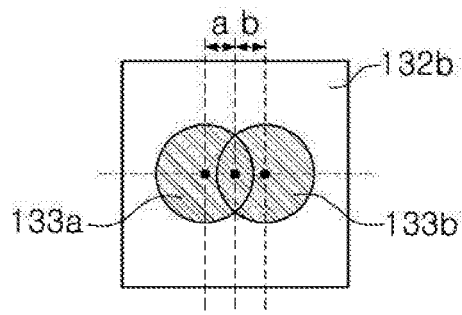
Figure 30C:
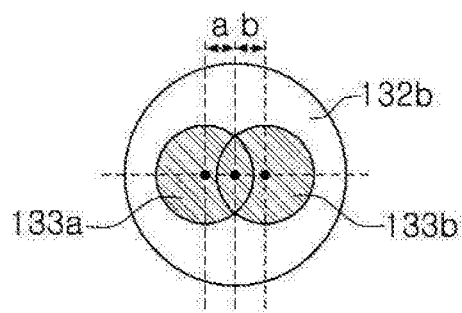

FIGS. 30A through 30C are enlarged views schematically illustrating another example of a region R or R' of FIG. 27.

Figure 31A:
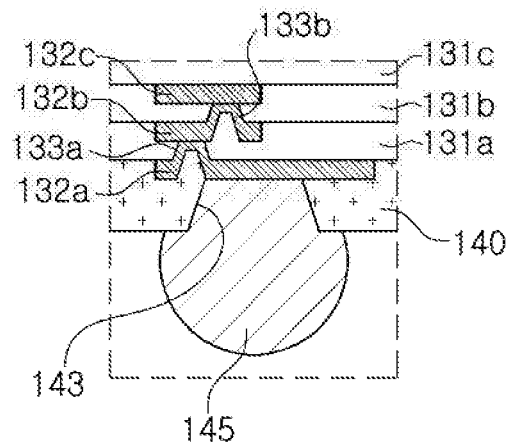
FIGS. 31A through 31C are enlarged views schematically illustrating another example of a region R or R' of FIG. 27.
Figure 31B:
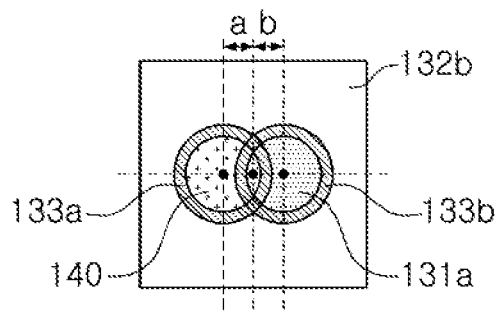
Figure 31C:
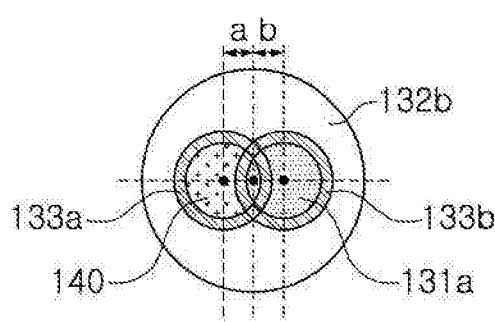

FIGS. 31A through 31C are enlarged views schematically illustrating another example of a region R or R' of FIG. 27.

Referring to FIGS. 26 through 31C, a semiconductor package 100B according to another example may include an interconnection member 130, an electronic component 120 disposed on the interconnection member 130, and an encapsulant 110 encapsulating the electronic component 120. Here, first and second vias 133a and 133b formed in the first and second insulating layers 131a and 131b of at least regions R and/or R' of the interconnection member 130 may be disposed between the first and second vias 133a and 133b, and may be disposed to be off the center lines of the second pads 132b connected to the first and second vias 133a and 133b by a predetermined distance in different directions. That is, the center lines of the first and second vias 133a and 133b and the center line of the second pad 132b may not coincide with each other. As a result, the first and second vias 133a and 133b may be disposed in a form in which they are staggered.

As in the semiconductor package 100B according to another example, also in a case in which the first and second vias 133a and 133b formed in different first and second insulating layers 131a and 131b of at least regions R and/or R of the interconnection member 130 in which stress is significantly concentrated are disposed to be off the center lines of the second pads 132b disposed between the first and second insulating layers 131a and 131b in different directions by a predetermined distance, the first and second vias 133a and 133b and the first and second pads 132a and 132b may serve as a type of spring. Therefore, stress concentrated on a connection terminal, for example, a solder ball, may be alleviated. Therefore, board level reliability of the semiconductor package may be improved. The disposition as described above is not limited to being applied to only regions R and/or R', but may also be applied to regions of the interconnection member 130 other than regions R and/or R'. In addition, the disposition described above may also be applied to relationships among the second vias 133b formed in the second insulating layer 131b, the third vias 133c formed in the third insulating layer 131c, the third pads 132c disposed between the second and third insulating layers 131b and 131c.

Hereinafter, respective components included in the semiconductor package 100B according to another example will be described in more detail, and a description of contents overlapped with the contents described above will be omitted.

Intervals a and b of the first and second vias 133a and 133b from the center line of the second pad 132b may be the same as or different from each other. However, the first and second vias 133a and 133b need to be located in at least different directions with respect to the center line of the second pad 132b, but may be disposed in a staggered form. Here, the first and second vias 133a and 133b may be sufficiently off from the center line of the second pad 132b so as not to be overlapped with each other, as illustrated in FIGS. 28A through 28C or FIGS. 29A through 29C. However, the first and second vias 133a and 133b may also be off the center line of the second pad 132b to be partially overlapped with each other, as illustrated in FIGS. 30A through 30C or FIGS. 31A through 31C, depending on a size of the second pads 132b or sizes of the first and second vias 133a and 133b. In addition, a via may be completely filled with a conductive material, as illustrated in FIGS. 28A through 28C or FIGS. 30A through 30C. Alternatively, in some cases, a conductive material may also be formed along a wall of a via hole, as illustrated in FIGS. 29A through 29C or FIGS. 31A through 31C. Also in these various forms, a stress alleviating effect may be realized as long as the first and second vias 133a and 133b may be disposed in the staggered form.

A shape of the second pad 132b when viewed from above is not particularly limited, but may be a rectangular shape as illustrated in FIGS. 28B, 29B, 30B, and 31B or circular shapes as illustrated in FIGS. 28C, 29C, 30C, and 31C. Alternatively, a shape of the second pad 132b when viewed from above may also be an oval shape, unlike illustrated in the drawings. A size of the second pad 132b is also not particularly limited. In a case in which the second pad 132b is relatively larger than second pads 132b disposed in other regions of the interconnection member 130, intervals of the first and second vias 133a and 133b from the center line of the second pad 132b may be sufficiently secured. Therefore, it may be advantageous in terms of a stress dispersing effect that the second pad 132b is relatively larger than the second pads 132b disposed in other regions of the interconnection member 130.

Figure 32A:
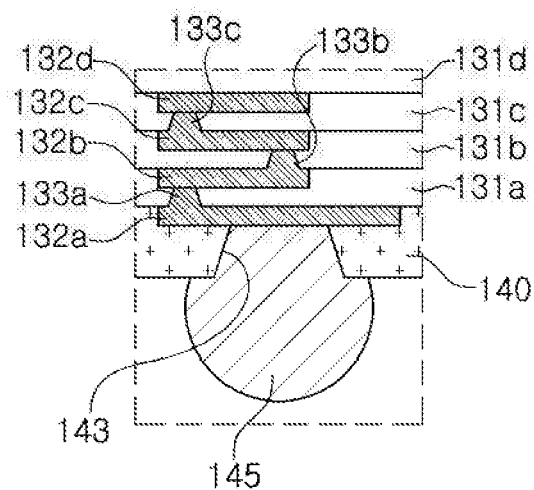
FIGS. 32A through 32C are enlarged views schematically illustrating another example of a region R or R' of FIG. 27.
Figure 32B:
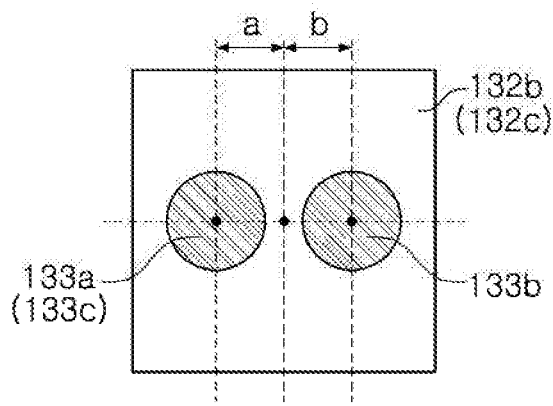
Figure 32C:
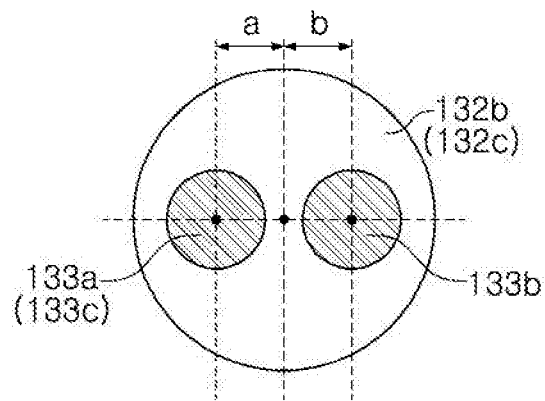

FIGS. 32A through 32C are enlarged views schematically illustrating another example of a region R or R' of FIG. 27.

Figure 33A:
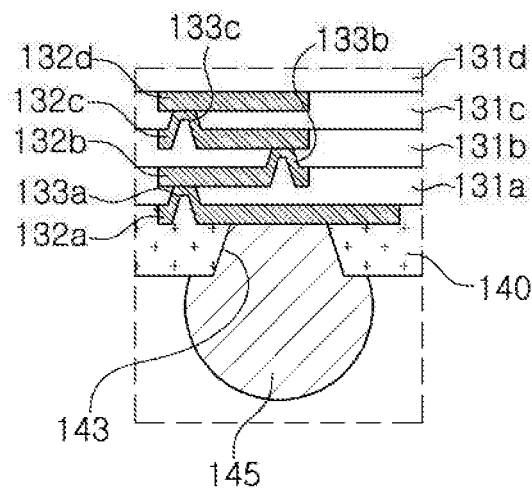
FIGS. 33A through 33C are enlarged views schematically illustrating another example of a region R or R' of FIG. 27.
Figure 33B:
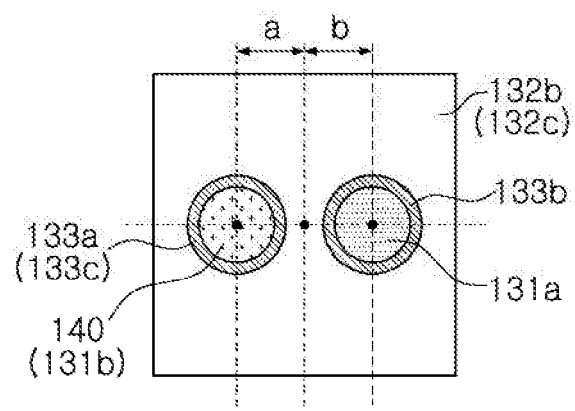
Figure 33C:
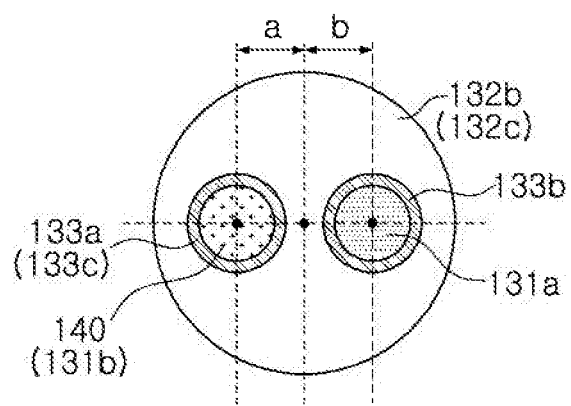

FIGS. 33A through 33C are enlarged views schematically illustrating another example of a region R or R' of FIG. 27.

Figure 34A:
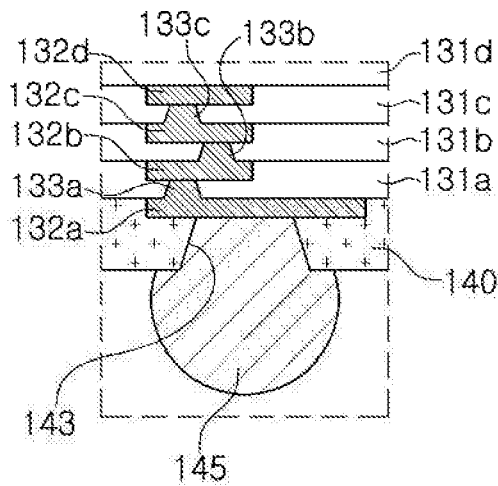
FIGS. 34A through 34C are enlarged views schematically illustrating another example of a region R or R' of FIG. 27.
Figure 34B:
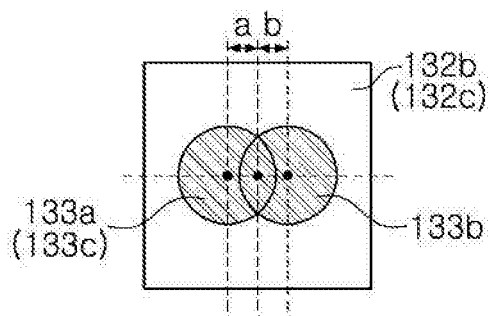
Figure 34C:
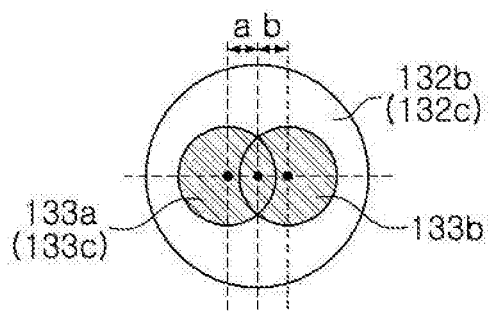

FIGS. 34A through 34C are enlarged views schematically illustrating another example of a region R or R' of FIG. 27.

Figure 35A:
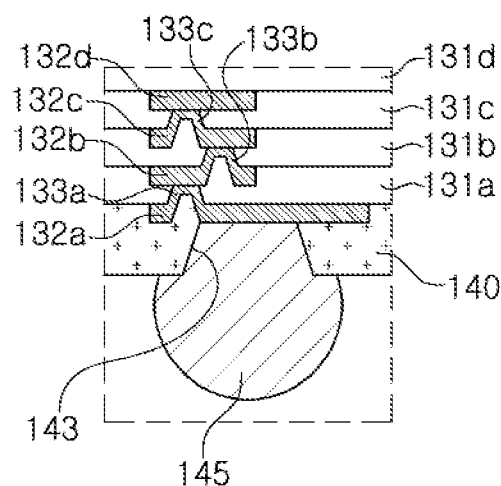
FIGS. 35A through 35C are enlarged views schematically illustrating another example of a region R or R' of FIG. 27.
Figure 35B:
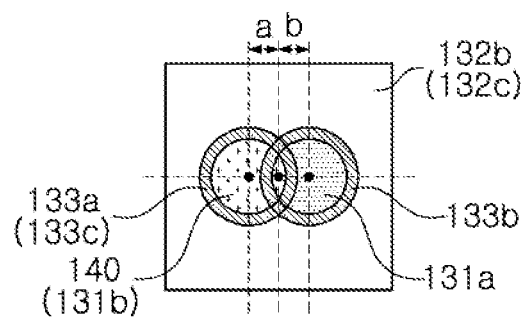
Figure 35C:
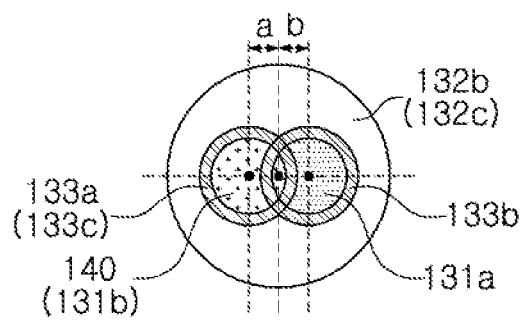

FIGS. 35A through 35C are enlarged views schematically illustrating another example of a region R or R' of FIG. 27.

Referring to FIGS. 32A through 35C, the interconnection member 130 may include first to fourth insulating layers 131a, 131b, 131c, and 131d, which are more layers. Therefore, vias and pads may also include first to third vias 133a, 133b, and 133c, and first to fourth pads 132a, 132b, 132c, and 132d. Here, the first and second vias 133a and 133b may be disposed to be off the center line of the second pad 132b by a predetermined distance in different directions. In addition, the second and third vias 133b and 133c may be disposed to be off the center line of the third pad 132c by a predetermined distance in different directions. Meanwhile, the first and third vias 133a and 133c may be disposed to be off the center lines of the second pad 132b and the third pad 132c by a predetermined distance in the same direction. As a result, the first to third vias 133a, 133b, and 133c may be disposed in a staggered form, more specifically, a zigzag pattern in a thickness direction.

Intervals a and b of the first to third vias 133a, 133b, and 133c from the center lines of the second pad 132b and the third pad 132c may be the same as or different from each other. Here, the first and second vias 133a and 133b and the second and third vias 133b and 133c may be sufficiently off the center lines of the second pad 132b and the third pad 132c so as not to be overlapped with each other, as illustrated in FIGS. 32A through 32C or FIGS. 33A through 33C. Alternatively, the first and second vias 133a and 133b and the second and third vias 133b and 133c may also be off the center lines of the second pad 132b and the third pad 132c to be partially overlapped with each other, as illustrated in FIGS. 34A through 34C or FIGS. 35A through 35C, depending on sizes of the second and third pads 132b and 132c or sizes of the first to third vias 133a, 133b, and 133c. In addition, a via may be completely filled with a conductive material, as illustrated in FIGS. 32A through 32C or FIGS. 34A through 34C. Alternatively, in some cases, a conductive material may also be formed along a wall of a via hole, as illustrated in FIGS. 33A through 33C or FIGS. 35A through 35C. Also in these various forms, a stress alleviating effect may be realized as long as the first and second vias 133a and 133b may be disposed in the zigzag pattern.

Shapes of the second and third pads 132b and 132c when viewed from above are not particularly limited, but may be a rectangular shape as illustrated in FIGS. 32B, 33B, 34, and 35B or a circular shapes as illustrated in FIGS. 32C, 33C, 34C, and 35C. Alternatively, shapes of the second and third pads 132b and 132c when viewed from above may also be an oval shape, unlike that illustrated in the drawings. Sizes of the second and third pads 132b and 132c are also not particularly limited. In a case in which the second and third pads 132b and 132c are relatively larger than second and third pads 132b and 132c disposed in other regions of the interconnection member 130, intervals of the first to third vias 133a, 133b, and 133c from the center lines of the second pad 132b and the third pad 132c may be sufficiently secured. Therefore, it may be advantageous in terms of a stress dispersing effect that the second and third pads 132b and 132c are relatively larger than the second and third pads 132b and 132c disposed in other regions of the interconnection member 130.

Figure 36A:
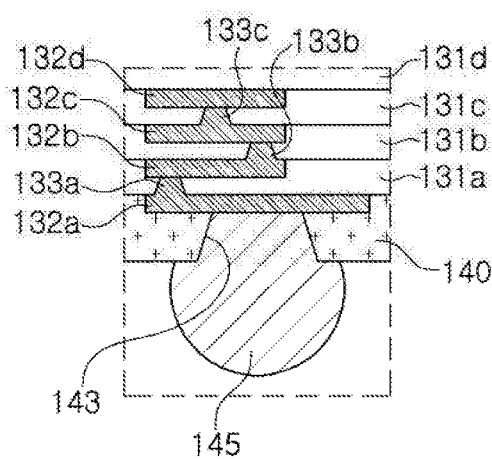
FIGS. 36A through 36C are enlarged views schematically illustrating another example of a region R or R' of FIG. 27.
Figure 36B:
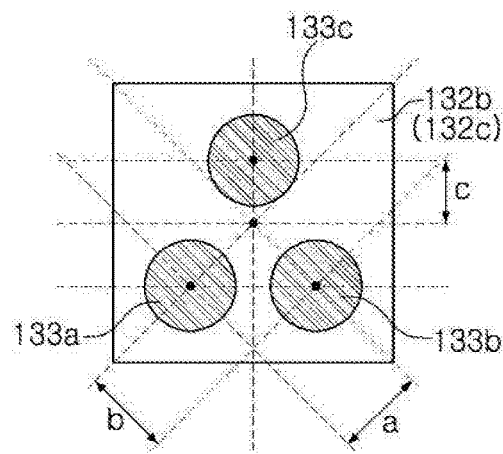
Figure 36C:
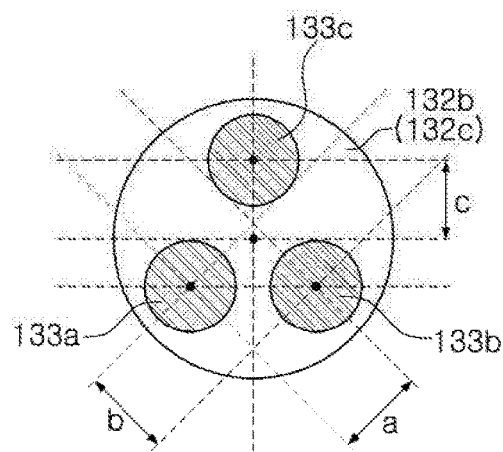

FIGS. 36A through 36C are enlarged views schematically illustrating another example of a region R or R' of FIG. 27.

Figure 37A:
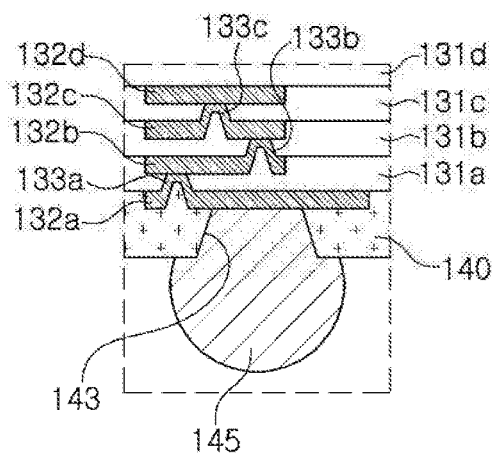
FIGS. 37A through 37C are enlarged views schematically illustrating another example of a region R or R' of FIG. 27.
Figure 37B:
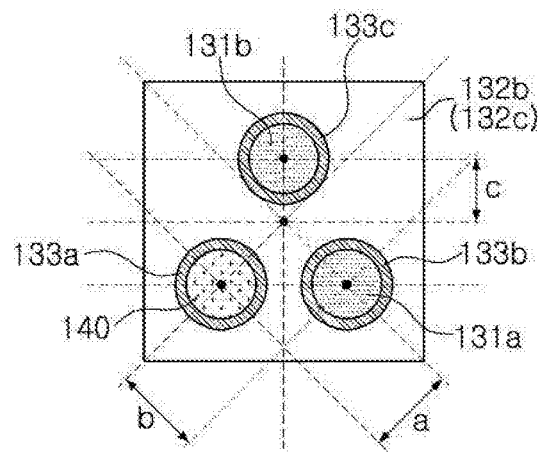
Figure 37C:
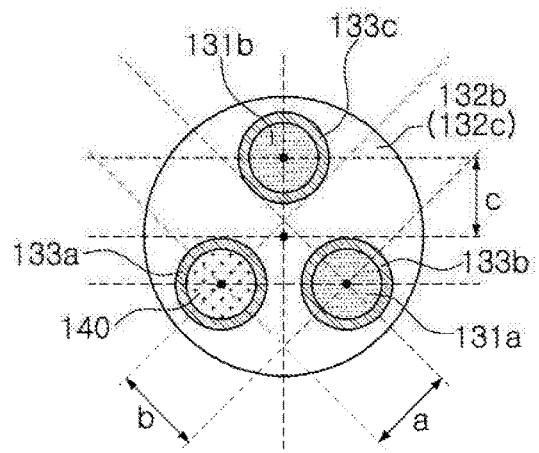

FIGS. 37A through 37C are enlarged views schematically illustrating another example of a region R or R' of FIG. 27.

Figure 38A:
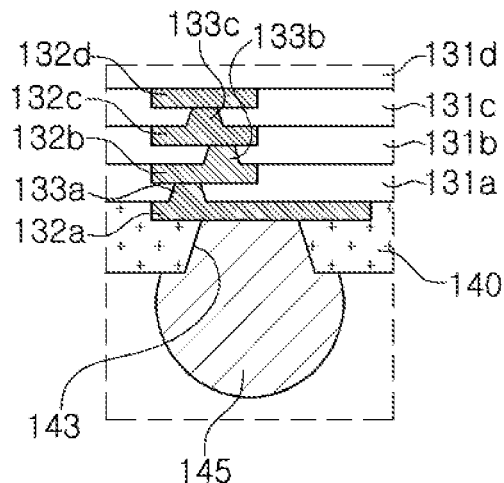
FIGS. 38A through 38C are enlarged views schematically illustrating another example of a region R or R' of FIG. 27.
Figure 38B:
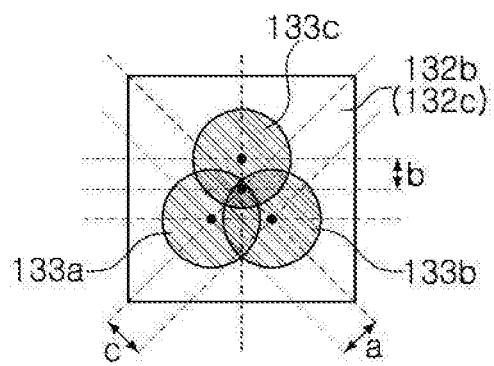
Figure 38C:
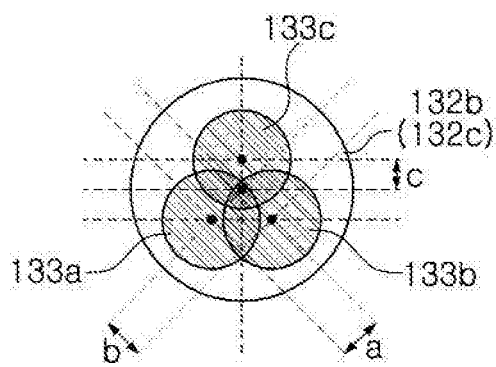

FIGS. 38A through 38C are enlarged views schematically illustrating another example of a region R or R' of FIG. 27.

Figure 39A:
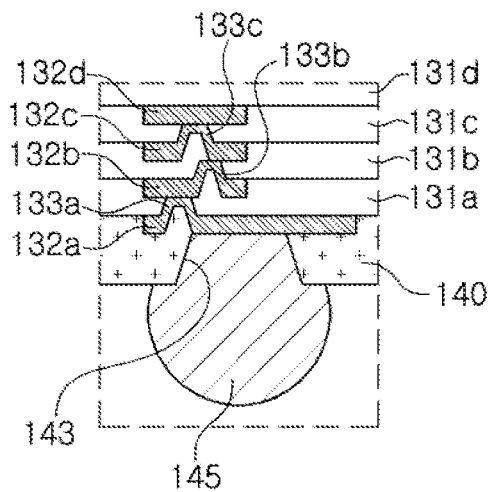
FIGS. 39A through 39C are enlarged views schematically illustrating another example of a region R or R' of FIG. 27.
Figure 39B:
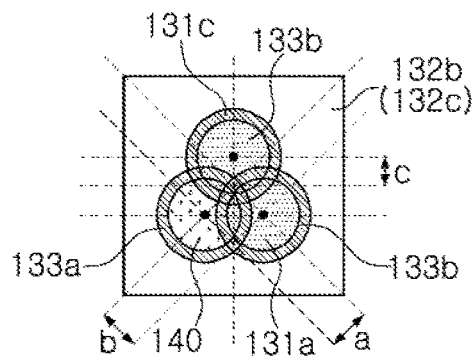
Figure 39C:
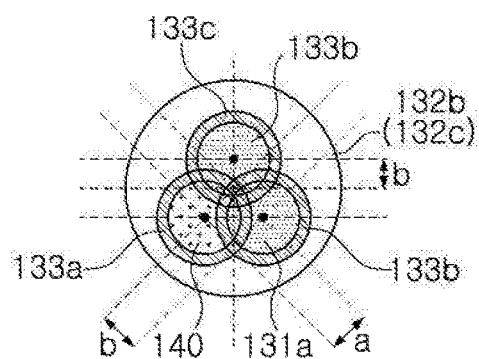

FIGS. 39A through 39C are enlarged views schematically illustrating another example of a region R or R' of FIG. 27.

Referring to FIGS. 36A through 39C, the interconnection member 130 may also include first to fourth insulating layers 131a, 131b, 131c, and 131d, which are more layers. Therefore, vias and pads may also include first to third vias 133a, 133b, and 133c, and first to fourth pads 132a, 132b, 132c, and 132d. In addition, all of the first to third vias 133a, 133b, and 133c may be disposed to be off the center lines of the second and third pads 132b and 132c by a predetermined distance in different directions. As a result, the first to third vias 133a, 133b, and 133c may be disposed in the staggered form, more specifically, a spiral form.

Intervals a, b, and c of the first to third vias 133a, 133b, and 133c may be the same as or different from each other. However, the first to third vias 133a, 133b, and 133c need to be off the center lines of the second and third pads 132b and 132c in at least different directions, but may be disposed in the spiral form. Here, the first to third vias 133a, 133b, and 133c may be sufficiently off the center lines of the second and third pads 132b and 132c so as not to be overlapped with each other, as illustrated in FIGS. 36A through 36C or FIGS. 37A through 37C. However, the first to third vias 133a, 133b, and 133c may also be off the center lines of the second and third pads 132b and 132c to be partially overlapped with each other, as illustrated in FIGS. 38A through 38C or FIGS. 39A through 39C, depending on sizes of the second and third pads 132b and 132c or sizes of the first to third vias 133a, 133b, and 133c. In addition, a via may be completely filled with a conductive material, as illustrated in FIGS. 36A through 36C or FIGS. 38A through 38C. Alternatively, in some cases, a conductive material may also be formed along a wall of a via hole, as illustrated in FIGS. 37A through 37C or FIGS. 39A through 39C. Also in these various forms, a stress alleviating effect may be realized as long as the first to third vias 133a, 133b, and 133c may be disposed in the spiral form.

Shapes of the second and third pads 132b and 132c when viewed from above are not particularly limited, but may be a rectangular shape as illustrated in FIGS. 36B, 37B, 38B, and 39B or a circular shapes as illustrated in FIGS. 36C, 37C, 38C, and 39C. Alternatively, shapes of the second and third pads 132b and 132c when viewed from above may also be an oval shape, unlike illustrated in the drawings. Sizes of the second and third pads 132b and 132c are also not particularly limited. In a case in which the second and third pads 132b and 132c are relatively larger than second and third pads 132b and 132c disposed in other regions of the interconnection member 130, intervals of the first to third vias 133a, 133b, and 133c from the center lines of the second and third pads 132b and 132c may be sufficiently secured. Therefore, it may be advantageous in terms of a stress dispersing effect that the second and third pads 132b and 132c are relatively larger than the second and third pads 132b and 132c disposed in other regions of the interconnection member 130.

Figure 40A:
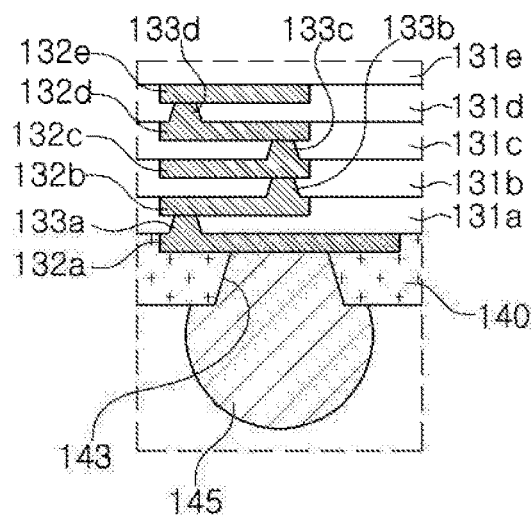
FIGS. 40A through 40C are enlarged views schematically illustrating another example of a region R or R' of FIG. 27.
Figure 40B:
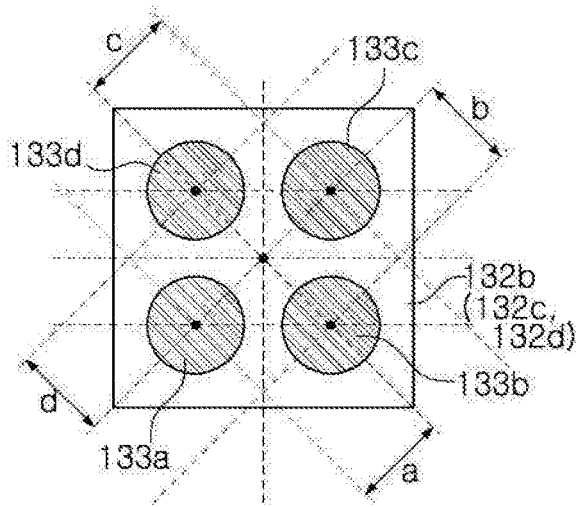
Figure 40C:
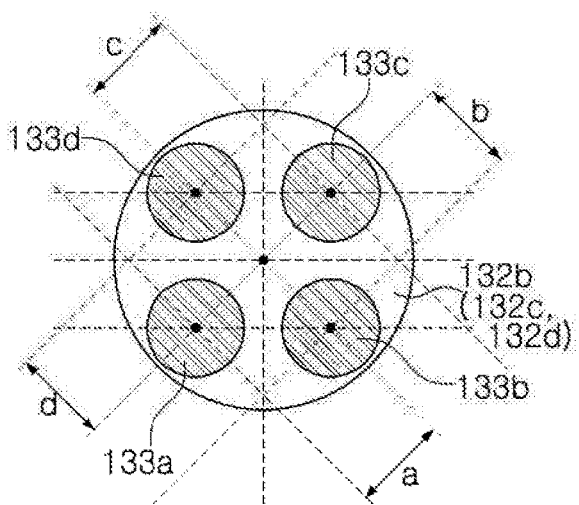

FIGS. 40A through 40C are enlarged views schematically illustrating another example of a region R or R' of FIG. 27.

Figure 41A:
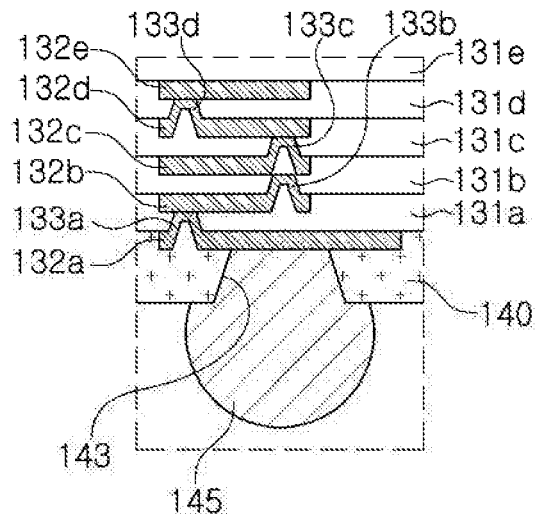
FIGS. 41A through 41C are enlarged views schematically illustrating another example of a region R or R' of FIG. 27.
Figure 41B:
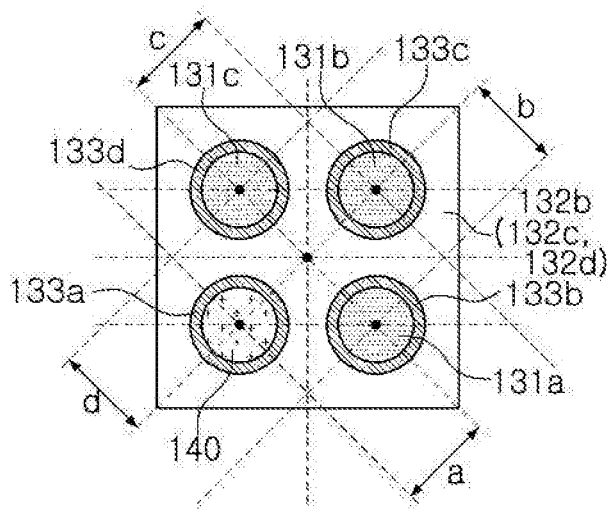
Figure 41C:
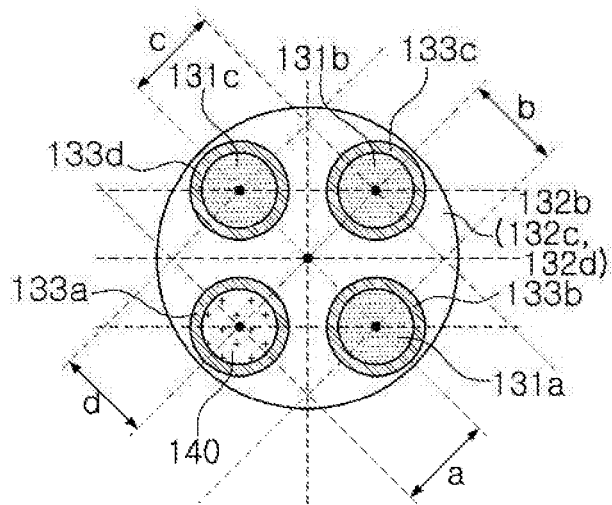

FIGS. 41A through 41C are enlarged views schematically illustrating another example of a region R or R' of FIG. 27.

Figure 42A:
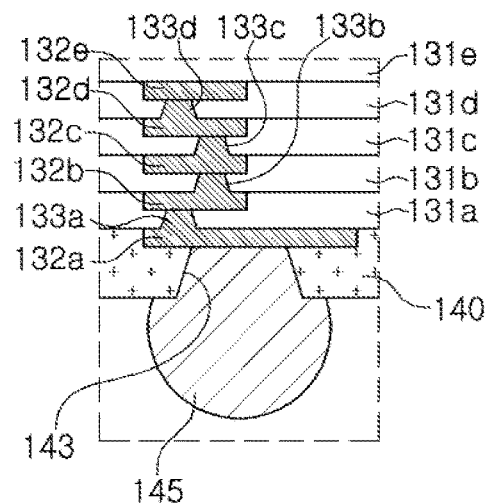
FIGS. 42A through 42C are enlarged views schematically illustrating another example of a region R or R' of FIG. 27.
Figure 42B:
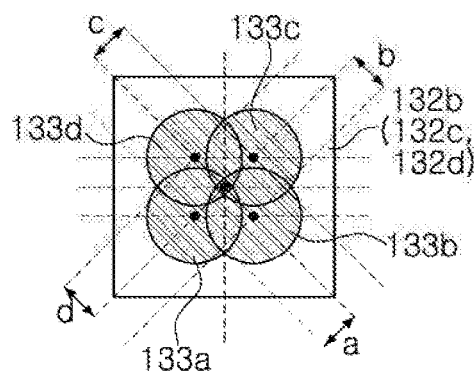
Figure 42C:
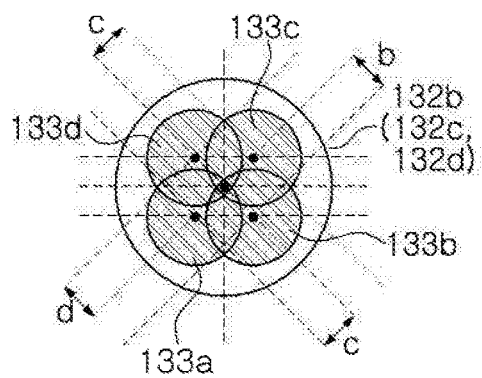

FIGS. 42A through 42C are enlarged views schematically illustrating another example of a region R or R' of FIG. 27.

Figure 43A:
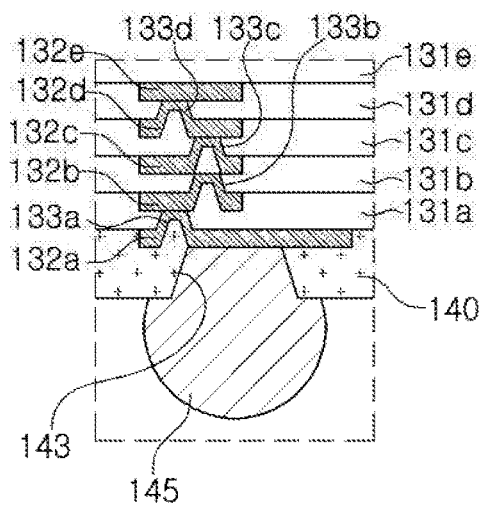
FIGS. 43A through 43C are enlarged views schematically illustrating another example of a region R or R' of FIG. 27.
Figure 43B:
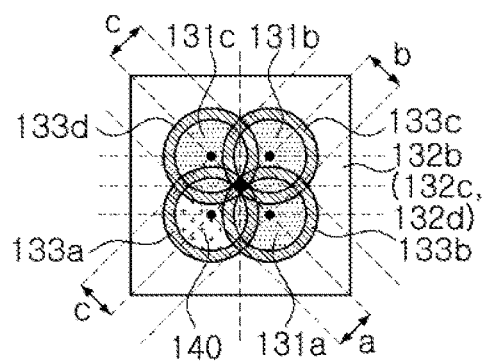
Figure 43C:
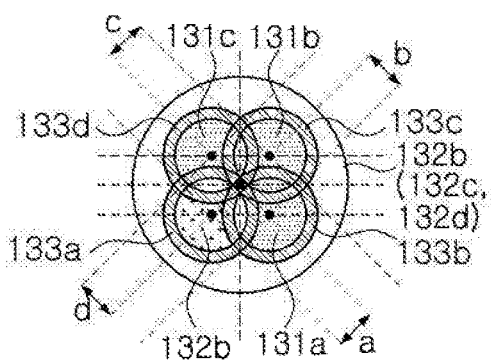

FIGS. 43A through 43C are enlarged views schematically illustrating another example of a region R or R' of FIG. 27.

Referring to FIGS. 40A through 43C, the interconnection member 130 may include first to fifth insulating layers 131a, 131b, 131c, 131d, and 131e, which are more layers. Therefore, vias and pads may also include first to fourth vias 133a, 133b, 133c, and 133d, and first to fifth pads 132a, 132b, 132c, 132d, and 132e. In addition, all of the first to fourth vias 133a, 133b, 133c, and 133d may be disposed to be off the center lines of the second to fourth pads 132b, 132c, and 132d by a predetermined distance in different directions. As a result, the first to fourth vias 133a, 133b, 133c, and 133d may be disposed in the staggered form, more specifically, a spiral form.

Intervals a, b, c, and d of the first to fourth vias 133a, 133b, 133c, and 133d may be the same as or different from each other. However, the first to fourth vias 133a, 133b, 133c, and 133d need to be off the center lines of the second to fourth pads 132b, 132c, and 132d in at least different directions, but may be disposed in the spiral form. Here, the first to fourth vias 133a, 133b, 133c, and 133d may be sufficiently off the center lines of the second to fourth pads 132b, 132c, and 132d so as not to be overlapped with each other, as illustrated in FIGS. 40A through 40C or FIGS. 41A through 41C. However, the first to fourth vias 133a, 133b, 133c, and 133d may also be off the center lines of the second to fourth pads 132b, 132c, and 132d to be partially overlapped with each other, as illustrated in FIGS. 42A through 42C or FIGS. 43A through 43C, depending on sizes of the second to fourth pads 132b, 132c, and 132d or sizes of the first to fourth vias 133a, 133b, 133c, and 133d. In addition, a via may be completely filled with a conductive material, as illustrated in FIGS. 40A through 40C or FIGS. 42A through 42C. Alternatively, in some cases, a conductive material may also be formed along a wall of a via hole, as illustrated in FIGS. 41A through 41C or FIGS. 43A through 43C. Also in these various forms, a stress alleviating effect may be realized as long as the first to fourth vias 133a, 133b, 133c, and 133d may be disposed in the spiral form.

Shapes of the second to fourth pads 132b, 132c, and 132d when viewed from above are not particularly limited, but may be a rectangular shape as illustrated in FIGS. 40B, 33B, 34B, and 35B or a circular shapes as illustrated in FIGS. 40C, 41C, 42C, and 43C. Alternatively, shapes of the second to fourth pads 132b, 132c, and 132d when viewed from above may also be an oval shape, unlike illustrated in the drawings. Sizes of the second to fourth pads 132b, 132c, and 132d are also not particularly limited. In a case in which the second to fourth pads 132b, 132c, and 132d are relatively larger than second to fourth pads 132b, 132c, and 132d disposed in other regions of the interconnection member 130, intervals of the first to fourth vias 133a, 133b, 133c, 133d from the center lines of the second to fourth pads 132b, 132c, and 132d may be sufficiently secured. Therefore, it may be advantageous in terms of a stress dispersing effect that the second to fourth pads 132b, 132c, and 132d are relatively larger than the second to fourth pads 132b, 132c, and 132d disposed in other regions of the interconnection member 130.

Figure 44:
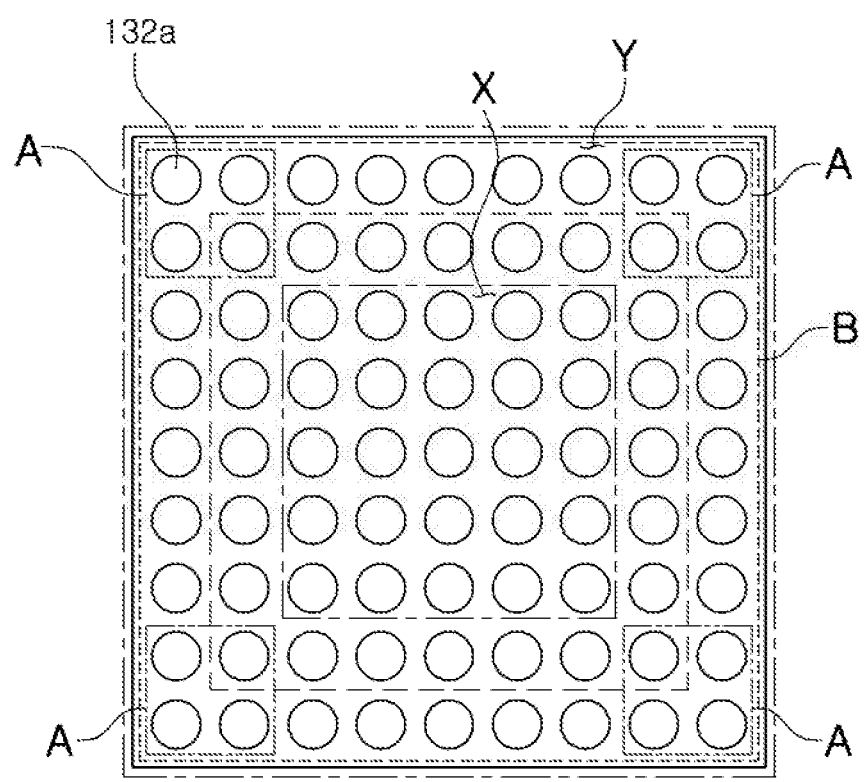
FIG. 44 is a plan view illustrating an example of an array of first pads.

FIG. 44 is a plan view illustrating an example of an array of first pads of a semiconductor package according to another example.

Referring to FIG. 44, the interconnection member 130 may include a first region X corresponding to a region in which the electronic component 120 is disposed and a second region Y enclosing the first region X, when viewed from below. Here, a corner portion A of the second region Y may be a region corresponding to regions R and R' described above, and may be a region in which stress is concentrated on the first connection terminal 145 in a case in which the semiconductor package 100B is mounted on the main board, as described above. Therefore, in a case in which the first and second vias 133a and 133b are disposed to be off the center lines of the second pads 132b disposed between the first and second vias 133a and 133b and connected to the first and second vias 133a and 133b in different directions by a predetermined distance, as described above, in order to alleviate the stress in at least the corner portion A of the second region Y, the board level reliability of the semiconductor package 100B may be improved. However, the stress is not limited to being concentrated in the corner portion A of the second region Y, but may also be significantly concentrated in the outermost portion B of the second region Y. Therefore, in at least the outermost portion B of the second region Y, as described above, the first and second vias 133a and 133b are disposed to be off the center lines of the second pads 132b disposed between the first and second vias 133a and 133b and connected to the first and second vias 133a and 133b in different directions by the predetermined distance. In this case, the board level reliability may be further improved.

Figure 45:
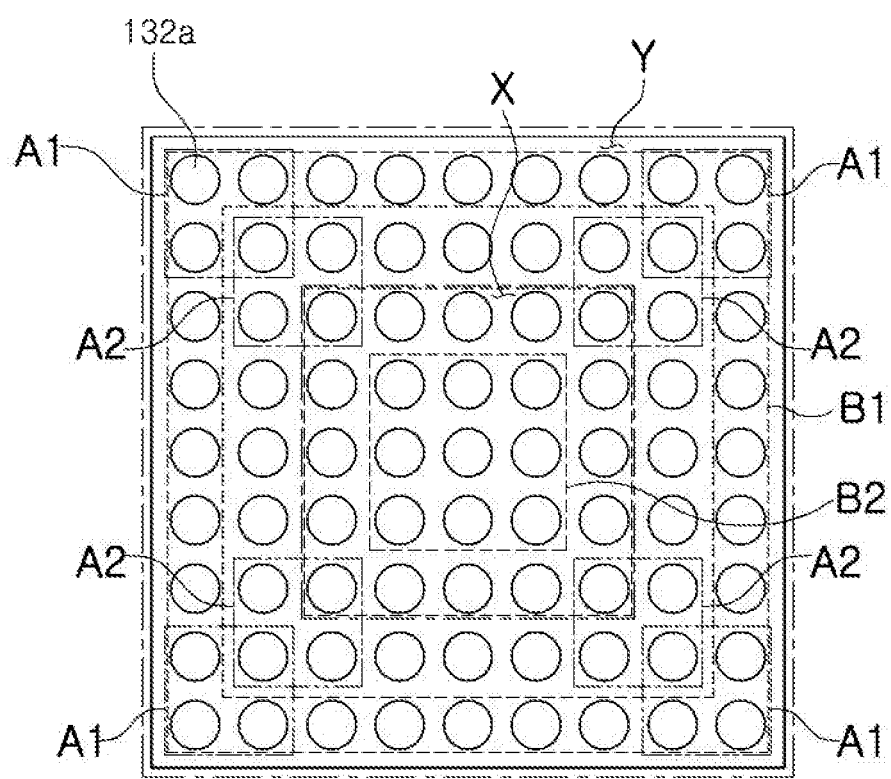
FIG. 45 is a plan view illustrating another example of an array of first pads.

FIG. 45 is a plan view illustrating another example of an array of first pads of a semiconductor package according to another example.

Referring to FIG. 45, in the case in which the semiconductor package 100B is mounted on the main board, the stress may also be concentrated on the first connection terminal 145 in a corner portion of the first region X in which three heterogeneous materials such as the encapsulant 110, the electronic component 120, and the first connection terminal 145, meet each other and a portion A2 of the second region Y enclosing the corner portion of the first region X, as well as the corner portion A1 of the second region Y. Therefore, in a case in which the first and second vias 133a and 133b are disposed to be off the center lines of the second pads 132b disposed between the first and second vias 133a and 133b and connected to the first and second vias 133a and 133b in different directions by a predetermined distance, as described above, in order to alleviate the stress in at least the corner portion of the first region X and the portion A2 of the second region Y enclosing the corner portion of the first region X as well as the corner portion A1 of the second region Y, the board level reliability of the semiconductor package 100B may be further improved. However, the stress is not limited to being concentrated in the corner portion A1 of the second region Y, but may also be significantly concentrated in the outermost portion B1 of the second region Y and/or the outermost portion B2 of the first region X. Therefore, in at least the outermost portion B1 of the second region Y and/or the outermost portion B2 of the first region X, as described above, the first and second vias 133a and 133b are disposed to be off the center lines of the second pads 132b disposed between the first and second vias 133a and 133b and connected to the first and second vias 133a and 133b in different directions by the predetermined distance. In this case, the board level reliability may be further improved.

FIGS. 46A through 46D are views schematically illustrating various dispositions of a via and a pad of a semiconductor package according to another example.

Figure 46A:
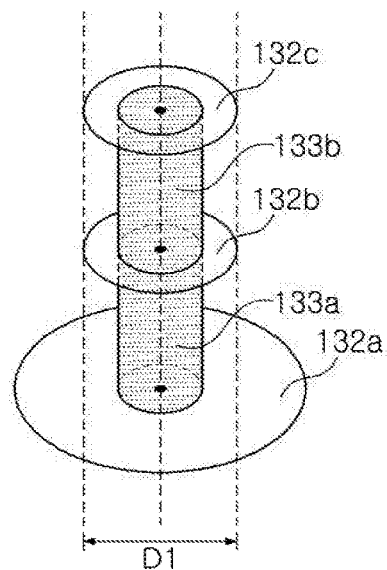
FIGS. 46A through 46D are views schematically illustrating various dispositions of a via and a pad.

FIG. 46A illustrates a case in which the first and second vias 133a and 133b are disposed so as not to be off the center line of the second pad 132b. That is, FIG. 46A illustrates a case in which the center lines of the first and second vias 133a and 133b and the center line of the second pad 132b coincide with each other. This form may be a disposition of the first and second vias 133a and 133b and the first to third pads 132a, 132b, and 132c in the region in which the stress is not relatively concentrated on the first connection terminal 145 when the semiconductor package 100B is mounted on the main board, in the interconnection member 130. In this case, since the second pad 132b, and the like, may be formed to have a small size (diameter of D1) so as to secure a design area of the second wiring 134b, and the like, disposed on the same layer as large as possible, a degree of design freedom may be improved.

Figure 46B:
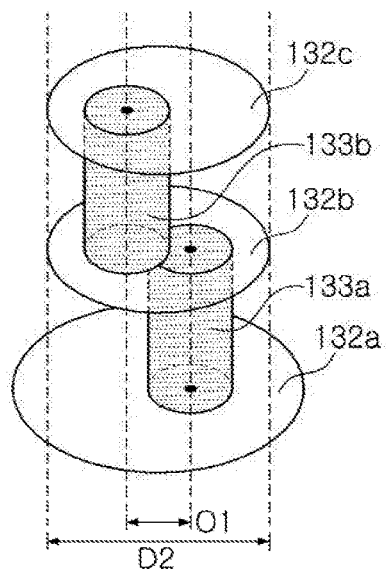

FIG. 46B illustrates a case in which the first and second vias 133a and 133b are disposed to be off the center line of the second pad 132b in different directions. That is, FIG. 46B illustrates a case in which the center lines of the first and second vias 133a and 133b and the center line of the second pad 132b do not coincide with each other. In this case, the center lines of the first and second vias 133a and 133b may have a first offset O1 intended by the designer therebetween. This form may be a disposition of the first and second vias 133a and 133b and the first to third pads 132a, 132b, and 132c in regions A1 and/or A2 in which the stress is relatively concentrated on the first connection terminal 145 as described above when the semiconductor package 100B is mounted on the main board, in the interconnection member 130. In this case, as illustrated in FIG. 412B, the second pad 132b, and the like, may be formed to have a size (diameter of D2) larger than that of second pads 132b, and the like, of other regions, if necessary, in order to accomplish an excellent stress alleviating effect by further enlarging the first offset O1, but are not necessarily limited thereto.

Figure 46C:
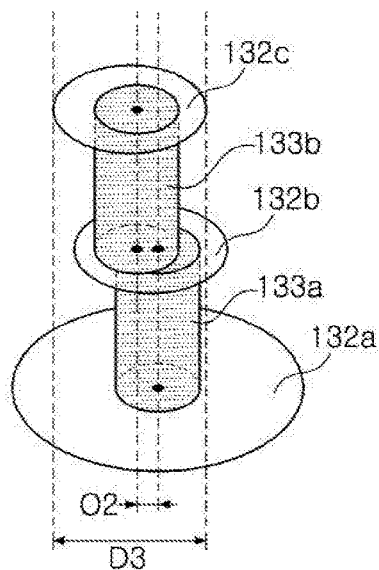

FIG. 46C illustrates a case in which the first and second vias 133a and 133b are designed so as not to be off the center line of the second pad 132b, but are disposed to be offset indifferent directions due to a limitation in a process. That is, FIG. 46C illustrates a case in which the first and second vias 133a and 133b are unintentionally off the center line of the second pad 132b in the different directions due to the limitation in the process, although the disposition of the FIG. 46A is intended. In this case, the center lines of the first and second vias 133a and 133b may have a second offset O2 unintended by the designer therebetween. However, the second pad 132b, and the like, may be formed at a small size (diameter of D3) so as to secure a design area of the second wiring 134b, and the like, disposed on the same layer as large as possible, and since the second offset O2 is unintended, the second offset may be averagely smaller than the first offset O1 intended by the designer. That is, in the interconnection member 130, in some cases, any second offset O2 may be larger than the first offset O1 when second offsets O2 and first offsets O1 are individually compared with each other. However, an average of the second offsets O2 may be smaller than that of the first offsets O1. Therefore, a sufficient board level reliability improving effect as compared to the first offset O1 intended by the designer may not be realized.

Figure 46D:
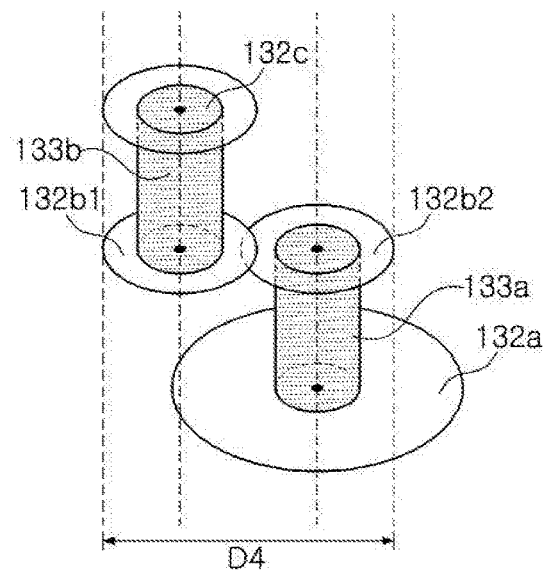

FIG. 46D illustrates a case in which the first and second vias 133a and 133b are connected to different second pads 132b1 and 132b2 in order to intentionally implement a staggered form. In this case, although the first and second vias 133a and 133b may have the staggered form, the number of second pads 132b1 and 132b2 that are to be formed may be increased. Therefore, a process may become complicated, and an area (diameter of D4) occupied by the second pads 132b1 and 132b2 may become excessively large, such that a design area of the second wiring 134b may be reduced. This may not satisfy a demand for thinness and miniaturization that is most important recently.

FIGS. 47A through 47D are views schematically illustrating other various dispositions of a via and a pad of a semiconductor package according to another example.

FIGS. 47A through 47D illustrate a case in which the number of insulating layers in the interconnection member 130 is increased, such that the numbers of vias and pads disposed on the insulating layers are also increased.

Figure 47A:
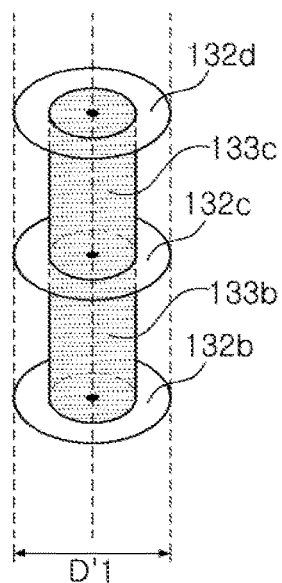
FIGS. 47A through 47D are views schematically illustrating other various dispositions of a via and a pad.

FIG. 47A illustrates a case in which the second and third vias 133b and 133c are disposed so as not to be off the center line of the third pad 132c. This form may be a disposition of the second and third vias 133b and 133c and the second to fourth pads 132b, 132c, and 132d in the region in which the stress is not relatively concentrated on the first connection terminal 145 when the semiconductor package 100B is mounted on the main board, in the interconnection member 130. In this case, since the second to fourth pads 132b, 132c, and 132d, and the like, may be formed at a small size (diameter of D'1) so as to secure a design area of the second to fourth wirings 134b, 134c, and 134d, and the like, disposed on the same layer as large as possible, a degree of design freedom may be improved.

Figure 47B:
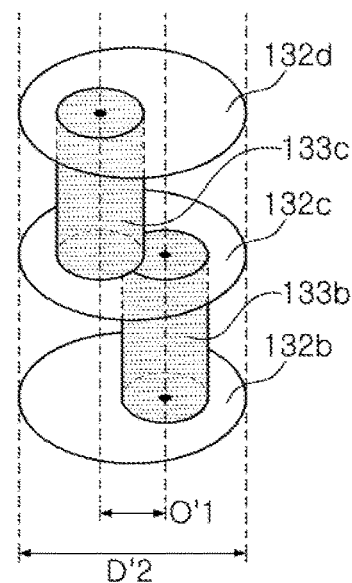

FIG. 47B illustrates a case in which the second and third vias 133b and 133c are disposed to be off the center line of the third pad 132c in different directions. In this case, the center lines of the second and third vias 133b and 133c may have a first offset O'1 intended by the designer therebetween. This form may be a disposition of the second and third vias 133b and 133c and the second to fourth pads 132b, 132c, and 132d in regions A1 and/or A2 in which the stress is relatively concentrated on the first connection terminal 145 as described above when the semiconductor package 100B is mounted on the main board, in the interconnection member 130. In this case, the second to fourth pads 132b, 132c, and 132d, and the like, may be formed to have a size (diameter of D'2) larger than that of second to fourth pads 132b, 132c, and 132d, and the like, of other regions, if necessary, in order to accomplish an excellent stress alleviating effect by further enlarging the first offset O'1, but are not necessarily limited thereto.

Figure 47C:
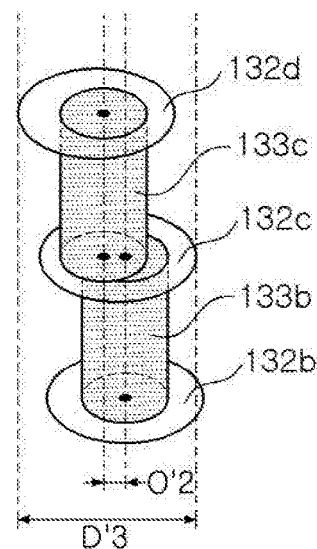

FIG. 47C illustrates a case in which the second and third vias 133b and 133c are designed so as not to be off the center line of the third pad 132c, but are disposed to be offset indifferent directions due to a limitation in a process. That is, FIG. 47C illustrates a case in which the second and third vias 133b and 133c are unintentionally off the center line of the third pad 132c in the different directions due to the limitation in the process, although the disposition of the FIG. 47A is intended. In this case, the center lines of the second and third vias 133b and 133c may have a second offset O'2 unintended by the designer therebetween. However, the second to fourth pads 132b, 132c, and 132d, and the like, may be formed at a small size (diameter of D'3) so as to secure a design area of the second to fourth wirings 134*b*, 134*c*, and 134*d*, and the like, disposed on the same layer as large as possible, and since the second offset O'2 is unintended, the second offset may be averagely smaller than the first offset O'1 intended by the designer. That is, in the interconnection member 130, in some cases, any second offset O'2 may be larger than the first offset O'1 when second offsets O'2 and second offsets O'1 are individually compared with each other. However, an average of the second offsets O'2 may be smaller than that of the first offsets O'1. Therefore, a sufficient board level reliability improving effect as compared to the first offset O'1 intended by the designer may not be realized.

Figure 47D:
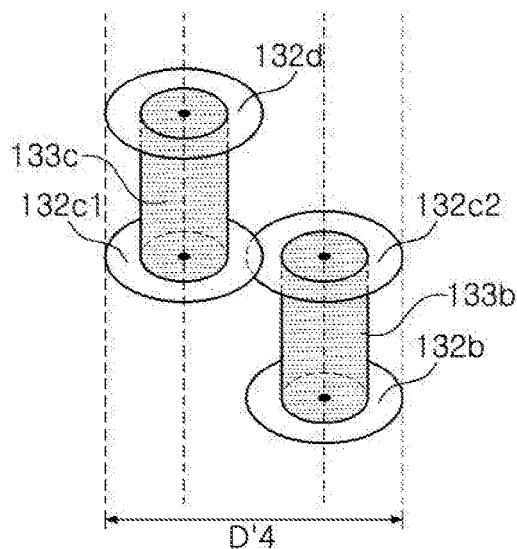

FIG. 47D illustrates a case in which the second and third vias 133*b* and 133*c* are disposed on different third pads 132*c*1 and 132*c*2 in order to intentionally implement a staggered form. In this case, although the second and third vias 133*b* and 133*c* may have the staggered form, the number of third pads 132*c*1 and 132*c*2 that are to be formed may be increased. Therefore, a process may become complicated, and an area (diameter of D'4) occupied by the third pads 132*c*1 and 132*c*2 may become excessively large, such that a design area of the third wiring 134*c* may be reduced. This may not satisfy a demand for thinness and miniaturization that is most important recently.

Figure 48:
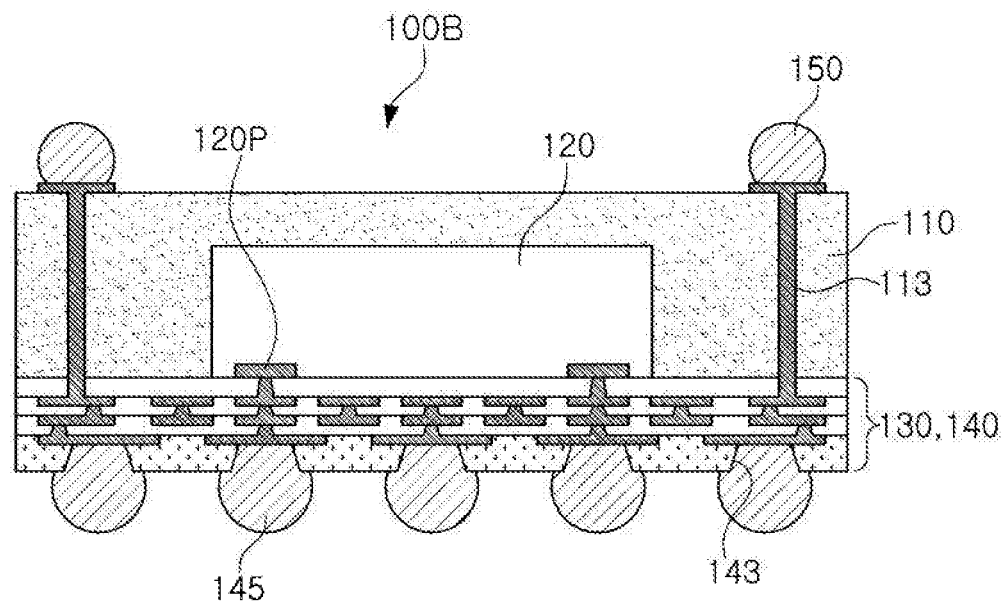
FIG. 48 is a cross-sectional view schematically illustrating a modified example of a semiconductor package.

FIG. 48 is a cross-sectional view schematically illustrating a modified example of a semiconductor package according to another example.

Referring to FIG. 48, a semiconductor package 100B according to another example may be a package-on-package (PoP) type. That is, the semiconductor package 100B according to another example may further include through-wirings 113 penetrating through the encapsulant 110. In addition, the semiconductor package 100B according to another example may further include second connection terminals 150 connected to the through-wirings 113. The respective components are the same as the components described above.

Figure 49:
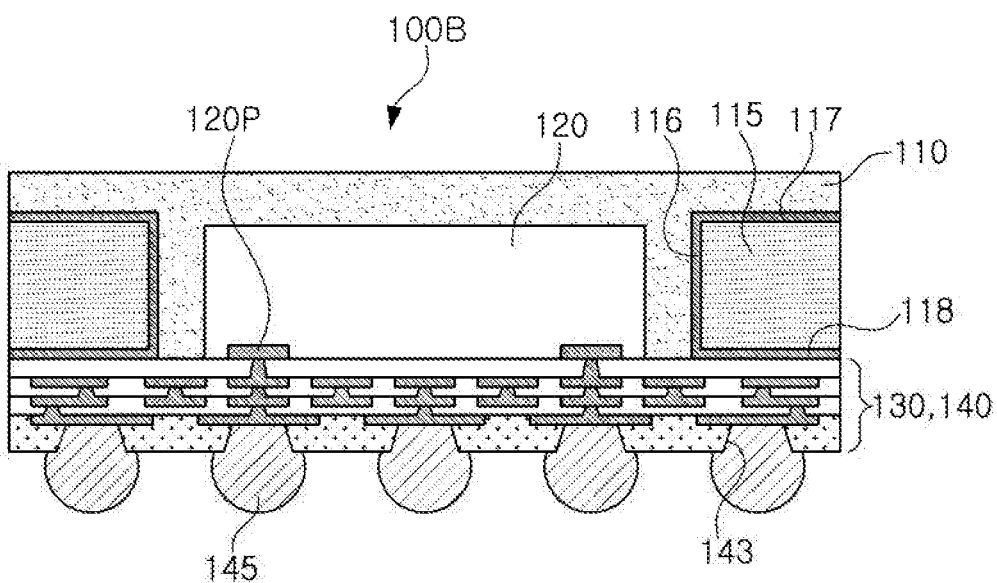
FIG. 49 is a cross-sectional view schematically illustrating another modified example of a semiconductor package.

FIG. 49 is a cross-sectional view schematically illustrating another modified example of a semiconductor package according to another example.

Referring to FIG. 49, a semiconductor package 100B according to another example may be a panel-level-package (PLP) type. That is, the semiconductor package 100B according to another example may further include a second interconnection member 115 disposed on the interconnection member 130 and having a through-hole. Here, the electronic component 120 may be disposed in the through-hole of the second interconnection member 115. Metal layers 116, 117, and 118 may be disposed on an inner surface of the through-hole of the second interconnection member 115, an upper surface of the second interconnection member 115, and/or a lower surface of the second interconnection member 115, if necessary. The respective components are the same as the components described above.

Figure 50:
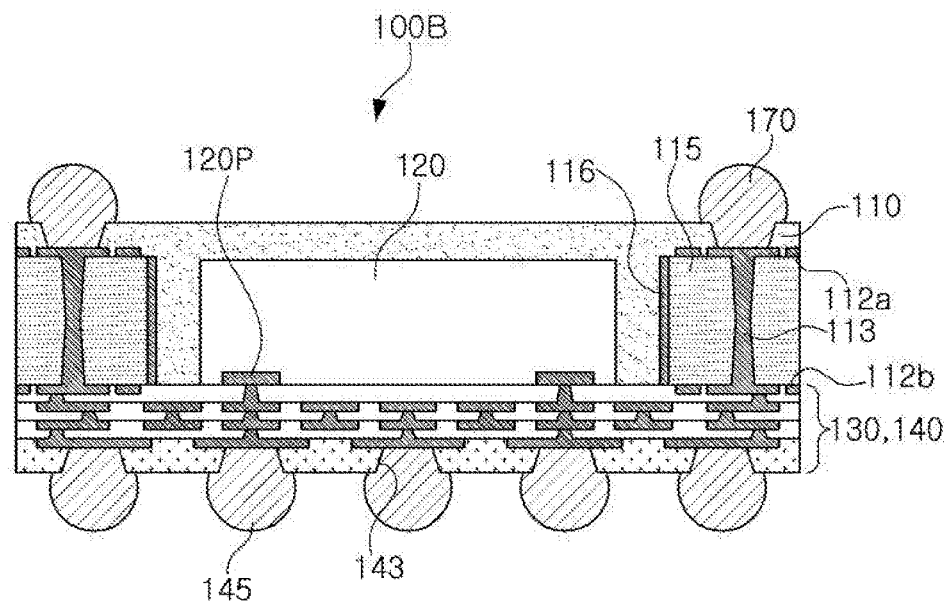
FIG. 50 is a cross-sectional view schematically illustrating another modified example of a semiconductor package.

FIG. 50 is a cross-sectional view schematically illustrating another modified example of a semiconductor package according to another example.

Referring to FIG. 50, a semiconductor package 100B according to another example may be a package-on-package (PoP) type while being a panel-level-package (PLP) type. That is, the semiconductor package 100B according to another example may further include through-wirings 113 penetrating through the second interconnection member 115. Here, various redistribution layers 112*a* and 112*b* may be disposed on an upper surface and a lower surface of the second interconnection member 115, and a metal layer 116 may be disposed on an inner surface of the through-hole, if necessary. In addition, the semiconductor package 100B according to another example may further include third connection terminals 170 connected to the through-wirings 113. The respective components are the same as the components described above.

Figure 51:
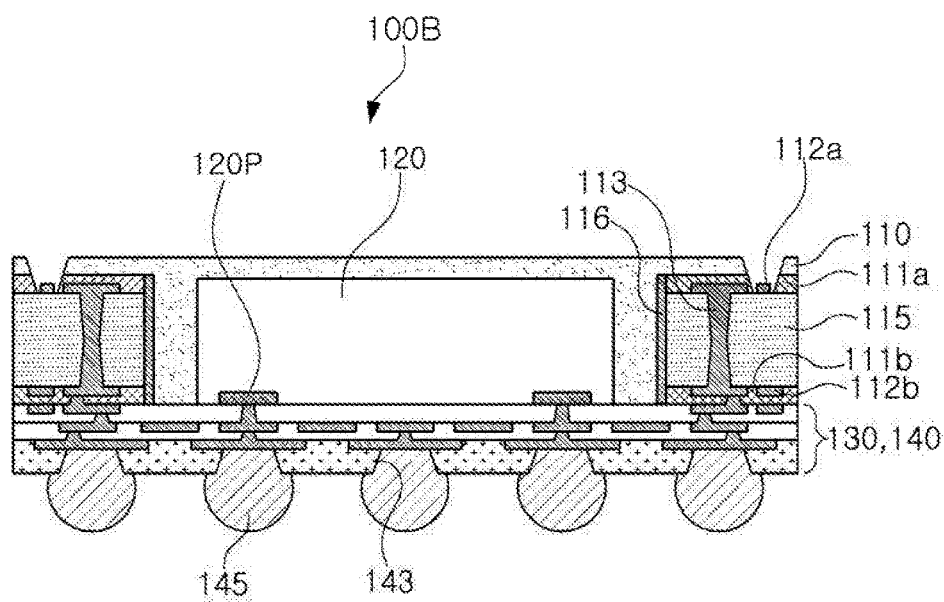
FIG. 51 is a cross-sectional view schematically illustrating another modified example of a semiconductor package.

FIG. 51 is a cross-sectional view schematically illustrating another modified example of a semiconductor package according to another example.

Referring to FIG. 51, a semiconductor package 100B according to another example may be another package-on-package (PoP) type while being a panel-level-package (PLP) type. That is, inner insulating layers 111*a* and 111*b* having through-holes integrated with a through-hole of a second interconnection member 115 may be further disposed on an upper surface and/or a lower surface of the second interconnection member 115. A first inner insulating layer 111*a* may have third openings (not denoted by a reference numeral) formed therein so as to penetrate up to the encapsulant 110, and portions of the redistribution layers 112*a* may be exposed to the outside through the third openings. The exposed redistribution layers 112*a* may serve as pads for wire bonding of another electronic component and another electronic component package disposed on the semiconductor package 100E. The other components are the same as the components as described above.

Figure 52:
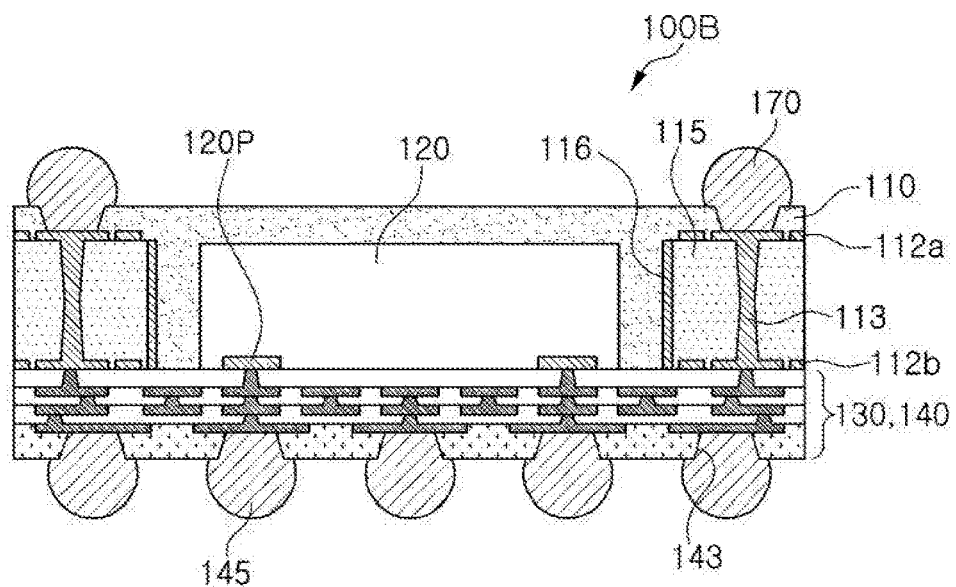
FIG. 52 is a cross-sectional view schematically illustrating another modified example of a semiconductor package.

FIG. 52 is a cross-sectional view schematically illustrating a modified example of a semiconductor package according to an example.

Referring to FIG. 52, a redistribution layer 112*b* formed on a lower surface of an interconnection member 115 may be embedded in the interconnection member 115 so that one surface thereof is exposed. In this case, a thickness of the redistribution layer 112*b* formed on the lower surface of the interconnection member 115 may be ignorable. Therefore, a fine pitch may be implemented. The other components are the same as the components as described above.

Figure 53:
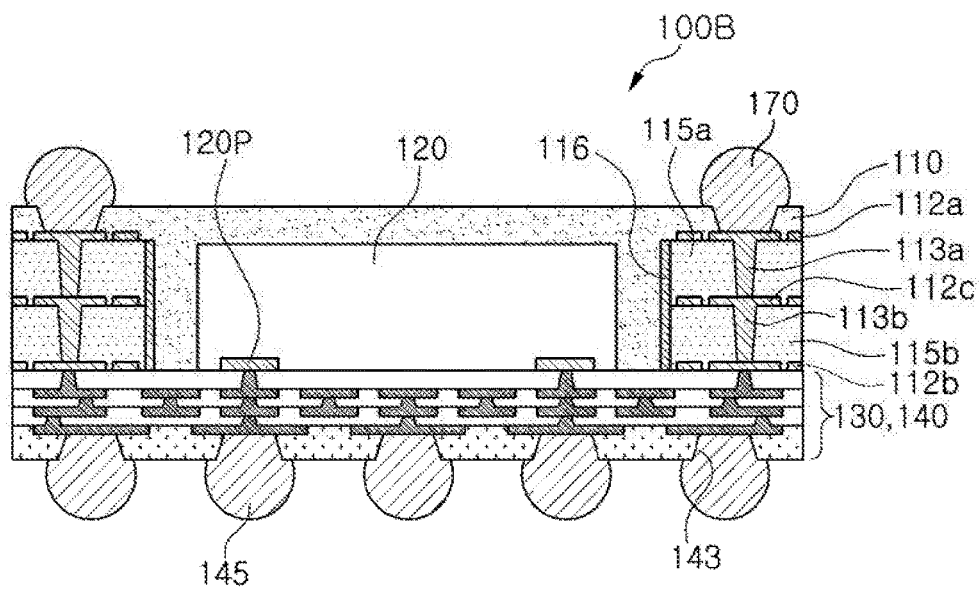
FIG. 53 is a cross-sectional view schematically illustrating another modified example of a semiconductor package.

FIG. 53 is a cross-sectional view schematically illustrating a modified example of a semiconductor package according to an example.

Referring to FIG. 53, interconnection members 115*a* and 115*b* may be formed of multiple layers. In this case, a redistribution layer 112*c* may also be disposed in the interconnection members 115*a* and 115*b*. The redistribution layer 112*c* disposed in the interconnection members 115*a* and 115*b* may be electrically connected to redistribution layers 112*a* and 112*b* disposed at both sides of the interconnection members 115*a* and 115*b* through vias 113*a* and 113*b*. In this case, the number of layers of the interconnection member 130 may be reduced. In addition, a degree of freedom of a design of the interconnection member 130 may be increased. Further, a process defect occurring at the time of manufacturing the interconnection member 130 may be reduced, and thus a yield may be improved. The other components are the same as the components as described above.

Figure 54:
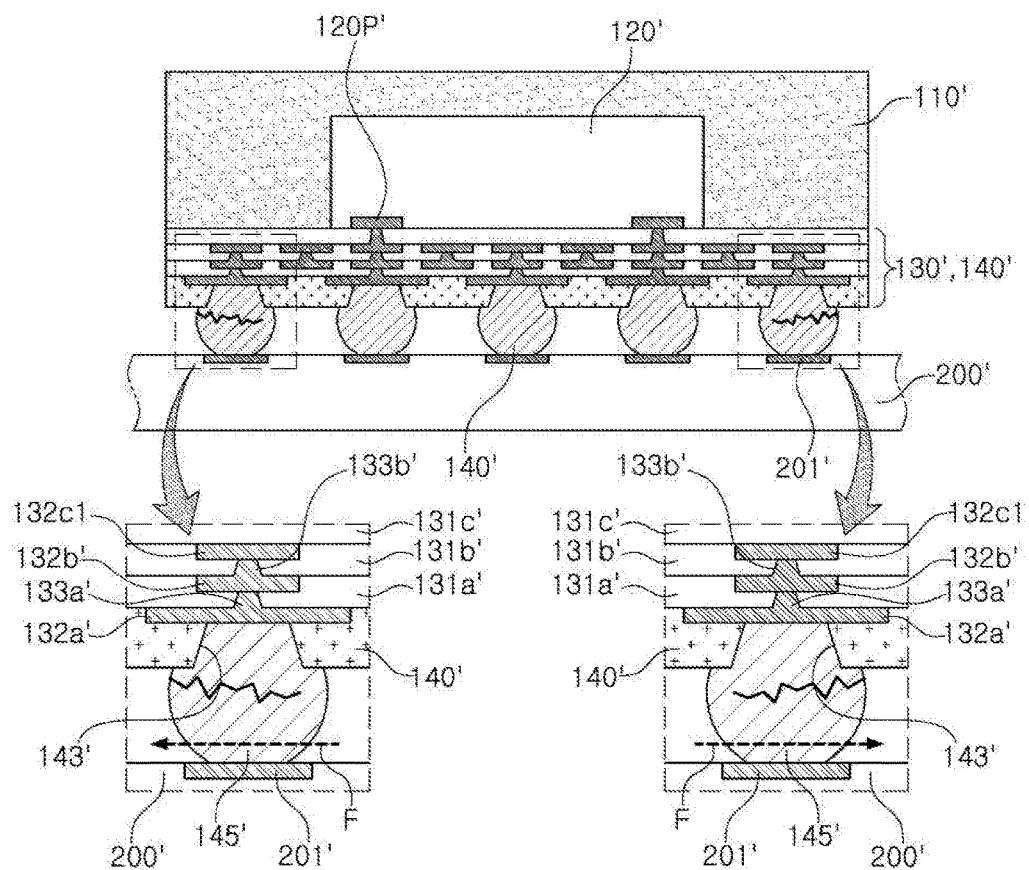
FIG. 54 is a cross-sectional view schematically illustrating a crack generated in a connection terminal of a semiconductor package mounted on a board.

FIG. 54 is a cross-sectional view schematically illustrating a crack generated in a connection terminal of a semiconductor package mounted on a board.

Referring to FIG. 54, a board 200' may have mounting pads 201' on which a semiconductor package is mounted. Here, the semiconductor package may include an encapsulant 110', an electronic component 120', an interconnection member 130', a passivation layer 140', connection terminals 145', and the like, similar to the semiconductor package described above. The electronic component package may be mounted on the board 200' in a form in which the connection terminals 145' are connected to the mounting pads 201' of the board 200'. Here, in the interconnection member 130' of the semiconductor package, vias 133*a*' and 133*b*' are disposed so as not to be off the center lines of via pads 132*a*' even in a corner region in which stress F is concentrated. Therefore, it may be appreciated that the generated stress F is applied to the connection terminals 145' of the corresponding region as it is, such that a crack may be easily generated.

Figure 55:
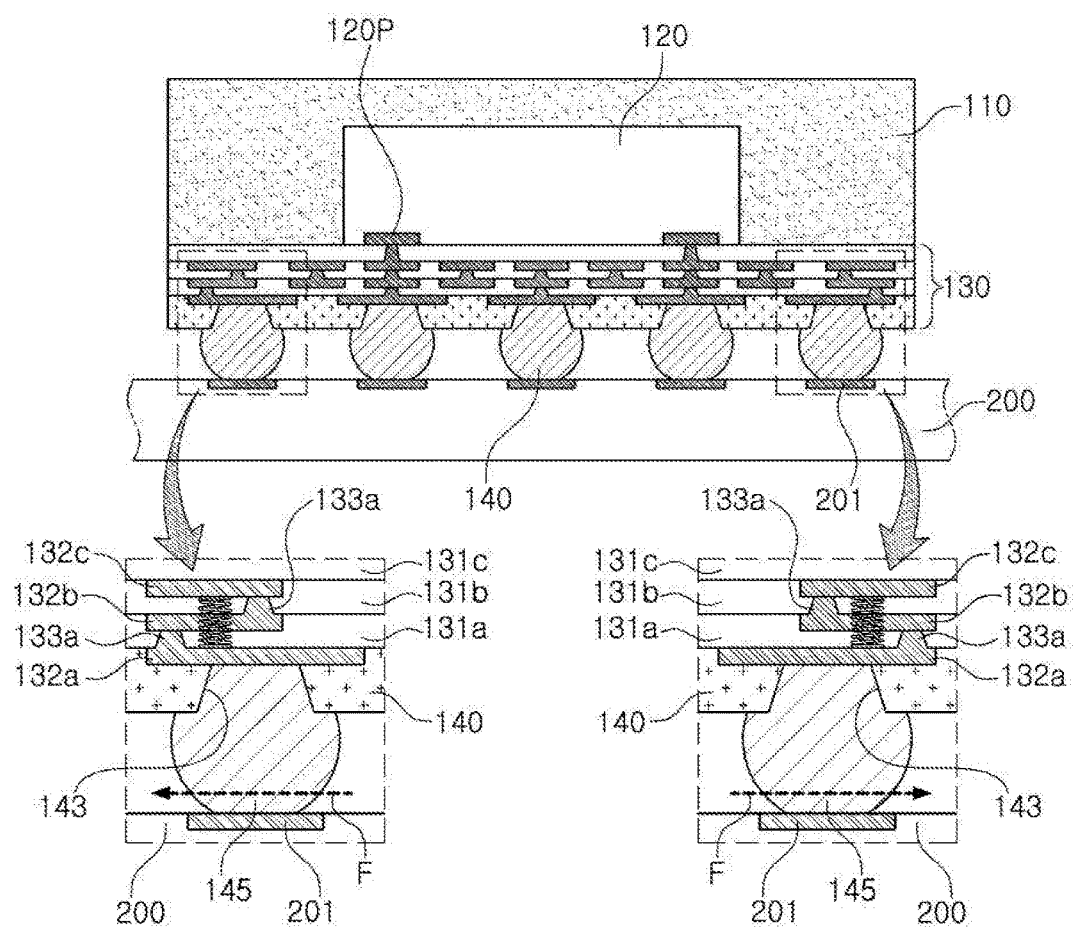
FIG. 55 is a cross-sectional view schematically illustrating no crack generated in a connection terminal of a semiconductor package mounted on a board.

FIG. 55 is a cross-sectional view schematically illustrating no crack generated in a connection terminal of electronic component package mounted on a board.

Referring to FIG. 55, a board 200 may have mounting pads 201 on which a semiconductor package is mounted. The electronic component package may be the semiconductor package described above. On one hand, in the interconnection member 130 of the semiconductor package, the vias 133*a* may be disposed to be off the center lines of the pads 132*a* and 132*b* in any direction by a predetermined distance in a corner region in which stress F is concentrated. On the other hand, in the interconnection member 130 of the semiconductor package 100, the vias 133*a* and 133*b* may be disposed to be off the center lines of the pad 132*b* disposed therebetween in different directions in a corner region in which stress F is concentrated. It may be appreciated that since the disposition described above may alleviate the stress F applied to the connection terminals 145 through the spring action, a crack is not easily generated in the connection terminals 145 of the corresponding region.

As set forth above, according to an exemplary embodiment in the present disclosure, a semiconductor package of which board level reliability is improved, and an electronic device including the same may be provided.

In the present disclosure, a term "bottom" has been used to indicate a direction toward a mounted surface of the semiconductor package in relation to cross sections of the drawings, and a term "top" has been used to indicate an opposite direction to the direction indicated by the term "bottom". In addition, a phrase "positioned on the bottom or the top" has been used as a concept including a case in which a target component is positioned in a corresponding direction, but does not directly contact a reference component, as well as a case in which the target component directly contacts the reference component in the corresponding direction. However, these directions have been defined for convenience of explanation, and the scope of the present disclosure is not particularly limited by the directions defined as described above.

In the present disclosure, a term "center line" of an element refers to a line that passes a center of the element and that is parallel to a thickness direction of a semiconductor package. The thickness direction of the semiconductor package is a direction along which various insulating layers, pads, and vias of an interconnection member thereof are stacked.

In the present disclosure, a word "connected" is a concept including a case in which any component is indirectly connected to another component by an adhesive, or the like, as well as a case in which any component is directly connected to another component. In addition, a word "electrically connected" is a concept including both of a case in which any component is physically connected to another component and a case in which any component is not physically connected to another component. In addition, terms "first", "second", and the like, are used to distinguish one component from another component, and do not limit a sequence, importance, and the like, of the corresponding components. In some cases, a first component may be named a second component and a second component may also be similarly named a first component, without departing from the scope of the present disclosure.

In the present disclosure, a term "example" does not mean the same exemplary embodiment, but is provided in order to emphasize and describe different unique features. However, the above suggested examples may be implemented to be combined with a feature of another example. For example, even though particulars described in a specific example are not described in another example, it may be understood as a description related to another example unless described otherwise.

In the present disclosure, terms used in the present disclosure are used only in order to describe an example rather than limiting the scope of the present disclosure. Here, singular forms include plural forms unless interpreted otherwise in a context.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
 a first interconnection member including a first insulating layer, first and second pads respectively disposed on opposite sides of the first insulating layer along a stacking direction, and a first via physically connecting the first and second pads to each other;
 a second interconnection member disposed on the first interconnection member and having a through-hole, a lower surface of the second interconnection member facing the first interconnection member;
 a first redistribution layer disposed on an upper surface of the second interconnection member opposing the lower surface of the second interconnection member;
 a semiconductor chip disposed on the first interconnection member and in the through-hole;
 an encapsulant encapsulating at least portions of the semiconductor chip;
 a passivation layer having an opening exposing at least a portion of the first pad; and
 a connection terminal disposed on the passivation layer and connected to the first pad,
 wherein a center line of the first via is out of alignment with at least one of a center line of the first pad and a center line of the second pad,
 the second pad is disposed between the first pad and the encapsulant,
 the second pad is completely within an area which completely overlaps with the first pad along the stacking direction,
 the first interconnection member further includes a wiring extending along the first insulating layer and in direct contact with the second pad,
 a width of the wiring is less than a width of the second pad, and
 a size of the first pad is greater than that of the second pad.

2. The fan-out semiconductor package of claim 1, wherein the passivation layer is disposed on a side of the first insulating layer on which the first pad is disposed, and
 the center line of the first via is different from that of the opening.

3. The fan-out semiconductor package of claim 1, wherein the first interconnection member includes a first region corresponding to a region in which the semiconductor chip is disposed, and a second region enclosing the first region, and the first pad, the second pad, and the first via are disposed in a corner portion of the second region.

4. The fan-out semiconductor package of claim 1, wherein the first interconnection member includes a first region corresponding to a region in which the semiconductor chip is disposed, and a second region enclosing the first region, and
the first pad, the second pad, and the first via are disposed in a corner portion of the first region and a portion of the second region enclosing the corner portion of the first region.

5. The fan-out semiconductor package of claim 1, wherein the first interconnection member includes a first region corresponding to a region in which the semiconductor chip is disposed, and a second region enclosing the first region, and
the first pad, the second pad, and the first via are disposed in an outermost portion of the second region.

6. The fan-out semiconductor package of claim 1, wherein the first interconnection member includes a first region corresponding to a region in which the semiconductor chip is disposed, and a second region enclosing the first region, and
the first pad, the second pad, and the first via are disposed in an outermost portion of the first region.

7. The fan-out semiconductor package of claim 1, wherein the center line of the first via is off the center line of the first pad toward an outer edge of the semiconductor chip package.

8. The fan-out semiconductor package of claim 1, further comprising a through-wiring penetrating through the second interconnection member; and
a second redistribution layer disposed on the lower surface of the second interconnection member,
wherein the through-wiring and the first and second redistribution layers are electrically connected to the semiconductor chip.

9. An electronic device comprising:
a board; and
a semiconductor chip package mounted on the board,
wherein the semiconductor chip package is the semiconductor chip package of claim 1.

10. The fan-out semiconductor package of claim 1, wherein first and second pads have a shape selected from a circular shape, an oval shape, and a rectangular shape.

11. The fan-out semiconductor package of claim 1, further comprising:
a second redistribution layer embedded in the second interconnection member, exposed from the lower surface of the second interconnection member, and being in contact with the first interconnection member,
wherein the first and second redistribution layers are electrically connected to connection pads of the semiconductor chip.

12. The fan-out semiconductor package of claim 1, wherein the second interconnection member includes an upper insulating layer and a lower insulating layer,
the fan-out semiconductor package further comprises:
a second redistribution layer embedded in the lower insulating layer, exposed from a lower surface of the lower insulating layer which is the lower surface of the second interconnection member, and being in contact with the first interconnection member; and
a third redistribution layer disposed on an upper surface of the lower insulating layer opposing the lower surface of the lower insulating layer, and covered by the upper insulating layer,
the first redistribution layer is disposed on an upper surface of the upper insulating layer which is the upper surface of the second interconnection member, and
the first to third redistribution layers are electrically connected to connection pads of the semiconductor chip.

13. The fan-out semiconductor package of claim 1, wherein the first interconnection member further includes two or more insulating layers and two or more pads respectively disposed on the two or more insulating layers.

14. The fan-out semiconductor package of claim 2, wherein the connection terminal is disposed in the opening of the passivation layer, and
the center line of the first via is different from that of the connection terminal.

15. The fan-out semiconductor package of claim 14, wherein the passivation layer is a solder resist layer, and the connection terminal is a solder ball.

16. A fan-out semiconductor package, comprising:
a first interconnection member including a first insulating layer, first and second pads respectively disposed on opposite sides of the first insulating layer along a stacking direction, a first via physically connecting the first and second pads to each other, a second insulating layer disposed on the first insulating layer, and a second via formed in the second insulating layer;
a second interconnection member disposed on the first interconnection member and having a through-hole, a lower surface of the second interconnection member facing the first interconnection member;
a first redistribution layer disposed on an upper surface of the second interconnection member opposing the lower surface of the second interconnection member;
a semiconductor chip disposed on the first interconnection member and in the through-hole;
an encapsulant encapsulating at least portions of the semiconductor chip;
a passivation layer having an opening exposing at least a portion of the first pad; and
a connection terminal disposed on the passivation layer and connected to the first pad,
wherein a center line of the first via is out of alignment with at least one of a center line of the first pad and a center line of the second pad,
the second pad physically connects the first and second vias to each other and has a shape selected from a circular shape, an oval shape, and a rectangular shape,
the center line of the first via, a center line of the second via, and the center line of the second pad are different from each other,
the first interconnection member further includes a wiring extending along the first insulating layer and in direct contact with the second pad,
a width of the wiring is less than a width of the second pad, and
a size of the first pad is greater than that of the second pad.

17. The fan-out semiconductor package of claim 16, wherein the second pad has an area greater than that of a via pad disposed in other region of the first interconnection member.

18. The fan-out semiconductor package of claim 16, wherein the first interconnection member includes a first region corresponding to a region in which the semiconductor chip is disposed, and a second region enclosing the first region, wherein the first via, the second via, and the second pad are disposed in a corner portion of the second region.

19. The fan-out semiconductor package of claim 16, wherein the first interconnection member includes a first region corresponding to a region in which the semiconductor chip is disposed, and a second region enclosing the first region, and
the first via, the second via, and the second pad are disposed in a corner portion of the first region and a portion of the second region enclosing the corner portion of the first region.

20. The fan-out semiconductor package of claim 16, wherein the first interconnection member includes a first region corresponding to a region in which the semiconductor chip is disposed, and a second region enclosing the first region, and
the first via, the second via, and the second pad are disposed in an outermost portion of the second region.

21. The fan-out semiconductor package of claim 16, wherein the first interconnection member includes a first region corresponding to a region in which the semiconductor chip is disposed, and a second region enclosing the first region, and
the first via, the second via, and the second pad are disposed in an outermost portion of the first region.

22. The fan-out semiconductor package of claim 16, wherein the first and second vias are disposed in a staggered form, a zigzag form, or a spiral form.

23. A fan-out semiconductor package comprising:
a first interconnection member including an insulating layer, first and third pads and second and fourth pads respectively disposed on opposite sides of the insulating layer, a first via penetrating the insulating layer and physically connecting the first and second pads to each other, and a second via penetrating the insulating layer and physically connecting the third and fourth pads to each other;
a second interconnection member disposed on the first interconnection member and having a through-hole, a lower surface of the second interconnection member facing the first interconnection member;
a first redistribution layer disposed on an upper surface of the second interconnection member opposing the lower surface of the second interconnection member;
a semiconductor chip disposed on the first interconnection member and in the through-hole, and electrically connected to the first through fourth pads and the first and second vias of the first interconnection member;
a passivation layer having first and second openings exposing at least portions of the first pad and third pad; and
first and second connection terminal disposed on the passivation layer and connected to the first pad and the third pad, respectively,
wherein a distance from the first and second pads and the first via to a center of the semiconductor chip is greater than a distance from the third and fourth pads and the second via to the center of the semiconductor chip,
an average of an interval between a center line of the first via and a center line of the first pad and an interval of the center line of the first via and a center line of the second pad is greater than an average of an interval of a center line of the second via and a center line of the third pad and an interval of the center line of the second via and a center line of the fourth pad,
the center line of the first via is farther away from the center of the semiconductor chip than the center line of the first pad and the center line of the second pad,
the first interconnection member further includes a wiring extending along the insulating layer and in direct contact with one of the first and second pads,
a width of the wiring is less than a width of the one of the first and second pads that the wiring physically contacts with, and
a size of the first pad is greater than that of the second pad and a size of the third pad is greater than that of the fourth pad.

24. The fan-out semiconductor package of claim 23, the center line of the second via coincides with at least one of the center line of the third pad and the center line of the fourth pad.

25. The fan-out semiconductor package of claim 23, wherein the passivation layer is disposed on a side of the insulating layer on which the first and third pads are disposed, and
an interval between the center line of the first via and a center line of the first opening is greater than an interval of the center line of the second via and a center line of the second opening.

26. The fan-out semiconductor package of claim 23, wherein the first and second connection terminals are disposed in the first and second openings of the passivation layer, respectively, and
the passivation layer is a solder resist layer, and the first and second connection terminals are solder balls.

27. The fan-out semiconductor package of claim 23, wherein the first interconnection member further includes fifth and sixth pads and respectively disposed on the opposite sides of the insulating layer, and a third via penetrating the insulating layer and connecting the fifth and sixth pads to each other,
the third and fourth pads and the second via are disposed in a region between two regions where the first and second pads and the first via, and the fifth and sixth pads and the third via are disposed, respectively and
an average of an interval between a center line of the third via and a center line of the fifth pad and an interval of the center line of the third via and a center line of the sixth pad is greater than the average of the interval of the center line of the second via and the center line of the third pad and the interval of the center line of the second via and the center line of the fourth pad.

28. A fan-out semiconductor package comprising:
a first interconnection member including a plurality of insulating layers and a plurality of first vias each penetrating one of the plurality of insulating layers and electrically connected to each other through a plurality of first pads respectively formed on the plurality of the insulating layers;
a second interconnection member disposed on the first interconnection member and having a through-hole, a lower surface of the second interconnection member facing the first interconnection member;
a first redistribution layer disposed on an upper surface of the second interconnection member opposing the lower surface of the second interconnection member;
a semiconductor chip disposed on the first interconnection member and in the through-hole, and electrically connected to the plurality of first vias;
a passivation layer having an opening exposing at least a portion of a lowermost one of the plurality of the first pads; and a connection terminal disposed on the passivation layer and connected to the lowermost one of the plurality of first pads, wherein center lines of two of the plurality of first vias physically connected one of the plurality of first pads are out of alignment, the plurality of first pads have a shape selected from a circular shape, an oval shape, and a rectangular shape, the first interconnection member further includes a wiring extending along one of the plurality of insulating layers and in direct contact with the one of the plurality of first pads, a width of the wiring is less than a width of the one of the plurality of first pads, and a size of the lowermost one of the plurality of first pads is greater than a size of another among the plurality of first pads which is immediately adjacent to the lowermost one.

29. The fan-out semiconductor package of claim 28, wherein the first interconnection member further includes a plurality of second vias each penetrating one of the plurality of insulating layers and electrically connected to each other through a plurality of second pads respectively formed on the plurality of the insulating layers, an average of all the intervals between center lines of any two of the plurality of first vias that are directly connected to any one of the plurality of first pads is greater than an average of all the intervals between center lines of any two of the plurality of second vias that are directly connected to any one of the plurality of second pads, and the plurality of second pads have a shape selected from a circular shape, an oval shape, and a rectangular shape.

30. The fan-out semiconductor package of claim 29, wherein a distance from the plurality of first vias to a center of the semiconductor chip is greater than a distance from the plurality of second vias to the center of the semiconductor chip.

31. The fan-out semiconductor package of claim 28, wherein the plurality of first pads have a shape selected from a circular shape, an oval shape, and a rectangular shape.

32. The fan-out semiconductor package of claim 30, wherein the first interconnection member further includes a plurality of third vias each penetrating one of the plurality of insulating layers and electrically connected to each other through a plurality of third pads respectively formed on the plurality of the insulating layers, an average of intervals between center lines of any two of the plurality of third vias that are directly connected to any one of the plurality of third pads is greater than the average of all the intervals between the center lines of any two of the plurality of second vias that are directly connected to any one of the plurality of second pads, and the plurality of third pads have a shape selected from a circular shape, an oval shape, and a rectangular shape.

33. The fan-out semiconductor package of claim 32, wherein the plurality of first vias and the plurality of third vias are disposed on opposite sides of the plurality of second vias.

* * * * *